United States Patent
Adachi et al.

(10) Patent No.: US 12,414,443 B2
(45) Date of Patent: Sep. 9, 2025

(54) LIGHT-EMITTING DEVICE, LIGHT-EMITTING MODULE, ELECTRONIC DEVICE, AND MANUFACTURING METHOD OF LIGHT-EMITTING DEVICE

(71) Applicant: SEMICONDUCTOR ENERGY LABORATORY CO., LTD., Atsugi (JP)

(72) Inventors: Hiroki Adachi, Tochigi (JP); Junpei Yanaka, Tochigi (JP); Masataka Sato, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 726 days.

(21) Appl. No.: 17/267,857

(22) PCT Filed: Aug. 8, 2019

(86) PCT No.: PCT/IB2019/056747
§ 371 (c)(1),
(2) Date: Feb. 11, 2021

(87) PCT Pub. No.: WO2020/039293
PCT Pub. Date: Feb. 27, 2020

(65) Prior Publication Data
US 2021/0167329 A1 Jun. 3, 2021

(30) Foreign Application Priority Data
Aug. 24, 2018 (JP) .................................. 2018-156888

(51) Int. Cl.
*H01L 51/52* (2006.01)
*H10K 50/844* (2023.01)
(Continued)

(52) U.S. Cl.
CPC .......... *H10K 59/122* (2023.02); *H10K 50/844* (2023.02); *H10K 59/131* (2023.02);
(Continued)

(58) Field of Classification Search
CPC .. H10K 50/844; H10K 59/122; H10K 59/123; H10K 59/131; H10K 71/00;
(Continued)

(56) References Cited

U.S. PATENT DOCUMENTS

| 7,579,771 | B2 | 8/2009 | Yamazaki et al. |
| 8,021,204 | B2 | 9/2011 | Yamazaki et al. |

(Continued)

FOREIGN PATENT DOCUMENTS

| CN | 101369638 A | 2/2009 |
| CN | 102169964 A | 8/2011 |

(Continued)

OTHER PUBLICATIONS

International Search Report (Application No. PCT/IB2019/056747) Dated Nov. 12, 2019.
(Continued)

*Primary Examiner* — Cuong B Nguyen
(74) *Attorney, Agent, or Firm* — Fish & Richardson P.C.

(57) ABSTRACT

A light-emitting device capable of long-time display in a bent state is provided. A light-emitting device that can be repeatedly bent with a small radius of curvature is provided. The flexible light-emitting device includes a light-emitting element, a first inorganic insulating layer, a second inorganic insulating layer, and a first organic insulating layer. The first organic insulating layer is positioned over the first inorganic insulating layer. The light-emitting element is positioned over the first inorganic insulating layer with the first organic insulating layer therebetween. The second inorganic insulating layer is positioned over the light-emitting element. An
(Continued)

end portion of the first inorganic insulating layer and an end portion of the second inorganic insulating layer are each positioned inward from an end portion of the first organic insulating layer. The end portion of the first organic insulating layer is exposed on a side surface of the light-emitting device. The first inorganic insulating layer and the second inorganic insulating layer are preferably in contact with each other outside an end portion of the light-emitting element.

14 Claims, 25 Drawing Sheets

(51) Int. Cl.
| | | |
|---|---|---|
| *H10K 59/122* | (2023.01) | |
| *H10K 59/131* | (2023.01) | |
| *H10K 71/00* | (2023.01) | |
| *H10K 71/40* | (2023.01) | |
| *H10K 59/80* | (2023.01) | |
| *H10K 102/00* | (2023.01) | |

(52) U.S. Cl.
CPC ............. *H10K 71/00* (2023.02); *H10K 71/40* (2023.02); *H10K 59/8731* (2023.02); *H10K 2102/311* (2023.02)

(58) Field of Classification Search
CPC ....... H10K 2102/311; H10K 50/00–87; H10K 59/80–8794; H10K 59/00–88; H10K 59/12–1315; H10K 59/173; H10K 59/18; H10K 71/831–861; H10K 70/00–441; H10K 30/865; H10K 2101/10; H10K 2101/40; H10K 2101/00–80; H10K 85/00–761; H10K 77/10; H10K 77/111; H10K 2102/301; H10K 2102/341; H10K 2102/30; H10K 2102/361; H10K 71/40; H10K 59/8731; H05B 33/02; H05B 33/04; H05B 33/06; H05B 33/22; H05B 33/10; H01L 21/78–786; H01L 33/00–648; H01L 27/15–156; H01L 2933/00–0091; B32B 2457/206
See application file for complete search history.

(56) References Cited

U.S. PATENT DOCUMENTS

| | | | |
|---|---|---|---|
| 8,519,619 | B2 | 8/2013 | Yamazaki et al. |
| 9,000,443 | B2 | 4/2015 | Hatano |
| 9,287,330 | B2 | 3/2016 | Yamazaki et al. |
| 9,917,282 | B2 | 3/2018 | Chida |
| 9,954,043 | B2 | 4/2018 | Park et al. |
| 9,978,811 | B2 | 5/2018 | Yamazaki et al. |
| 10,135,037 | B2 | 11/2018 | Chida |
| 10,475,868 | B2 | 11/2019 | Park et al. |
| 10,804,503 | B2 | 10/2020 | Chida |
| 11,011,599 | B2 * | 5/2021 | Kim .................... H01L 25/0655 |
| 2004/0256618 | A1 | 12/2004 | Imai et al. |
| 2013/0299789 | A1 | 11/2013 | Yamazaki et al. |
| 2015/0255739 | A1 | 9/2015 | Kim et al. |
| 2016/0351641 | A1 | 12/2016 | Ito et al. |
| 2017/0033323 | A1 | 2/2017 | Chida |
| 2018/0061917 | A1 * | 3/2018 | Kim .................... H10K 59/124 |
| 2018/0151837 | A1 | 5/2018 | Furuie |
| 2019/0096974 | A1 * | 3/2019 | Kim .................... H10K 59/131 |
| 2019/0288046 | A1 * | 9/2019 | Park .................... H10K 59/122 |
| 2020/0388795 | A1 | 12/2020 | Chida |
| 2021/0296611 | A1 * | 9/2021 | Miyamoto ........... H10K 59/131 |

FOREIGN PATENT DOCUMENTS

| | | |
|---|---|---|
| CN | 104900675 A | 9/2015 |
| CN | 108738377 A | 11/2018 |
| EP | 2916358 A | 9/2015 |
| EP | 3188269 A | 7/2017 |
| JP | 2014-197522 A | 10/2014 |
| JP | 2017-228512 A | 12/2017 |
| JP | 2018-088346 A | 6/2018 |
| KR | 2015-0105596 A | 9/2015 |
| KR | 2017-0080779 A | 7/2017 |
| KR | 2018-0035217 A | 4/2018 |
| TW | 201712901 | 4/2017 |
| TW | 201824216 | 7/2018 |
| WO | WO-2017/017553 | 2/2017 |

OTHER PUBLICATIONS

Written Opinion (Application No. PCT/IB2019/056747) Dated Nov. 12, 2019.
Chinese Office Action (Application No. 201980055691.6) Dated Apr. 25, 2025.

* cited by examiner

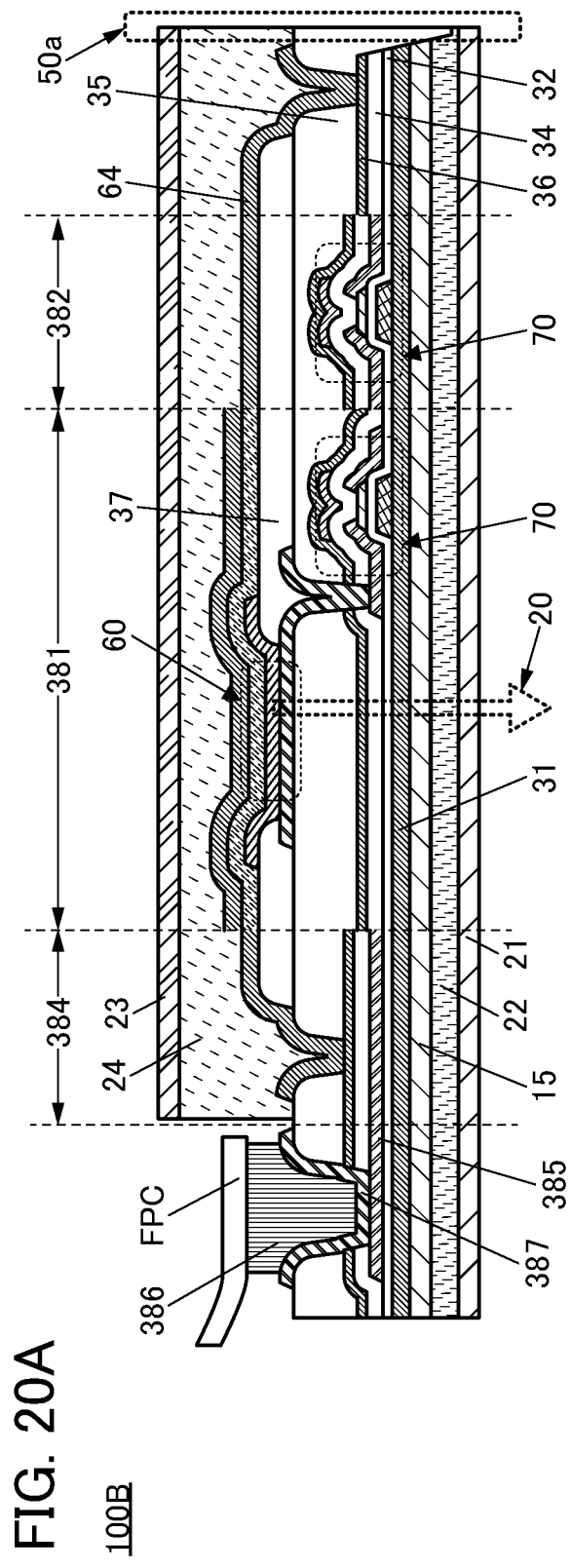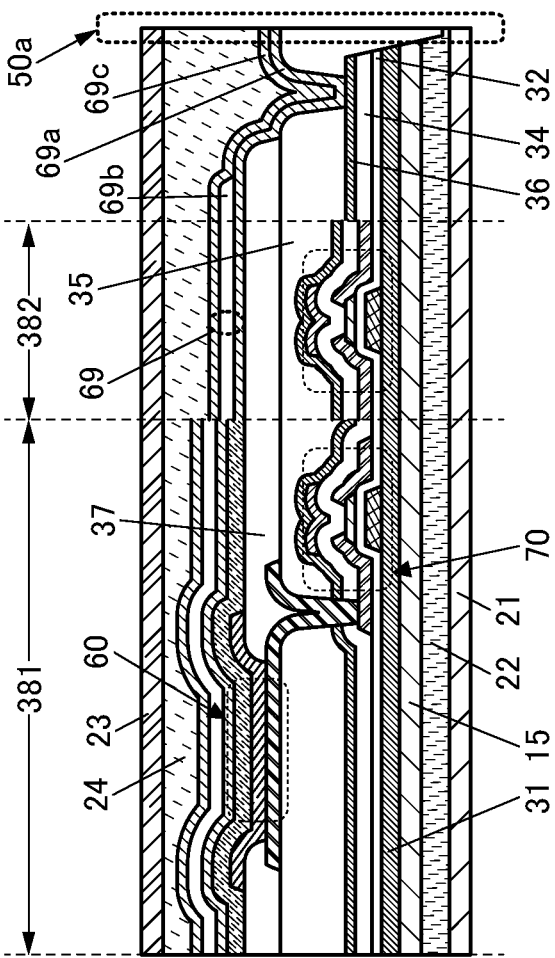
FIG. 20A
FIG. 20B

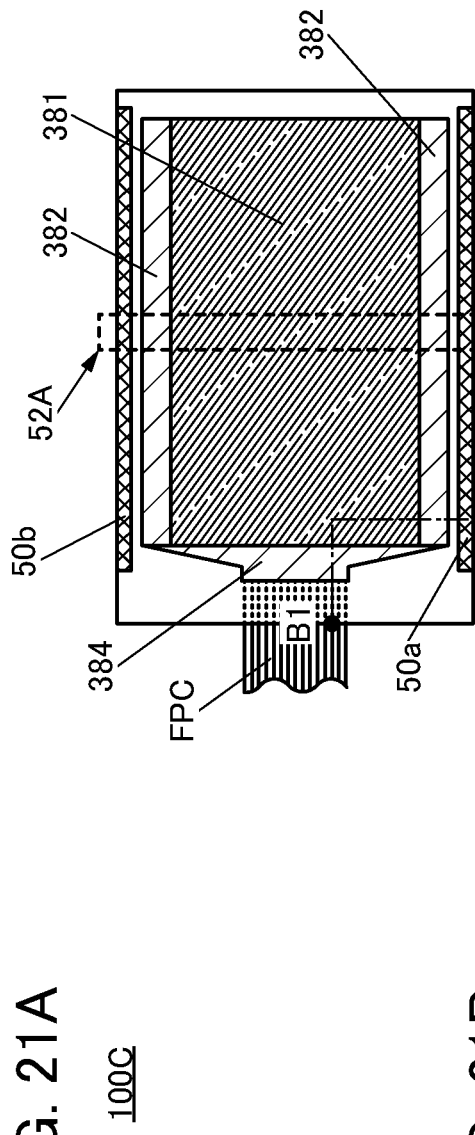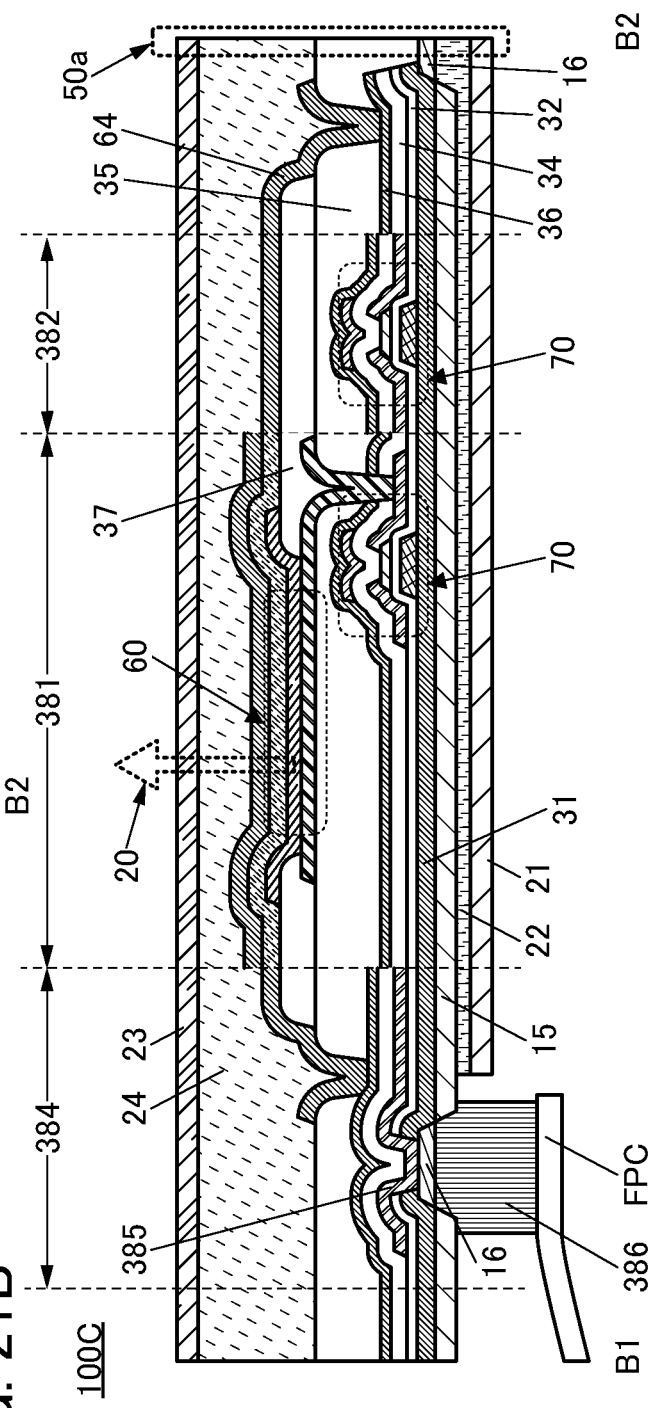
FIG. 21A
FIG. 21B

LIGHT-EMITTING DEVICE, LIGHT-EMITTING MODULE, ELECTRONIC DEVICE, AND MANUFACTURING METHOD OF LIGHT-EMITTING DEVICE

CROSS REFERENCE TO RELATED APPLICATIONS

This application is a U.S. National Phase Application under 35 U.S.C. § 371 of International Application PCT/IB2019/056747, filed on Aug. 8, 2019, which is incorporated by reference and claims the benefit of a foreign priority application filed in Japan on Aug. 24, 2018, as Application No. 2018-156888.

TECHNICAL FIELD

One embodiment of the present invention relates to a light-emitting device, a light-emitting module, and an electronic device. One embodiment of the present invention relates to a method for manufacturing a light-emitting device. In particular, one embodiment of the present invention relates to a flexible light-emitting device and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

Light-emitting elements utilizing electroluminescence (EL) (also referred to as EL elements) have features such as ease of thinning and lightening, high-speed response to an input signal, and driving with a direct-current low voltage source; accordingly, application of the EL elements to display devices and lighting devices has been proposed.

In addition, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits and the like including a semiconductor element such as a transistor.

Patent Document 1 discloses a flexible light-emitting device using an organic EL element.

REFERENCE

Patent Document

[Patent Document 1] Japanese Published Patent Application No. 2014-197522

SUMMARY OF THE INVENTION

Problems to be Solved by the Invention

Light-emitting devices using EL elements have been expected to be applied to electronic devices having curved display portions and electronic devices having foldable display portions, for example. Therefore, improvement in the resistance to bending of a light-emitting device is important. A light-emitting device having a curved surface needs to be capable of long-time display in a bent state. Furthermore, a foldable light-emitting device needs to have resistance to repetitive bending (specifically, fifty thousand times or more, and furthermore a hundred thousand times or more).

Moreover, in Patent Document 1, a method for separating a semiconductor element, a light-emitting element, and the like formed over a glass substrate with a separation layer therebetween and transferring them to a flexible substrate has been studied. In this method, the formation temperature of the semiconductor element can be increased, and an extremely highly reliable light-emitting device can be manufactured. For practical use, flexible light-emitting devices have been required to be manufactured with high yield.

An object of one embodiment of the present invention is to provide a light-emitting device capable of long-time display in a bent state. An object of one embodiment of the present invention is to provide a light-emitting device that can be repeatedly bent with a small radius of curvature. An object of one embodiment of the present invention is to provide a highly reliable light-emitting device. An object of one embodiment of the present invention is to provide a light-emitting device less likely to be broken. An object of one embodiment of the present invention is to reduce the thickness or weight of a light-emitting device. An object of one embodiment of the present invention is to provide an electronic device including a flexible display portion or a display portion having a curved surface.

An object of one embodiment of the present invention is to provide a method for manufacturing a light-emitting device with high yield. An object of one embodiment of the present invention is to provide a method for manufacturing a light-emitting device with high mass productivity. An object of one embodiment of the present invention is to provide a method for manufacturing a light-emitting device at a low cost.

Note that the description of these objects does not preclude the existence of other objects. One embodiment of the present invention does not need to achieve all the objects. Other objects can be derived from the descriptions of the specification, the drawings, and the claims.

Means for Solving the Problems

One embodiment of the present invention is a light-emitting device including a light-emitting portion and a pair of first regions. The pair of first regions includes end portions of the light-emitting device and is a region where an inorganic film extending to the light-emitting portion is not provided. The light-emitting portion is positioned between the pair of first regions. The light-emitting portion and the pair of first regions have flexibility.

The light-emitting device preferably further includes an external connection terminal and a wiring portion. The wiring portion is preferably positioned between the light-emitting portion and the external connection terminal. The pair of first regions is preferably a region where an inorganic film extending to the wiring portion is not provided. The wiring portion is preferably positioned between the pair of first regions. The wiring portion preferably has flexibility.

Alternatively, the light-emitting device preferably further includes an external connection terminal, a wiring portion, and a pair of second regions. The pair of second regions preferably includes end portions of the light-emitting device and is preferably a region where an inorganic film extending to the wiring portion is not provided. The wiring portion is preferably positioned between the pair of second regions. The wiring portion and the pair of second regions preferably have flexibility.

One embodiment of the present invention is a light-emitting device including a light-emitting portion and a frame-like region. The frame-like region is a region including an end portion of the light-emitting device and not provided with an inorganic film extending to the light-emitting portion. The light-emitting portion is positioned inside the frame-like region. The light-emitting portion and the frame-like region have flexibility. The light-emitting device preferably further includes an external connection terminal and a wiring portion. The frame-like region is preferably a region where an inorganic film extending to the wiring portion is not provided. The wiring portion is preferably positioned inside the frame-like region. The wiring portion preferably has flexibility.

One embodiment of the present invention is a flexible light-emitting device including a light-emitting element, a first inorganic insulating layer, a second inorganic insulating layer, and a first organic insulating layer. The first organic insulating layer is positioned over the first inorganic insulating layer. The light-emitting element is positioned over the first inorganic insulating layer with the first organic insulating layer therebetween. The second inorganic insulating layer is positioned over the light-emitting element. An end portion of the first inorganic insulating layer and an end portion of the second inorganic insulating layer are each positioned inward from an end portion of the first organic insulating layer. The end portion of the first inorganic insulating layer is exposed on a side surface of the light-emitting device. The first inorganic insulating layer and the second inorganic insulating layer are preferably in contact with each other outside an end portion of the light-emitting element. The first organic insulating layer preferably includes an opening outside the end portion of the light-emitting element. The first inorganic insulating layer and the second inorganic insulating layer are preferably in contact with each other in the opening. The light-emitting device preferably further includes a second organic insulating layer. The first organic insulating layer preferably contains a material different from a material of the second organic insulating layer. The first organic insulating layer is preferably positioned over the second organic insulating layer. The second organic insulating layer preferably covers the end portion of the first inorganic insulating layer. An end portion of the second organic insulating layer is preferably exposed on the side surface of the light-emitting device.

One embodiment of the present invention is a flexible light-emitting device and a light-emitting device including a light-emitting element, a transistor, a first inorganic insulating layer, a second inorganic insulating layer, a third inorganic insulating layer, and a first organic insulating layer. The transistor is positioned over the first inorganic insulating layer. The second inorganic insulating layer is positioned over the transistor. The first organic insulating layer is positioned over the second inorganic insulating layer. The light-emitting element is positioned over the first inorganic insulating layer with the first organic insulating layer therebetween. The third inorganic insulating layer is positioned over the light-emitting element. An end portion of the first inorganic insulating layer, an end portion of the second inorganic insulating layer, and an end portion of the third inorganic insulating layer are each positioned inward from an end portion of the first organic insulating layer. The end portion of the first organic insulating layer is exposed on a side surface of the light-emitting device. The first inorganic insulating layer and the second inorganic insulating layer are preferably in contact with each other outside an end portion of the light-emitting element. The second inorganic insulating layer and the third inorganic insulating layer are preferably in contact with each other outside an end portion of the light-emitting element. The first organic insulating layer preferably includes an opening outside the end portion of the light-emitting element. The second inorganic insulating layer and the third inorganic insulating layer are preferably in contact with each other in the opening. The light-emitting device preferably further includes a second organic insulating layer. The first organic insulating layer preferably contains a material different from a material of the second organic insulating layer. The first organic insulating layer is preferably positioned over the second organic insulating layer. The second organic insulating layer preferably covers the end portion of the first inorganic insulating layer and the end portion of the second inorganic insulating layer. An end portion of the second organic insulating layer is preferably exposed on the side surface of the light-emitting device.

One embodiment of the present invention is a module including a light-emitting device having any of the above structures. For example, the module is provided with a connector such as a flexible printed circuit (hereinafter referred to FPC) or a TCP (Tape Carrier Package), or an integrated circuit (IC) is mounted on the module by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

One embodiment of the present invention is a method for manufacturing a light-emitting device by manufacturing a plurality of light-emitting devices and dividing the plurality of light-emitting devices into individual light-emitting devices. A separation layer is formed over a first substrate; a first inorganic insulating layer is formed over the separation layer; a first opening is formed in the first inorganic insulating layer; a first organic insulating layer is formed over the first inorganic insulating layer; a light-emitting element is formed over the first organic insulating layer; a second inorganic insulating layer is formed over the light-emitting element; a second substrate is bonded onto the second inorganic insulating layer; the first substrate and the first inorganic insulating layer are separated from each other; a third substrate is bonded so that the third substrate overlaps with the second substrate with the first inorganic insulating layer therebetween; and the plurality of light-emitting devices is divided into individual light-emitting devices so that a dividing portion includes the first opening. In the first organic insulating layer, a second opening is preferably formed inward from the first opening. The second inorganic insulating layer is preferably formed inside the second opening.

The separation layer preferably includes a metal oxide layer and a resin layer over the metal oxide layer.

Alternatively, the separation layer preferably includes a resin layer.

Alternatively, the separation layer preferably includes a metal layer and an oxide insulating layer over the metal layer. The metal layer preferably includes a third opening overlapping with the first opening. The oxide insulating layer preferably includes a fourth opening overlapping with both the first opening and the third opening. The first substrate and the first organic resin layer are preferably in contact with each other in a portion where the first opening, the third opening, and the fourth opening overlap with each other, for example. Alternatively, in the case where the separation layer includes a metal layer and an oxide insulating layer over the metal layer, a second organic insulating layer is preferably formed using a material different from a material of the first organic insulating layer before the first organic insulating layer is formed. At this time, the second organic insulating layer is preferably in contact with the first substrate through the first opening, the third opening, and the fourth opening.

Alternatively, the separation layer preferably includes a first metal layer, an oxide insulating layer over the first metal layer, and a second metal layer over the oxide insulating layer. The first opening preferably overlaps with the second metal layer.

Effect of the Invention

According to one embodiment of the present invention, a light-emitting device capable of long-time display in a bent state can be provided. According to one embodiment of the present invention, a light-emitting device that can be repeatedly bent with a small radius of curvature can be provided. According to one embodiment of the present invention, a highly reliable light-emitting device can be provided. According to one embodiment of the present invention, a light-emitting device less likely to be broken can be provided. According to one embodiment of the present invention, the thickness or weight of a light-emitting device can be reduced. According to one embodiment of the present invention, an electronic device including a flexible display portion or a display portion having a curved surface can be provided.

According to one embodiment of the present invention, a method for manufacturing a light-emitting device with high yield can be provided. According to one embodiment of the present invention, a method for manufacturing a light-emitting device with high mass productivity can be provided. According to one embodiment of the present invention, a method for manufacturing a light-emitting device at a low cost can be provided.

Note that the description of these effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 20A and FIG. 20B are cross-sectional views showing an example of a light-emitting device.

FIG. 21A is a top view showing an example of a light-emitting device. FIG. 21B is a cross-sectional view showing an example of a light-emitting device.

MODE FOR CARRYING OUT THE INVENTION

Figure 1A:
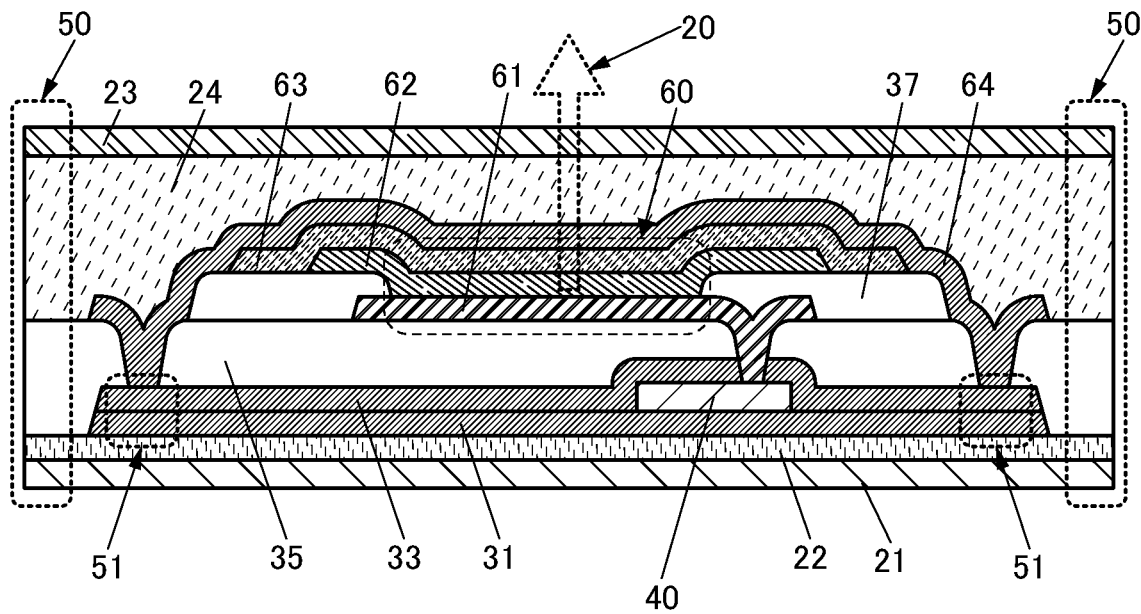
FIG. 1A and FIG. 1B are cross-sectional views showing examples of a light-emitting device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in the drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a light-emitting device of one embodiment of the present invention and a manufacturing method thereof will be described with reference to FIG. 1 to FIG. 22.

When a flexible light-emitting device is held in a bent state for a long time or repeatedly bent, generation or development (spread) of a crack is observed in some cases. Generation and further development of a crack might cause a defect in light emission of the light-emitting device. A crack is often generated in an inorganic film included in the light-emitting device. In the case where a plurality of light-emitting devices are formed over a large substrate (more than one light-emitting devices are obtained from one substrate), for example, a microcrack may be generated in an inorganic film at a dividing portion when the plurality of light-emitting devices are divided into individual light-emitting devices. The crack generated in the inorganic film is likely to spread when the light-emitting device is bent. Furthermore, additional cracks are likely to be generated around the crack. As described above, once a crack is generated in an inorganic film, increase and development of a crack are likely to occur in the inorganic film. Therefore, a defect in light emission of a light-emitting device is likely to occur due to bending of the light-emitting device.

In a method for manufacturing a light-emitting device of one embodiment of the present invention, a plurality of light-emitting devices are divided into individual light-emitting devices by dividing a region where an inorganic film extending to a light-emitting portion is not provided. Accordingly, even when a crack is generated in the inorganic film during outline processing on the light-emitting device, the spread of the crack in the light-emitting portion can be suppressed. Moreover, in the method for manufacturing a light-emitting device of one embodiment of the present invention, a plurality of light-emitting devices are preferably divided into individual light-emitting devices by dividing a region where an inorganic film is not provided. Accordingly, generation of a crack in the inorganic film during outline processing on the light-emitting device can be suppressed. In addition, even when the light-emitting device is held in a bent state for a long time or repeatedly bent, generation and development of a crack can be suppressed.

A light-emitting device of one embodiment of the present invention has flexibility and includes a light-emitting element, a first inorganic insulating layer, a second inorganic insulating layer, and a first organic insulating layer. The first organic insulating layer is positioned over the first inorganic insulating layer, the light-emitting element is positioned over the first inorganic insulating layer with the first organic insulating layer therebetween, and the second inorganic insulating layer is positioned over the light-emitting element. An end portion of the first inorganic insulating layer and an end portion of the second inorganic insulating layer are each positioned inward from an end portion of the first organic insulating layer. The end portion of the first organic insulating layer is exposed on a side surface of the light-emitting device.

The light-emitting device of one embodiment of the present invention is manufactured by dividing a region where an inorganic film extending to a light-emitting portion is not provided, so that an organic film is mainly exposed on the side surface of the light-emitting device. Here, since the organic film has lower water resistance than the inorganic film, impurities such as water might easily enter the light-emitting device from the side surface of the light-emitting device. Therefore, the first inorganic insulating layer and the second inorganic insulating layer are preferably in contact with each other outside an end portion of the light-emitting element. For example, it is preferable that the first organic insulating layer have an opening outside the end portion of the light-emitting element and that the first inorganic insulating layer and the second inorganic insulating layer be in contact with each other in the opening. When the light-emitting element is surrounded by the two inorganic insulating layers, a structure can be achieved in which impurities are less likely to reach the light-emitting element even when the impurities enter from the side surface of the light-emitting device. As a result, the reliability of the light-emitting device can be increased.

The light-emitting device of one embodiment of the present invention can be used as a display device or a lighting device, for example. Hereinafter, the light-emitting device that can be used as a display device is mainly described as an example.

[Cross-Sectional Structure of Light-Emitting Device]

Figure 1B:
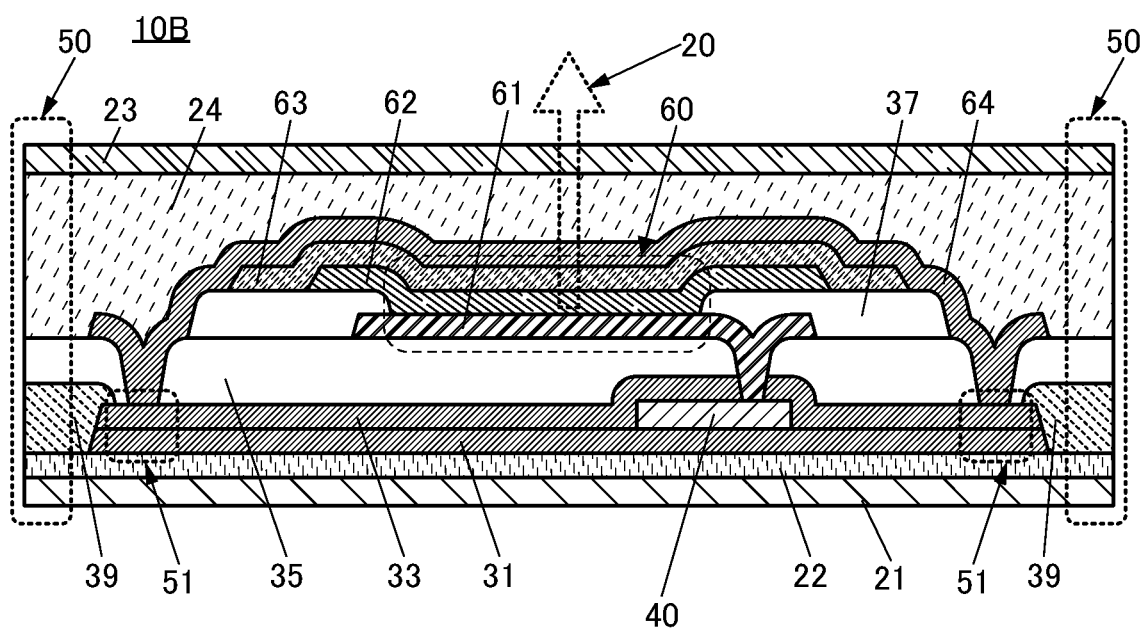

FIG. 1A and FIG. 1B show cross-sectional views of light-emitting devices of this embodiment.

A light-emitting device 10A illustrated in FIG. 1A includes a substrate 21, an adhesive layer 22, an inorganic insulating layer 31, a transistor 40, an inorganic insulating layer 33, an organic insulating layer 35, a light-emitting element 60, partition walls 37, an inorganic insulating layer 64, an adhesive layer 24, and a substrate 23.

The light-emitting device 10A has flexibility. Note that the light-emitting device of this embodiment has flexibility. For each of the components of the light-emitting device, a flexible material is used.

The transistor 40 is positioned over the inorganic insulating layer 31. The inorganic insulating layer 33 is positioned over the transistor 40. The organic insulating layer 35 is positioned over the inorganic insulating layer 33. The light-emitting element 60 is positioned over the inorganic insulating layer 31 with the organic insulating layer 35 therebetween. It can also be said that the light-emitting element 60 is positioned over the inorganic insulating layer 33 with the organic insulating layer 35 therebetween.

As the light-emitting element 60, an EL element such as an OLED (Organic Light Emitting Diode) or a QLED (Quantum-dot Light Emitting Diode) is preferably used. As a light-emitting substance contained in the EL element, either an organic compound or an inorganic compound can be used; a substance emitting fluorescence (a fluorescent material), a substance emitting phosphorescence (a phosphorescent material), a substance exhibiting thermally activated delayed fluorescence (a thermally activated delayed fluorescent (TADF) material), a quantum dot material, or the like can be used. Alternatively, a light-emitting diode (LED) such as a micro-LED can be used as the light-emitting element. In this embodiment, the case where an EL element is used as the light-emitting element 60 is mainly described as an example.

The light-emitting element 60 includes an electrode 61, an EL layer 62, and an electrode 63. The EL layer 62 is positioned between the electrode 61 and the electrode 63. The EL layer 62 contains at least a light-emitting substance. The electrode 63 has a function of transmitting visible light. The electrode 61 preferably has a function of reflecting visible light.

The light-emitting element 60 has a function of emitting visible light. Specifically, the light-emitting element 60 is an electroluminescent element that emits light to the substrate 23 side by applying voltage between the electrode 61 and the electrode 63 (see light emission 20). That is, the light-emitting device 10A has a top emission structure.

The light-emitting device of one embodiment of the present invention may be a top-emission, bottom-emission, or dual-emission light-emitting element. A conductive film that transmits visible light is used as the electrode through which light is extracted. A conductive film that reflects visible light is preferably used as the electrode through which no light is extracted.

The electrode 61 is electrically connected to a source or a drain of the transistor 40 through an opening provided in the inorganic insulating layer 33 and the organic insulating layer 35. The electrode 61 has a function of a pixel electrode. An end portion of the electrode 61 is covered with the partition wall 37.

Either an inorganic insulating layer or an organic insulating layer can be used as the partition wall 37. In the case where an organic insulating layer is used, the inorganic insulating layer 64 is preferably provided to cover a side surface of the partition wall 37. In the case where an inorganic insulating layer is used, the partition wall 37 and the inorganic insulating layer 64 are preferably in contact with each other outside an end portion of the electrode 63.

A protective layer is preferably provided to cover the light-emitting element 60. With provision of the protective layer, entry of impurities such as water into the light-emitting element 60 can be suppressed, leading to an increase in the reliability of the light-emitting element 60.

The protective layer preferably includes at least one layer of an inorganic film. In the light-emitting device 10A, an example in which the inorganic insulating layer 64 is included as the protective layer is shown. The protective layer may have a stacked-layer structure of an inorganic film and an organic film. As the stacked-layer structure, for example, a structure in which a silicon oxynitride film, a silicon oxide film, an organic film, a silicon oxide film, and a silicon nitride film are formed sequentially is given. When the protective layer has a stacked-layer structure of an inorganic film and an organic film, entry of impurities that can enter the light-emitting element 60 (typically, hydrogen, water, or the like) can be suitably suppressed.

The protective layer and the substrate 23 are bonded to each other with the adhesive layer 24.

An end portion of the organic insulating layer 35 is exposed on a side surface of the light-emitting device 10A. An end portion of the inorganic insulating layer 31, an end portion of the inorganic insulating layer 33, and an end portion of the inorganic insulating layer 64 are each positioned inward from the end portion of the organic insulating layer 35.

The side surface of the light-emitting device 10A is a surface exposed by dividing for outline processing in the manufacturing process of the light-emitting device 10A. Since the inorganic insulating layer 31, the inorganic insulating layer 33, and the inorganic insulating layer 64 are not provided in a region 50 including the side surface of the light-emitting device 10A, generation of a crack in these layers due to dividing can be suppressed. Accordingly, even when the light-emitting device 10A is held in a bent state for a long time or repeatedly bent, a crack is less likely to be generated in the light-emitting device 10A, and even if a crack is generated, it is less likely to be developed. As a result, the resistance to bending of the light-emitting device 10A can be increased.

The region 50 including the side surface of the light-emitting device 10A includes the substrate 21, the adhesive layer 22, the organic insulating layer 35, the adhesive layer 24, and the substrate 23. These layers each preferably contain an organic material. Meanwhile, since an organic material has lower water resistance than an inorganic material, impurities such as water might enter the light-emitting device 10A from the side surface of the light-emitting device 10A through the region 50. Thus, the inorganic insulating layers are preferably in contact with each other outside an end portion of the transistor 40 (at least an end portion of a semiconductor layer in which a channel is formed) and inward from the region 50, and the inorganic insulating layers are preferably in contact with each other outside an end portion of the light-emitting element 60 and inward from the region 50 (see a region 51). Even when impurities enter from the side surface of the light-emitting device 10A through the region 50, the region 51 can inhibit the impurities from reaching the light-emitting element 60 and the transistor 40. As a result, the reliability of the light-emitting device 10A can be increased.

In the region 51, the inorganic insulating layer 31 and the inorganic insulating layer 33 are in contact with each other. In the region 51, the inorganic insulating layer 33 and the inorganic insulating layer 64 are in contact with each other through an opening provided in the organic insulating layer 35.

A light-emitting device 10B illustrated in FIG. 1B includes organic insulating layers 39 in addition to the components of the light-emitting device 10A. The organic insulating layer 39 covers the end portion of the inorganic insulating layer 31 and the end portion of the inorganic insulating layer 33, and an end portion of the organic insulating layer 39 is exposed on a side surface of the light-emitting device 10B. The organic insulating layer 35 is positioned over the organic insulating layer 39.

In FIG. 1B, the region 50 including the side surface of the light-emitting device 10B includes the substrate 21, the adhesive layer 22, the organic insulating layer 39, the organic insulating layer 35, the adhesive layer 24, and the substrate 23.

The stacked-layer structure from the inorganic insulating layer 31 to the substrate 23 is formed over a support substrate (not illustrated) with a separation layer therebetween, separated from the support substrate, and then transferred to the substrate 21. Depending on the structure of the separation layer described below, the separation interface may be different between the region 50 and other regions. For example, in the case where separation is performed at the interface between the organic insulating layer 35 and the separation layer, the organic insulating layer 35 might be damaged by treatment for reducing adhesion at the interface (heating or laser light irradiation). Since the organic insulating layer 35 has a function of a planarization layer, a function of a layer for supporting the light-emitting element 60, and the like, the reliability of the light-emitting device might be decreased when the organic insulating layer 35 is damaged. Thus, a structure is preferable in which the organic insulating layer 39 is provided in the region 50 and separation is performed at the interface between the organic insulating layer 39 and the separation layer. The organic insulating layer 39 is preferably formed using a material different from that of the organic insulating layer 35. Specifically, the material of the organic insulating layer 39 is preferably selected so that separability in the region 50 becomes high. Compared to the case where the organic insulating layer 35 is positioned at the separation interface, separability is preferably increased in the case where the organic insulating layer 39 is positioned at the separation interface. It is preferable that a polyimide resin be used for the organic insulating layer 39 and an acrylic resin be used for the organic insulating layer 35, for example.

[Top Surface Structure of Light-Emitting Device]

FIG. 2A to FIG. 2D show top views of light-emitting devices of this embodiment. Each of the light-emitting devices includes the light-emitting portion 381, the circuit 382, the external connection terminal 383, and the wiring portion 384.

Figure 2A:
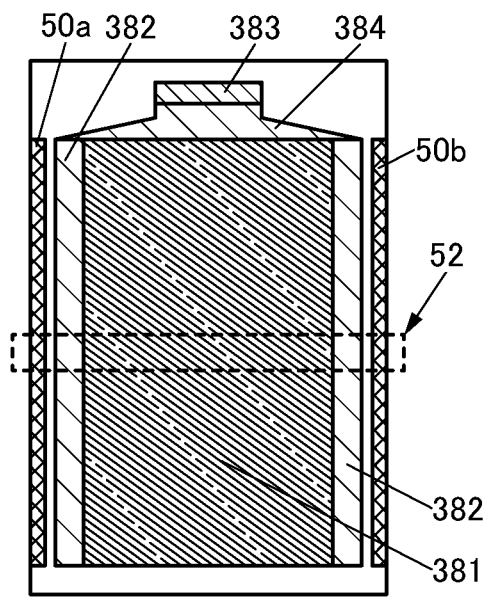
FIG. 2A to FIG. 2D are top views showing examples of a light-emitting device.

A light-emitting device EP1 illustrated in FIG. 2A includes a pair of regions (a region 50a and a region 50b) provided so that the light-emitting portion 381 is sandwiched therebetween.

The light-emitting device EP1 can be bent in a region 52, for example. The light-emitting device EP1 can be bent along a line through three portions in the region 52: the region 50a, the region 50b, and the light-emitting portion 381.

Figure 2B:
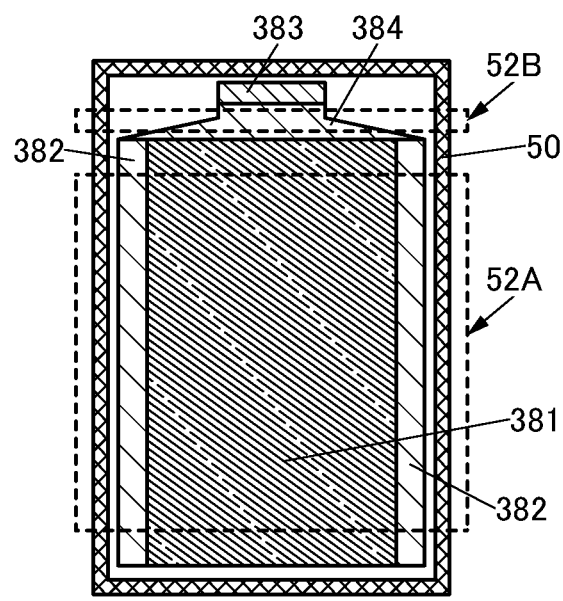

A light-emitting device EP2 illustrated in FIG. 2B includes the region 50 provided to surround the light-emitting portion 381, the circuit 382, the external connection terminal 383, and the wiring portion 384.

The light-emitting device EP2 can be bent in a region 52A and a region 52B, for example. The light-emitting device EP2 can be bent along a line through three portions in total in the region 52A: two portions of the region 50 and the light-emitting portion 381. The two portions of the region 50 are positioned so that the light-emitting portion 381 is sandwiched therebetween. Moreover, the light-emitting device EP2 can be bent along a line through three portions in total in the region 52B: two portions of the region 50 and the wiring portion 384. The two portions of the region 50 are positioned so that the wiring portion 384 is sandwiched therebetween.

Figure 2C:
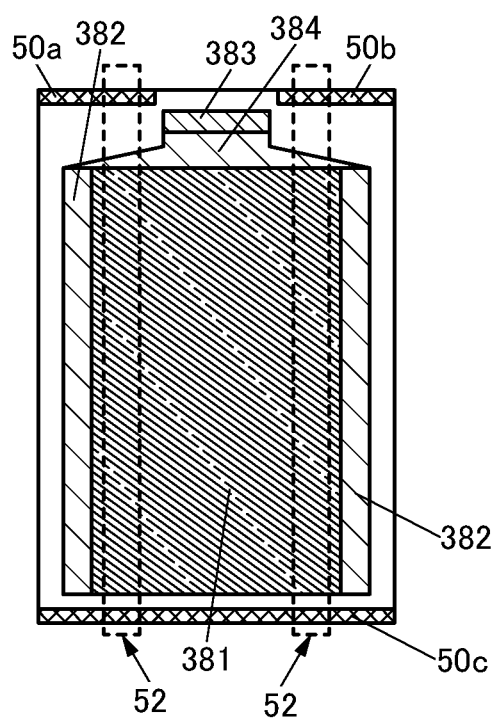

A light-emitting device EP3 illustrated in FIG. 2C includes the region 50a, the region 50b, and a region 50c. The region 50a and the region 50c are provided so that the light-emitting portion 381 and the wiring portion 384 are sandwiched therebetween, and the region 50b and the region 50c are provided so that the light-emitting portion 381 and the wiring portion 384 are sandwiched therebetween.

The light-emitting device EP3 can be bent in two regions 52, for example. The light-emitting device EP3 can be bent along a line through four portions in each of the regions 52: the region 50a or the region 50b, the region 50c, the wiring portion 384, and the light-emitting portion 381.

Figure 2D:
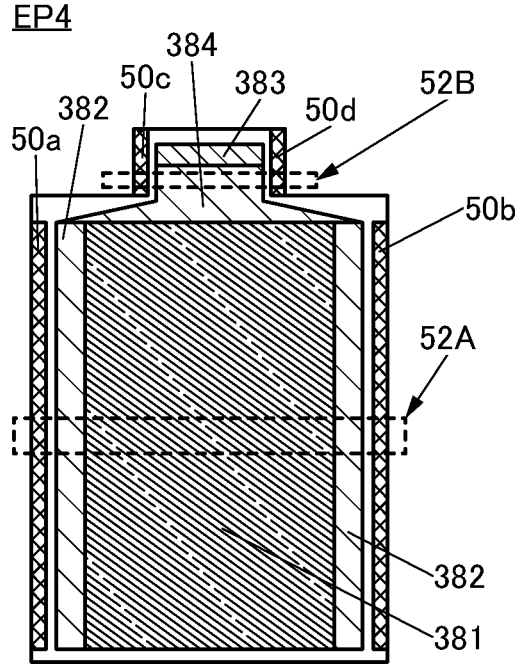

A light-emitting device EP4 illustrated in FIG. 2D includes the pair of regions (the region 50a and the region 50b) provided so that the light-emitting portion 381 is sandwiched therebetween, and a pair of regions (the region 50c and a region 50d) provided so that the wiring portion 384 is sandwiched therebetween.

The light-emitting device EP4 can be bent in the region 52A and the region 52B, for example. The light-emitting device EP4 can be bent along a line through three portions in the region 52A: the region 50a, the region 50b, and the light-emitting portion 381. The light-emitting device EP4 can be bent along a line through three portions in the region 52B: the region 50c, the region 50d, and the wiring portion 384.

The structure similar to that of the light-emitting device 10A (FIG. 1A) or the light-emitting device 10B (FIG. 1B) can be employed for the region 50 and the region 50a to the region 50d illustrated in FIG. 2A to FIG. 2D. That is, it can be said that the region 50 and the region 50a to the region 50d are regions where an inorganic film extending to the light-emitting portion 381 and the wiring portion 384 is not provided. Thus, when the light-emitting device is bent so that those regions are included, generation and development of a crack can be suppressed. As a result, the resistance to bending of the light-emitting device can be increased.

Here, a method for dividing a plurality of light-emitting devices into individual light-emitting devices will be described with reference to FIG. 3A and FIG. 3B.

Figure 3A:
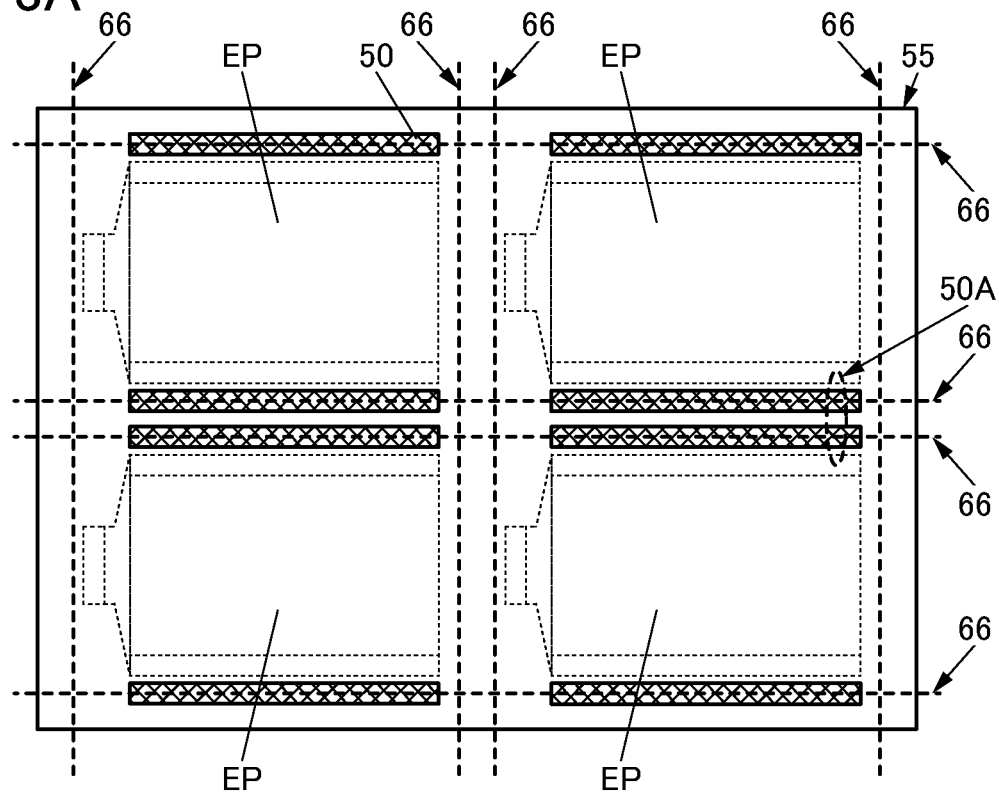
FIG. 3A and FIG. 3B are top views showing examples of a method for manufacturing a light-emitting device.
Figure 3B:
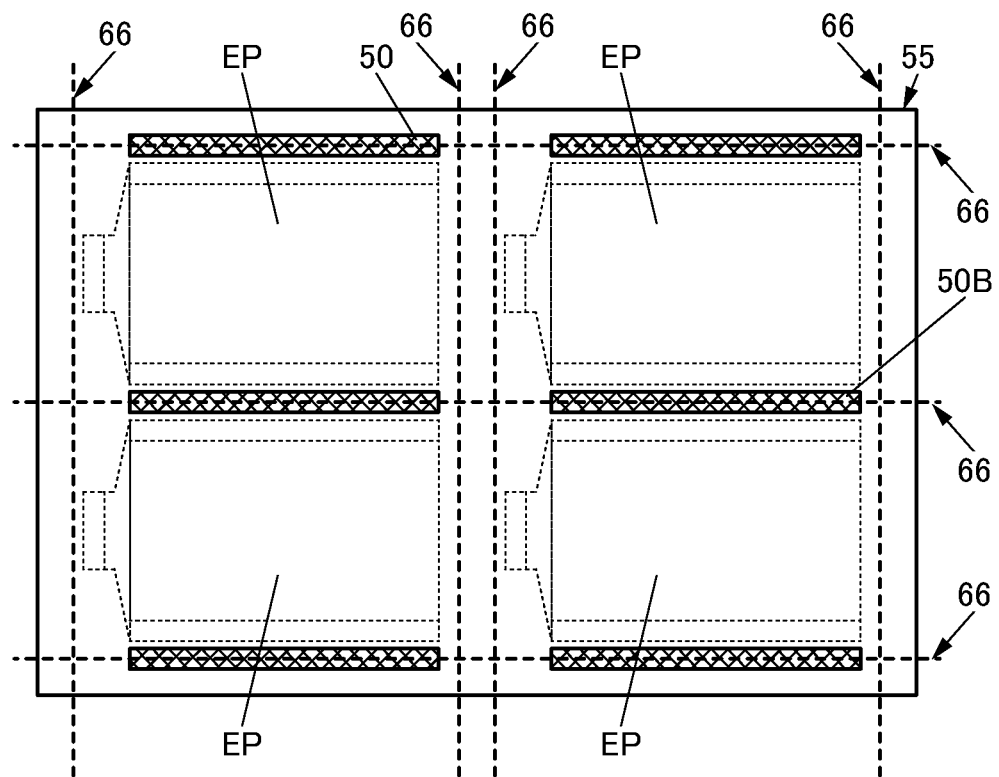

FIG. 3A and FIG. 3B show top views of a large-sized panel 55 including four light-emitting devices EP. The large-sized panel 55 is divided along dividing lines 66, whereby individual light-emitting devices EP can be obtained. Here, the dividing line 66 preferably passes through the region 50. The region 50 is a region where an inorganic film extending to a light-emitting portion is not provided. When the dividing line 66 passes through the region 50, generation of a crack in the light-emitting device EP at the time of dividing can be suppressed. Note that adjacent regions 50A illustrated in FIG. 3A may be continuous like a region 50B illustrated in FIG. 3B. Accordingly, the number of dividing lines can be reduced and dividing process can be shortened. Furthermore, the area of a dividing portion can be reduced and the area of the light-emitting portion can be increased.

[Method for Manufacturing Light-Emitting Device]

Next, a method for manufacturing the light-emitting device of one embodiment of the present invention is described with reference to FIG. 4 to FIG. 18.

Note that thin films that form the light-emitting device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. In addition, as an example of the thermal CVD method, a metal organic chemical vapor deposition (MOCVD: Metal Organic CVD) method can be given.

The thin films that form the light-emitting device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that form the light-emitting device are processed, a photolithography method or the like can be used for the processing. Alternatively, a nanoimprinting method, a sandblasting method, a lift-off method, or the like may be used for the processing of the thin films. Island-shaped thin films may be directly formed by a film formation method using a blocking mask such as a metal mask.

There are two typical photolithography methods. In one of the methods, a resist mask is formed over a thin film that is to be processed, and the thin film is processed by etching or the like, so that the resist mask is removed. In the other method, after a photosensitive thin film is formed, exposure and development are performed, so that the thin film is processed into a desired shape.

For light for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultraviolet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

Manufacturing Method Example 1

Manufacturing method example 1 of the light-emitting device will be described with reference to FIG. 4 to FIG. 6.

Figure 4A:
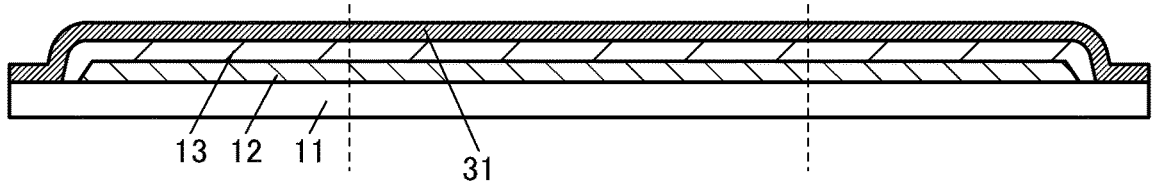
FIG. 4A to FIG. 4E are cross-sectional views showing an example of a method for manufacturing a light-emitting device.

First, an island-shaped metal oxide layer 12 is formed over a support substrate 11, an island-shaped resin layer 13 is formed over the metal oxide layer 12, and the inorganic insulating layer 31 is formed over the support substrate 11 and over the resin layer 13 (FIG. 4A).

In Manufacturing method example 1, an example in which separation is performed at the interface between the metal oxide layer 12 and the resin layer 13 is shown. As a method for reducing adhesion at the interface, heat treatment in an oxygen-containing atmosphere at the time of forming the resin layer 13 and laser light irradiation on the resin layer 13 are typically given. In the method for manufacturing the light-emitting device of this embodiment, at least one of the heat treatment and the laser light irradiation is preferably performed. Note that the separation occurs in the embrittled resin layer 13 in some cases.

In the case where the entire surface of the resin layer 13 is irradiated with laser light, a linear laser beam is favorably used. As the laser, an excimer laser, a solid laser, and the like can be used. For example, a diode-pumped solid-state laser (DPSS) may be used. Laser apparatuses for the manufacturing lines for low temperature polysilicon (LTPS) and the like can be used, which enables effective use of the apparatuses. For example, a linear laser apparatus used in a crystallization step for LTPS can be used in a laser light irradiation step of one embodiment of the present invention, where the substrate is reversed upside down and irradiation with laser light from immediately above is performed in a state where the support substrate 11 side is set as a front surface. An existing LTPS manufacturing line can be applied to a manufacturing line of a top-gate self-aligned transistor including an oxide semiconductor (OS). As described above, existing LTPS manufacturing facilities can be easily switched to manufacturing facilities capable of performing a separating step of one embodiment of the present invention and a manufacturing process of OS transistors.

Alternatively, in the case where heat treatment is performed in an oxygen-containing atmosphere at the time of forming the resin layer 13, the step of laser light irradiation on the entire surface of the resin layer 13 can be omitted. A laser apparatus for linear laser beam irradiation is expensive itself and requires high running costs. One embodiment of the present invention does not require the laser apparatus and thus can reduce costs significantly. In addition, application to a large-sized substrate is easy.

If a foreign matter such as dust is adhered to the surface of the support substrate 11 that is subjected to light irradiation at the time of irradiating the resin layer 13 with laser light through the support substrate 11, in some cases, non-uniformity occurs in the light irradiation and part of the resin layer 13 has low separability, leading to a reduction in yield of the process for separating the support substrate 11 and the resin layer 13 from each other. In one embodiment of the present invention, the heat treatment can improve the separability of the resin layer 13. Even when a foreign matter is adhered to the support substrate 11, heating nonuniformity does not easily occur in the resin layer 13, which inhibits a reduction in yield of the process for separating the support substrate 11 and the resin layer 13 from each other.

The adhesion between the metal oxide layer 12 and the inorganic insulating layer 31 may be low depending on materials. If the adhesion between the metal oxide layer 12 and the inorganic insulating layer 31 is low, film separation (peeling) occurs unintentionally in the manufacturing process of the light-emitting device, leading to a reduction in the yield in some cases. Film separation is observed in some cases when a titanium oxide film is used as the metal oxide layer 12 and an inorganic insulating film such as a silicon oxide film or a silicon oxynitride film is used as the inorganic insulating layer 31, for example. Therefore, the resin layer 13 is preferably provided to cover a top surface and a side surface of the metal oxide layer 12. Accordingly, a region where the metal oxide layer 12 and the inorganic insulating layer 31 are in contact with each other is eliminated, and thus unintended film separation can be reduced. Furthermore, the adhesion between the metal oxide layer 12 and the inorganic insulating layer 31 do not need to be considered; thus, the range of choices for the materials that are used for the metal oxide layer 12 and the inorganic insulating layer 31 can be widened.

Furthermore, it is preferable that the metal oxide layer 12 and the resin layer 13 be provided to have an island shape and the inorganic insulating layer 31 be provided to cover an end portion of the island-shaped metal oxide layer 12 and an end portion of the island-shaped resin layer 13. When the metal oxide layer 12 and the resin layer 13 are provided over the entire surface of the support substrate 11, the resin layer 13 is separated unintentionally from the metal oxide layer 12 in some cases. In view of the above, a region in contact with the inorganic insulating layer 31 is preferably provided over the support substrate 11. This suppresses unintended separation of the resin layer 13 from the metal oxide layer 12. In addition, the formation of a separation starting point enables control of separation timing and enables the metal oxide layer 12 and the resin layer 13 to be separated from each other at desired timing.

The support substrate 11 has stiffness high enough for easy transfer and has resistance to temperatures applied during the manufacturing process. Examples of a material that can be used for the support substrate 11 include glass, quartz, ceramics, sapphire, a resin, a semiconductor, a metal, and an alloy. Examples of the glass include alkali-free glass, barium borosilicate glass, and aluminoborosilicate glass.

In Manufacturing method example 1, a base layer is formed between the support substrate 11 and the resin layer 13. The base layer can have either a single-layer structure or a stacked-layer structure, and one or both of a metal layer and a metal oxide layer can be used.

Specifically, a layer that contains one or more of titanium, molybdenum, aluminum, tungsten, silicon, indium, zinc, gallium, tantalum, tin, hafnium, yttrium, zirconium, magnesium, lanthanum, cerium, neodymium, bismuth, and niobium can be used as the base layer. The base layer can contain a metal, an alloy, and a compound thereof (e.g., a metal oxide). The base layer preferably contains one or more of titanium, molybdenum, aluminum, tungsten, silicon, indium, zinc, gallium, tantalum, and tin.

For the metal oxide layer 12, an oxide of any of a variety of metals can be used. Examples of the metal oxide include titanium oxide ($TiO_x$), molybdenum oxide, aluminum oxide, tungsten oxide, indium tin oxide containing silicon (ITSO), indium zinc oxide, and an In—Ga—Zn oxide.

Other examples of the metal oxide include indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, and niobate.

The metal oxide layer 12 can be formed in such a manner that a metal layer is formed and then oxygen is introduced into the metal layer. At this time, only a surface of the metal layer or the entire metal layer is oxidized. In the former case, the introduction of oxygen into the metal layer forms a stacked-layer structure of a metal layer and a metal oxide layer.

The metal layer can be oxidized, for example, by heating the metal layer in an oxygen-containing atmosphere. It is preferable that the metal layer be heated while an oxygen-containing gas is supplied. The temperature at which the metal layer is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer is heated is preferably set to lower than or equal to the maximum temperature in fabricating the transistor. Accordingly, the maximum temperature in manufacturing the light-emitting device can be prevented from increasing. When the temperature of the heat treatment is set to lower than or equal to the maximum temperature in fabricating the transistor, a manufacturing apparatus for the fabrication process of the transistor, for example, can also be utilized, which can reduce additional capital investment and the like. As a result, light-emitting devices with reduced production costs can be achieved. When the fabrication temperature of the transistor is up to 350° C., for example, the temperature of the heat treatment is preferably lower than or equal to 350° C.

Alternatively, the metal layer can be oxidized by performing radical treatment on the surface of the metal layer. In the radical treatment, the surface of the metal layer is preferably exposed to an atmosphere containing at least one of an oxygen radical and a hydroxy radical. For example, plasma treatment is preferably performed in an atmosphere containing one or both of oxygen and water vapor ($H_2O$).

Hydrogen, oxygen, a hydrogen radical (H*), an oxygen radical (O*), a hydroxy radical (OH*), or the like is made to be present on a surface of the metal oxide layer 12 or in the metal oxide layer 12, whereby the force required for the separation between the metal oxide layer 12 and the resin layer 13 can be reduced. Accordingly, again, it is preferable that the metal oxide layer 12 be formed by performing radical treatment or plasma treatment.

In the case where radical treatment or plasma treatment is performed on the surface of the metal layer to oxidize the metal layer, a step of heating the metal layer at high temperatures is unnecessary. Accordingly, the maximum temperature in manufacturing the light-emitting device can be prevented from increasing.

Alternatively, the metal oxide layer 12 can be formed in an oxygen atmosphere. For example, a metal oxide film is formed by a sputtering method while an oxygen-containing gas is supplied, whereby the metal oxide layer 12 can be formed. Also in this case, the surface of the metal oxide layer 12 is preferably subjected to radical treatment. In the radical treatment, the surface of the metal oxide layer 12 is preferably exposed to an atmosphere containing at least one of an oxygen radical, a hydrogen radical, and a hydroxyl radical. For example, plasma treatment is preferably performed in an atmosphere containing one or more of oxygen, hydrogen, and water vapor ($H_2O$).

The radical treatment can be performed with a plasma generation apparatus or an ozone generation apparatus.

For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor ($H_2O$). Water plasma treatment is particularly preferable because it makes a large amount of moisture present on the surface of the metal oxide layer 12 or in the metal oxide layer 12.

Plasma treatment may be performed in an atmosphere containing two or more kinds among oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. The use of an argon gas as a gas for the plasma treatment is favorable because the metal layer or the metal oxide layer 12 is damaged during the plasma treatment.

Two or more kinds of plasma treatment may be performed sequentially without exposure to the air. For example, water plasma treatment may be performed after argon plasma treatment is performed.

As other introduction methods of oxygen, hydrogen, water, or the like, an ion implantation method, an ion doping method, a plasma immersion ion implantation method, and the like can be used.

The metal layer preferably has a thickness of greater than or equal to 1 nm and less than or equal to 100 nm, further preferably greater than or equal to 1 nm and less than or equal to 50 nm, still further preferably greater than or equal to 1 nm and less than or equal to 20 nm.

The metal oxide layer 12 preferably has a thickness of, for example, greater than or equal to 1 nm and less than or equal to 200 nm, further preferably greater than or equal to 5 nm and less than or equal to 100 nm, still further preferably greater than or equal to 5 nm and less than or equal to 50 nm. In the case where the metal oxide layer 12 is formed using the metal layer, the completed metal oxide layer 12 is sometimes thicker than the initially formed metal layer.

Titanium oxide, tungsten oxide, or the like is suitable for the metal oxide layer 12. Titanium oxide is preferably used because the cost can be lower than that when tungsten oxide is used.

The resin layer 13 can be formed using any of a variety of resin materials (including resin precursors). The resin layer 13 is preferably formed using a thermosetting material.

The resin layer 13 may be formed using a material with photosensitivity or a material without photosensitivity (also called a non-photosensitive material). When a photosensitive material is used, the resin layer 13 can be formed in a desired shape by a photolithography method. For example, the resin layer 13 may have an opening or an uneven shape.

The resin layer 13 is preferably formed using a material containing a polyimide resin, a polyimide resin precursor, or an acrylic resin. The resin layer 13 can be formed using, for example, a material containing a polyimide resin and a solvent, a material containing a polyamic acid and a solvent, a material containing an acrylic resin and a solvent, or the like. A material containing a polyimide resin or a polyimide resin precursor is preferable because it has relatively high heat resistance. A material containing an acrylic resin is preferable because it has a high visible-light-transmitting property. A polyimide resin and an acrylic resin are each a material suitably used for a planarization film or the like of a light-emitting device; thus, the film formation apparatus and the material can be shared. Thus, there is no need to prepare a new apparatus or a new material to obtain the structure of one embodiment of the present invention. Since the resin layer 13 does not need a special material and can be formed using a resin material used for a light-emitting device as described above, the cost can be reduced.

Other examples of resin materials which can be used to form the resin layer 13 include an epoxy resin, a polyamide resin, a polyimide-amide resin, a siloxane resin, a benzocyclobutene-based resin, a phenol resin, and precursors of these resins.

After a film to be the resin layer 13 is formed, heat treatment is performed on the film, so that the resin layer 13 can be formed.

The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

Heating is preferably performed while a nitrogen gas is supplied. In that case, the heating atmosphere can contain less oxygen than an air atmosphere; thus, oxidation of the resin layer 13 can be inhibited and the resin layer 13 can have an increased transmitting property with respect to visible light.

Alternatively, heating is preferably performed in an air atmosphere. Alternatively, heating is preferably performed while a gas containing oxygen is supplied. The larger the amount of oxygen contained in the resin layer 13 is, the smaller the force required for separating the metal oxide layer 12 and the resin layer 13 from each other can be. The higher the proportion of oxygen in the atmosphere of the heat treatment is, the larger the amount of oxygen contained in the resin layer 13 can be, which makes it easier to separate the resin layer 13 and the metal oxide layer 12 from each other.

In the case where the entire surface of the resin layer 13 is irradiated with laser light in a later step, for example, heating is preferably performed while a nitrogen gas is supplied. In the case where the laser light irradiation is not performed, heating is preferably performed in an oxygen-containing atmosphere.

By the heat treatment, gas components to be released (e.g., hydrogen, water, or the like) in the resin layer 13 can be reduced. In particular, the heating is preferably performed at a temperature higher than or equal to the formation temperature of each layer formed over the resin layer 13. Thus, a gas released from the resin layer 13 in the fabrication process of the transistor can be significantly reduced.

For example, in the case where the fabrication temperature of the transistor is up to 350° C., a film to be the resin layer 13 is preferably heated at a temperature higher than or equal to 350° C. and lower than or equal to 450° C., further preferably lower than or equal to 400° C., still further preferably lower than or equal to 375° C. Thus, a gas released from the resin layer 13 in the fabrication process of the transistor can be significantly reduced.

The temperature of the heat treatment is preferably set to lower than or equal to the maximum temperature in fabricating the transistor. When the temperature of the heat treatment is set to lower than or equal to the maximum temperature in fabricating the transistor, a manufacturing apparatus for the fabrication process of the transistor, for example, can also be utilized, which can reduce additional capital investment and the like. As a result, light-emitting devices with reduced production costs can be achieved. When the fabrication temperature of the transistor is up to 350° C., for example, the temperature of the heat treatment is preferably lower than or equal to 350° C.

The maximum temperature in fabricating the transistor is preferably equal to the temperature of the heat treatment, in which case it is possible to prevent the heat treatment from increasing the maximum temperature in fabricating the light-emitting device and it is also possible to reduce the gas components to be released in the resin layer 13.

Even when the heating temperature is relatively low, increasing the treatment time sometimes achieves separability equivalent to that under a condition with a higher heating temperature. It is thus preferable to increase the treatment time when the heating temperature cannot be increased owing to the structure of the heating apparatus.

The duration of the heat treatment is preferably longer than or equal to 5 minutes and shorter than or equal to 24 hours, further preferably longer than or equal to 30 minutes and shorter than or equal to 12 hours, still further preferably longer than or equal to one hour and shorter than or equal to 6 hours, for example. Note that the duration of the heat treatment is not limited thereto. The duration of the heat treatment may be shorter than 5 minutes in the case where the heat treatment is performed by an RTA (Rapid Thermal Annealing) method, for example.

As the heating apparatus, it is possible to use a variety of apparatuses such as an electric furnace and an apparatus for heating an object by heat conduction or heat radiation from a heating element such as a resistance heating element. For example, an RTA apparatus such as a GRTA (Gas Rapid Thermal Anneal) apparatus or an LRTA (Lamp Rapid Thermal Anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment by using a high-temperature gas. The use of an RTA apparatus is preferred in terms of mass production because the treatment time can be shortened. Furthermore, the heat treatment may be performed using an in-line heating apparatus.

Before the heat treatment, heat treatment (also referred to as prebaking treatment) for removing the solvent contained in the film to be the resin layer 13 may be performed. The temperature of the pre-baking treatment can be set as appropriate in accordance with the material to be used. For example, the pre-baking treatment can be performed at 50° C. to 180° C. inclusive, 80° C. to 150° C. inclusive, or 90° C. to 120° C. inclusive. The heat treatment may also serve as the pre-baking treatment; the solvent may be removed by the heat treatment.

The resin layer 13 has flexibility. The support substrate 11 has lower flexibility than the resin layer 13.

The resin layer 13 preferably has a thickness greater than or equal to 0.01 µm and less than 10 µm, further preferably greater than or equal to 0.1 µm and less than or equal to 5 µm, still further preferably greater than or equal to 0.5 µm and less than or equal to 3 µm. By forming the resin layer thin, the light-emitting device can be fabricated at a low cost. The light-emitting device can be lightweight and thin. In addition, the light-emitting device can have higher flexibility. With a solution having low viscosity, the resin layer 13 having a small thickness can be easily formed. Note that the thickness of the resin layer 13 is not limited thereto, and may be greater than or equal to 10 µm. For example, the resin layer 13 may have a thickness greater than or equal to 10 µm and less than or equal to 200 µm. The resin layer 13 with a thickness of greater than or equal to 10 µm is suitable because the rigidity of the light-emitting device can be increased.

The thermal expansion coefficient of the resin layer 13 is preferably 0.1 ppm/° C. to 50 ppm/° C. inclusive, further preferably 0.1 ppm/° C. to 20 ppm/° C. inclusive, still further preferably 0.1 ppm/° C. to 10 ppm/° C. inclusive. The lower the thermal expansion coefficient of the resin layer 13 is, the more the generation of a crack in a layer included in a transistor or the like and breakage of a transistor or the like which are caused owing to the heating can be prevented.

The inorganic insulating layer 31 preferably has a function of blocking hydrogen, oxygen, and water that are released from the metal oxide layer 12, the resin layer 13, and the like in a later heating step.

The inorganic insulating layer 31 is formed at a temperature lower than or equal to the upper temperature limit of the resin layer 13. The inorganic insulating layer 31 is preferably formed at a temperature lower than the temperature of the heat treatment.

As the inorganic insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used. It is particularly preferable that a silicon nitride film be formed over the resin layer 13 and a silicon oxide film be formed over the silicon nitride film.

Note that in this specification and the like, "silicon oxynitride" is a material that contains more oxygen than nitrogen in its composition. Moreover, in this specification and the like, "silicon nitride oxide" is a material that contains more nitrogen than oxygen in its composition.

The inorganic insulating layer 31 is preferably formed at high temperatures because the film can have higher density and a higher barrier property as the film formation temperature is higher.

The substrate temperature during the formation of the inorganic insulating layer 31 is preferably higher than or equal to room temperature (25° C.) and lower than or equal to 350° C., further preferably 100° C. to 300° C. inclusive.

Figure 4B:
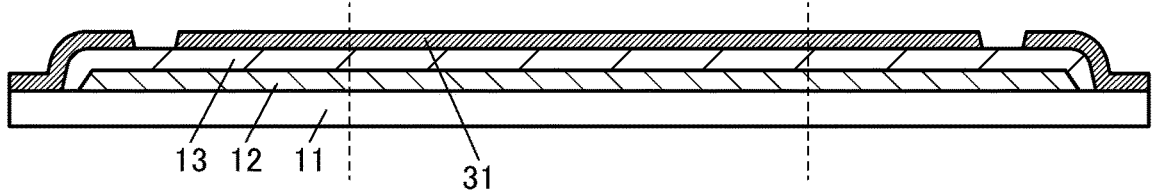

Next, in the inorganic insulating layer 31, openings are formed in positions overlapping with the metal oxide layer 12 and the resin layer 13 (FIG. 4B). The step of forming the openings in the inorganic insulating layer 31 is performed before the formation of the organic insulating layer 35, and can be performed before, during, or after the fabrication of a transistor 80.

Figure 4C:
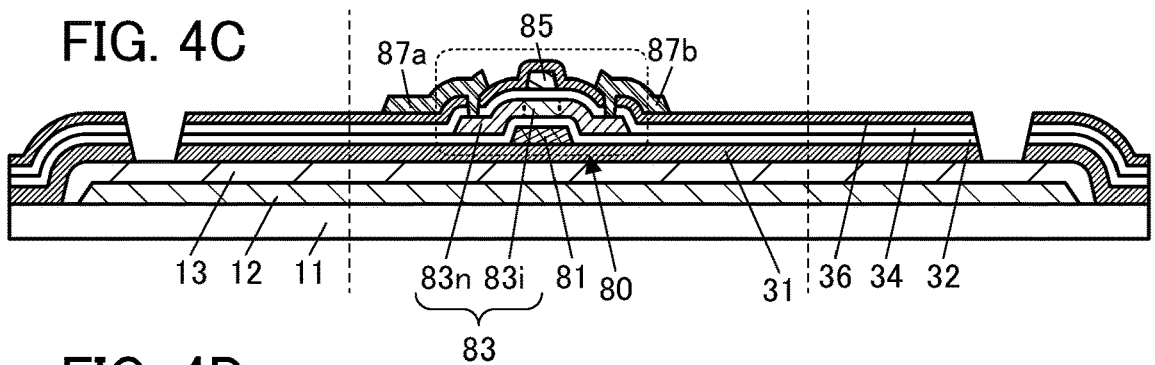

Next, the transistor 80 is formed over the inorganic insulating layer 31 (FIG. 4C).

There is no particular limitation on the structure of the transistors in the light-emitting device. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

In this embodiment, an oxide semiconductor is used as a semiconductor of the transistor. The use of a semiconductor material having a wider band gap and a lower carrier density than silicon is preferable because off-state current of the transistor can be reduced.

Here, the case where a transistor including a metal oxide layer 83 and two gates is fabricated as the transistor 80 is shown.

The transistor 80 is formed at a temperature lower than or equal to the upper temperature limit of the resin layer 13. The transistor 80 is preferably formed at a temperature lower than the temperature of the heat treatment at the time of forming the resin layer 13.

Specifically, first, a conductive layer 81 functioning as a gate electrode is formed over the inorganic insulating layer 31. The conductive layer 81 can be formed in the following manner: a conductive film is formed, a resist mask is formed, the conductive film is etched, and the resist mask is removed.

For the conductive layers included in the light-emitting device, a single-layer structure or a stacked-layer structure of any of metals such as aluminum, titanium, chromium, nickel, copper, yttrium, zirconium, molybdenum, silver, tantalum, and tungsten or an alloy containing any of these metals as its main component can be used. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as an oxide semiconductor or polycrystalline silicon whose resistance is lowered by adding an impurity element, for example, or silicide such as nickel silicide may be used. A film containing graphene may be used as well. The film containing graphene can be formed, for example, by reducing a film containing graphene oxide. A semiconductor such as an oxide semiconductor containing an impurity element may be used as well. Alternatively, the conductive layers may be formed using a conductive paste of silver, carbon, copper, or the like or a conductive polymer such as polythiophene. A conductive paste is preferable because it is inexpensive. A conductive polymer is preferable because it is easily applied.

Then, an insulating layer 32 functioning as a gate insulating layer is formed. For the insulating layer 32, the inorganic insulating film that can be used for the inorganic insulating layer 31 can be used.

Then, the metal oxide layer 83 functioning as an oxide semiconductor layer is formed. The metal oxide layer 83 can be formed in the following manner: a metal oxide film is formed, a resist mask is formed, the metal oxide film is etched, and the resist mask is removed.

The metal oxide film preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the metal oxide film.

In the case where the metal oxide film is an In-M-Zn oxide, examples of the atomic ratio of metal elements of a sputtering target for forming a film of an In-M-Zn oxide are In:M:Zn=1:1:1, In:M:Zn=1:1:1.2, In:M:Zn=1:3:2, In:M:Zn=1:3:4, In:M:Zn=1:3:6, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, In:M:Zn=5:2:5, and the like.

A target containing a polycrystalline oxide is preferably used as the sputtering target, in which case the semiconductor layer having crystallinity is easily formed. Note that the atomic ratio between metal elements in the formed semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be formed is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

In the metal oxide film, the atomic proportion of In is preferably higher than that of M (e.g., Ga), in which case the transistor can have increased field-effect mobility. In the metal oxide film, the atomic proportion of M (e.g., Ga) is preferably higher than that of In, in which case oxygen vacancies are not easily formed.

The metal oxide layer 83 may include a plurality of metal oxide films that are stacked.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using one or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide film is preferably 2 eV or more, further preferably 2.5 eV or more, still further preferably 3 eV or more. With the use of a metal oxide film having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Then, an insulating layer 34 functioning as a gate insulating layer is formed over the metal oxide layer 83. For the insulating layer 34, the inorganic insulating film that can be used for the inorganic insulating layer 31 can be used.

Next, a conductive layer 85 functioning as a gate electrode is formed over the insulating layer 34. The conductive layer 85 can be formed in the following manner: a conductive film is formed, a resist mask is formed, the conductive film is etched, and then the resist mask is removed.

Next, an impurity element is supplied to the metal oxide layer 83 using the conductive layer 85 as a mask to form low-resistance regions 83n. In the metal oxide layer 83, the impurity element is not supplied to a region overlapping with the conductive layer 85 (a channel formation region 83i).

A plasma ion doping method or an ion implantation method can be suitably used for the supply of the impurity element. In these methods, the concentration profile in the depth direction can be controlled with high accuracy by the acceleration voltage and the dosage of ions, or the like. The use of a plasma ion doping method can increase productivity. When an ion implantation method using mass separation is employed, the purity of an impurity element to be supplied can be increased.

Examples of the impurity element include hydrogen, boron, carbon, nitrogen, fluorine, phosphorus, sulfur, arsenic, aluminum, magnesium, silicon, and a rare gas. As the impurity element, boron, phosphorus, aluminum, magnesium, or silicon is preferably used, and boron or phosphorus is further preferably used.

As a source gas of the impurity element, a gas containing any of the above impurity elements can be used. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used.

Besides, any of $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, and the like can be used as the source gas. The ion source is not limited to a gas, and a solid or a liquid may be vaporized by being heated.

Note that there is no limitation on the method for supplying the impurity element, and for example, plasma treatment, treatment using thermal diffusion by heating, or the like may be used. In the case of a plasma treatment method, an impurity element can be supplied in such a manner that plasma is generated in a gas atmosphere containing the impurity element to be supplied and plasma treatment is performed. A dry etching apparatus, an ashing apparatus, a plasma CVD apparatus, a high-density plasma CVD apparatus, or the like can be used as an apparatus for generating the plasma.

In one embodiment of the present invention, an impurity element can be supplied to the metal oxide layer 83 through the insulating layer 34. Owing to this, the crystallinity of the metal oxide layer 83 can be inhibited from decreasing at the time of supply of the impurity element. Therefore, this is particularly suitable for the case where a reduction in crystallinity increases the electric resistance.

Next, an inorganic insulating layer 36 that covers the metal oxide layer 83, the insulating layer 34, and the conductive layer 85 is formed. The inorganic insulating layer 36 can be formed by a method similar to that of the inorganic insulating layer 31.

Next, openings reaching the low-resistance regions 83n of the metal oxide layer 83 are formed in the insulating layer 34 and the inorganic insulating layer 36.

Then, a conductive layer 87a and a conductive layer 87b are formed. The conductive layer 87a and the conductive layer 87b can be formed in the following manner: a conductive film is formed, a resist mask is formed, the conductive film is etched, and the resist mask is removed. The conductive layer 87a and the conductive layer 87b are electrically connected to the low-resistance regions 83n of the metal oxide layer 83 through the openings provided in the insulating layer 34 and the inorganic insulating layer 36.

In the above manner, the transistor 80 can be fabricated (FIG. 4C).

Note that openings reaching the resin layer 13 are formed in the insulating layer 32, the insulating layer 34, and the insulating layer 36 (FIG. 4C). The openings are formed before the formation of the organic insulating layer 35, and can be formed during or after the fabrication of the transistor 80. Note that the openings may be formed in the plurality of layers at a time, or the openings may be formed layer by layer.

Figure 4D:
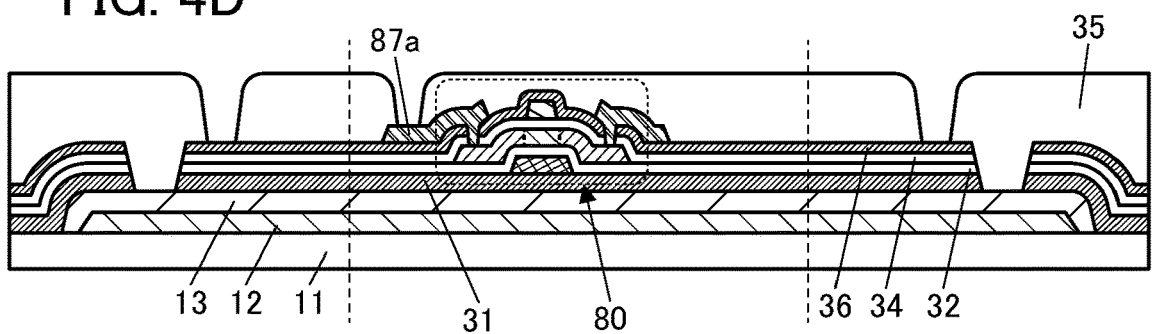

Next, the organic insulating layer 35 is formed over the inorganic insulating layer 36 and over the transistor 80 (FIG. 4D). The organic insulating layer 35 is a layer having the surface on which a light-emitting element is to be formed later, and thus preferably functions as a planarization layer.

Other examples of materials which can be used to form the organic insulating layer 35 include an acrylic resin, a polyimide resin, an epoxy resin, a polyamide resin, a polyimide-amide resin, a siloxane resin, a benzocyclobutene-based resin, a phenol resin, and precursors of these resins.

The organic insulating layer 35 is provided to fill the openings provided in the inorganic insulating layer 31, the insulating layer 32, the insulating layer 34, and the inorganic insulating layer 36, and is in contact with the resin layer 13 through the openings. The organic insulating layer 35 is formed to have, inward from the openings, openings reaching the inorganic insulating layer 36. Moreover, the organic insulating layer 35 is formed to have an opening reaching the conductive layer 87a.

Figure 4E:
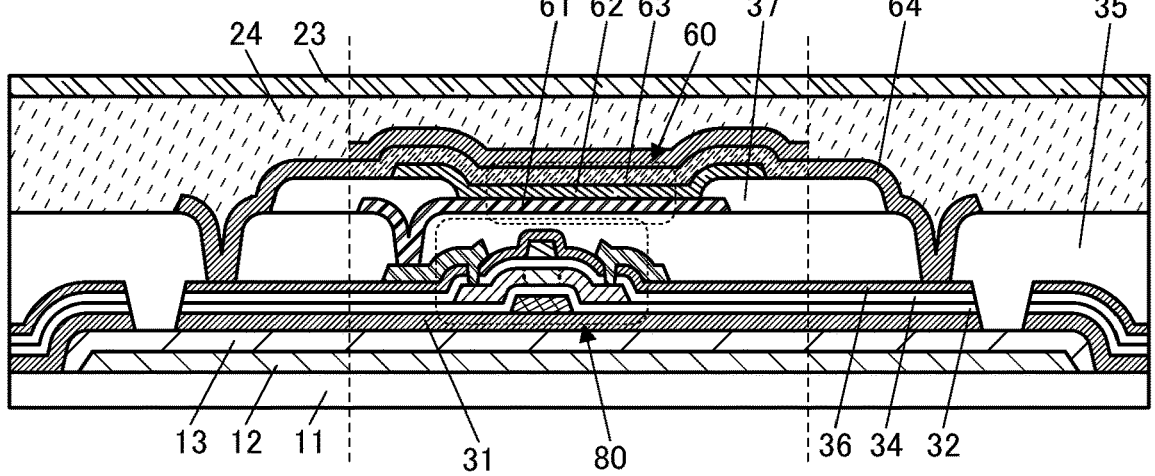

Next, the electrode 61 is formed (FIG. 4E). Part of the electrode 61 functions as a pixel electrode of the light-emitting element 60. The electrode 61 can be formed in the following manner: a conductive film is formed, a resist mask is formed, the conductive film is etched, and then the resist mask is removed. The electrode 61 is electrically connected to the conductive layer 87a through the opening provided in the organic insulating layer 35.

Next, the partition walls 37 covering end portions of the electrode 61 are formed. The partition wall 37 may be formed by using either an inorganic material or an organic material. For example, the inorganic insulating film that can be used for the inorganic insulating layer 31 can be used. Furthermore, the material that can be used for the organic insulating layer 35 can be used.

Then, the EL layer 62 and the electrode 63 are formed (FIG. 4E). Part of the electrode 63 functions as a common electrode of the light-emitting element 60.

The EL layer 62 includes at least a light-emitting layer. In addition to the light-emitting layer, the EL layer 62 may further include a layer containing a substance with a high hole-injection property, a layer containing a substance with a high hole-transport property, a layer containing a hole-blocking material, a layer containing a substance with a high electron-transport property, a layer containing a substance with a high electron-injection property, a layer containing a substance with a bipolar property (a substance with a high electron- and hole-transport property), or the like.

Either a low molecular compound or a high molecular compound can be used for the EL layer 62, and an inorganic compound may also be contained.

The EL layer 62 can be formed by an evaporation method, a coating method, a printing method, a discharge method, or the like. In the case where the EL layer 62 is formed for each individual pixel, it can be formed by an evaporation method using a shadow mask such as a metal mask, an ink-jet method, or the like. In the case where the EL layer 62 is not formed for each individual pixel, an evaporation method not using a metal mask can be used.

The electrode 63 can be formed by an evaporation method, a sputtering method, or the like.

The electrode 63 is formed at a temperature that is lower than or equal to the upper temperature limit of the resin layer 13 and lower than or equal to the upper temperature limit of the EL layer 62.

In the above manner, the light-emitting element 60 can be formed (FIG. 4E).

Next, the inorganic insulating layer 64 is formed to cover the electrode 63 (FIG. 4E). The light-emitting element 60 is sealed with the inorganic insulating layer 64. After the electrode 63 is formed, the inorganic insulating layer 64 is preferably formed without exposure to the air.

The inorganic insulating layer 64 functions as a protective layer that prevents diffusion of impurities such as water into the light-emitting element 60. The protective layer can have a single-layer structure or a stacked-layer structure. The protective layer can have a structure including the inorganic insulating layer 64, a structure including two or more layers including the inorganic insulating layer 64, or a structure including two or more layers including the inorganic insulating layer 64 and an organic insulating film, for example.

The inorganic insulating layer 64 is connected to the inorganic insulating layer 36 through the openings provided in the organic insulating layer 35. Thus, top surfaces, side surfaces, and bottom surfaces of the transistor 80 (the metal oxide layer 83) and the light-emitting element 60 can be surrounded by a plurality of inorganic insulating layers (e.g., the inorganic insulating layer 31, the inorganic insulating layer 36, and the inorganic insulating layer 64). Accordingly, entry of impurities into the transistor 80 and the light-emitting element 60 can be suppressed, and thus the reliability of the transistor 80 and the light-emitting element 60 can be increased.

For the inorganic insulating layer 64, the inorganic insulating film that can be used for the inorganic insulating layer 31 can be used.

The inorganic insulating layer 64 can be formed by a PECVD method, an ALD method, a sputtering method, or the like.

Next, the inorganic insulating layer 64 and the substrate 23 are bonded to each other with the adhesive layer 24 (FIG. 4E).

For the adhesive layer 24, a variety of curable adhesives such as a reactive curable adhesive, a thermosetting adhesive, an anaerobic adhesive, and a photocurable adhesive such as an ultraviolet curable adhesive can be used. An adhesive sheet or the like may be used.

Since the substrate 23 is positioned on the side where light from the light-emitting element 60 is extracted, a material having a high visible-light-transmitting property is preferably used. A film is preferably used as the substrate 23; particularly, the use of a resin film is preferable. In that case, the light-emitting device can be reduced in weight and thickness. Furthermore, the light-emitting device using a film substrate is less likely to be broken than that in the case of using glass, a metal, or the like. In addition, the light-emitting device can have higher flexibility.

For the substrate 23, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used as the substrate 23.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display device might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

Alternatively, a circularly polarizing plate may be used as the substrate of the display device.

Figure 5A:
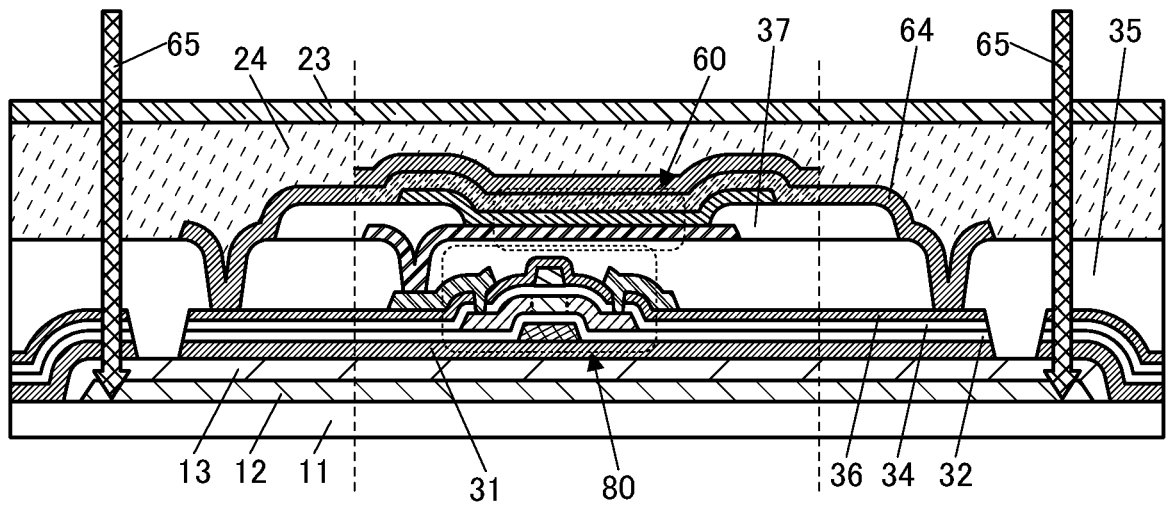
FIG. 5A and FIG. 5B are cross-sectional views showing an example of a method for manufacturing a light-emitting device.

Next, a separation starting point is formed. In FIG. 5A, an example is shown in which a sharp instrument 65, e.g., a knife, is inserted from the substrate 23 side into a portion located inward from the end portion of the resin layer 13 to make a cut. The cut is preferably formed to have a frame-like shape.

Alternatively, a separation starting point may be formed by laser light irradiation on part or the whole of the resin layer 13 from the support substrate 11 side.

Figure 5B:
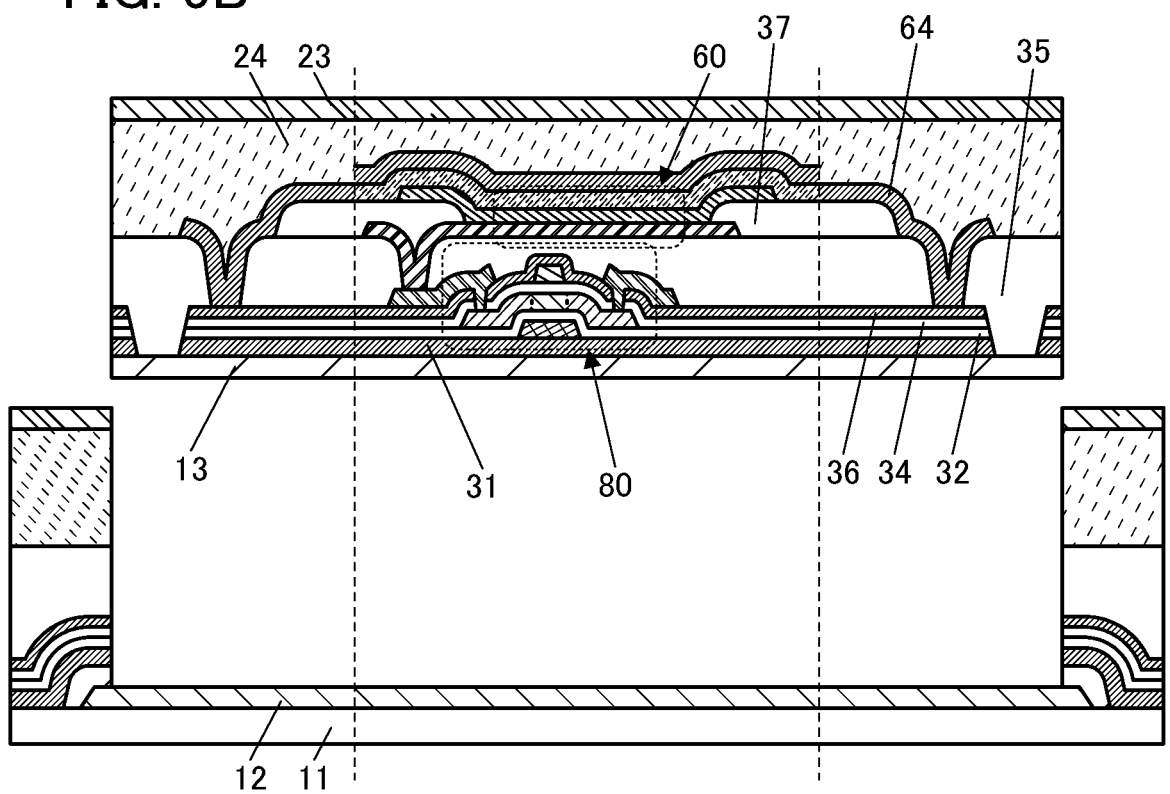

Next, from the separation starting point, the metal oxide layer 12 and the resin layer 13 are separated from each other (FIG. 5B).

The support substrate 11 and the resin layer 13 can be separated from each other by applying a perpendicular tensile force to the resin layer 13, for example. Specifically, part of a top surface of the substrate 23 is suctioned and pulled up, whereby the resin layer 13 can be peeled from the support substrate 11.

Here, if the separation is performed in such a manner that a water-containing liquid such as water or an aqueous solution is added to the separation interface and the liquid penetrates into the separation interface, the ease of the separation can be enhanced. Furthermore, an adverse effect of static electricity caused during the separation on the functional element such as a transistor (e.g., breakage of a semiconductor element by static electricity) can be suppressed.

As the liquid to be fed, water (preferably pure water), a neutral, alkaline, or acidic aqueous solution, and an aqueous solution in which a salt is dissolved can be given. In addition, ethanol, acetone, and the like can be given. Furthermore, a variety of organic solvents may also be used.

Figure 6A:
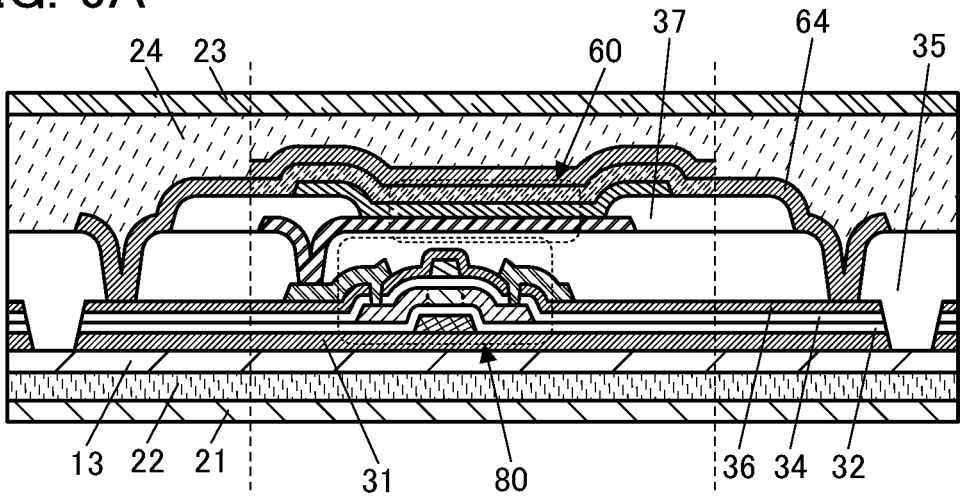
FIG. 6A to FIG. 6C are cross-sectional views showing an example of a method for manufacturing a light-emitting device.

After that, the substrate 21 is bonded to the exposed resin layer 13 with the adhesive layer 22 (FIG. 6A). Accordingly, the transistor 80, the light-emitting element 60, and the like formed over the support substrate 11 can be transferred from the support substrate 11 to the substrate 23.

Note that the resin layer 13 may be removed, an oxide insulating layer 15 may be exposed, and the oxide insulating layer 15 and the substrate 21 may be bonded to each other. The resin layer 13 can be removed by ashing or the like. By removing the resin layer 13, the thickness and weight of the light-emitting device can be reduced.

For the adhesive layer 22, the material that can be used for the adhesive layer 24 can be used.

For the substrate 21, the material that can be used for the substrate 23 can be used. For the substrate 21, a variety of materials such as glass, quartz, a resin, a metal, an alloy, and a semiconductor that are thin enough to be flexible can be used.

Figure 6B:
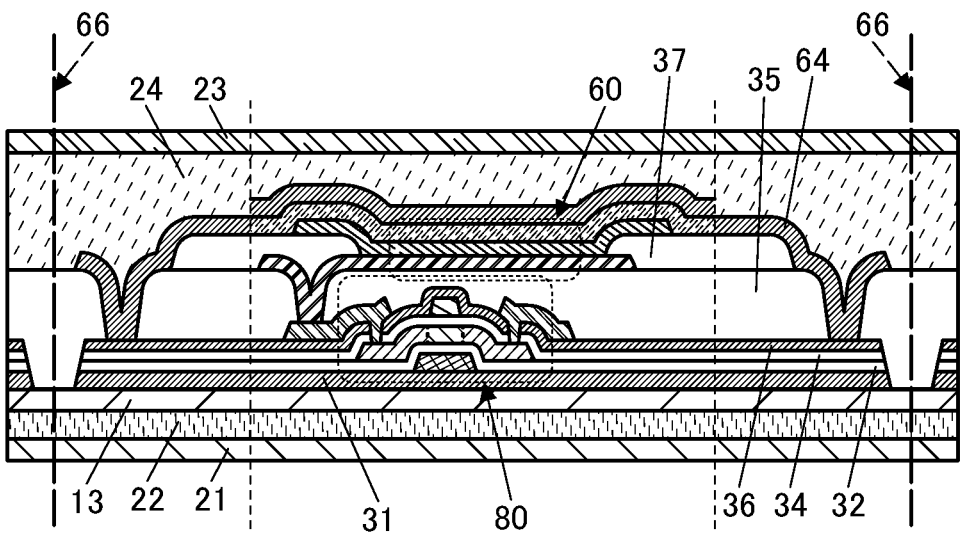
Figure 6C:
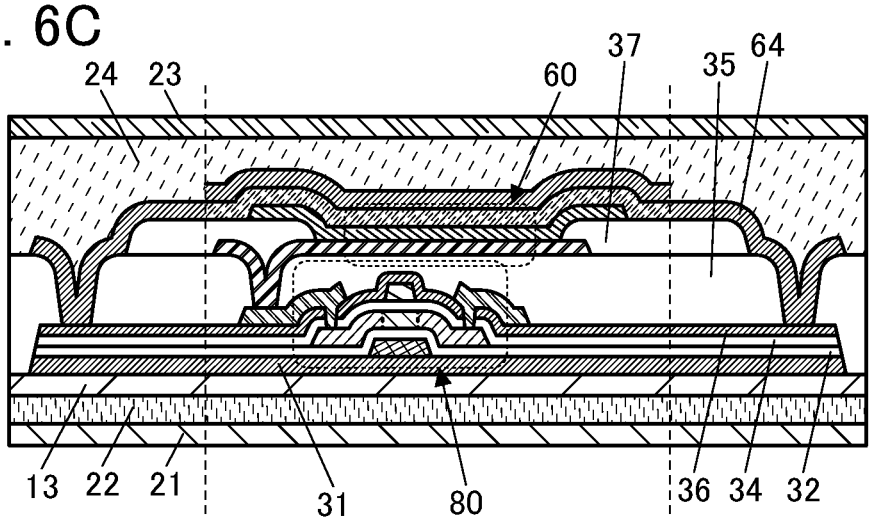

Then, outline processing is performed on the light-emitting device, whereby the light-emitting device can be manufactured (FIG. 6B and FIG. 6C). Dividing is performed so that the dividing lines 66 overlap with the openings provided in the inorganic insulating layer 31, the insulating layer 32, the insulating layer 34, and the inorganic insulating layer 36 as illustrated in FIG. 6B. In other words, an inorganic film is not provided at the dividing positions. Thus, generation of a microcrack inside the light-emitting device due to dividing can be suppressed. Furthermore, even when the light-emitting device is held in a bent state for a long time or repeatedly bent, generation and development of a crack can be suppressed.

Although an organic film is mainly exposed on a side surface of the light-emitting device illustrated in FIG. 6C, the top surfaces, side surfaces, and bottom surfaces of the transistor 80 (the metal oxide layer 83) and the light-emitting element 60 are surrounded by a plurality of inorganic insulating layers (e.g., the inorganic insulating layer 31, the inorganic insulating layer 36, and the inorganic insulating layer 64). Accordingly, entry of impurities into the transistor 80 and the light-emitting element 60 can be suppressed, and thus the reliability of the transistor 80 and the light-emitting element 60 can be increased.

Modification Example 1

Modification example 1 is described with reference to FIG. 7. Although the metal oxide layer 12 is formed as a base layer between the support substrate 11 and the resin layer 13 in Manufacturing method example 1, the base layer is not necessarily provided.

Figure 7A:
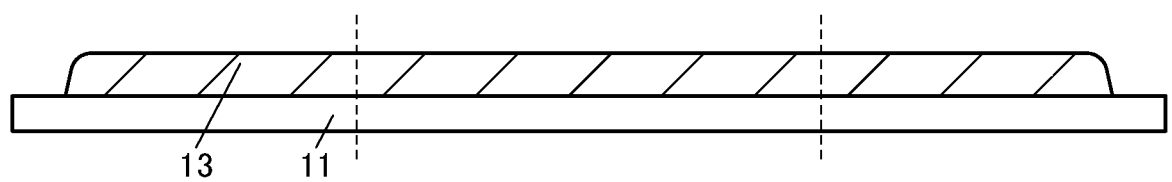
FIG. 7A and FIG. 7B are cross-sectional views showing an example of a method for manufacturing a light-emitting device.

As illustrated in FIG. 7A, the resin layer 13 may be directly formed over the support substrate 11 (without the base layer therebetween). Then, as illustrated in FIG. 7B, a stacked-layer structure from the inorganic insulating layer 31 to the substrate 23 is formed over the resin layer 13.

Even in the case where the resin layer 13 is formed directly over the support substrate 11, the support substrate 11 and the substrate 23 can be separated from each other by at least one of the heat treatment in an oxygen-containing atmosphere at the time of forming the resin layer 13 and the laser light irradiation on the resin layer 13. In this case, separation occurs at the interface between the support substrate 11 and the resin layer 13 or in the resin layer 13.

Figure 7B:
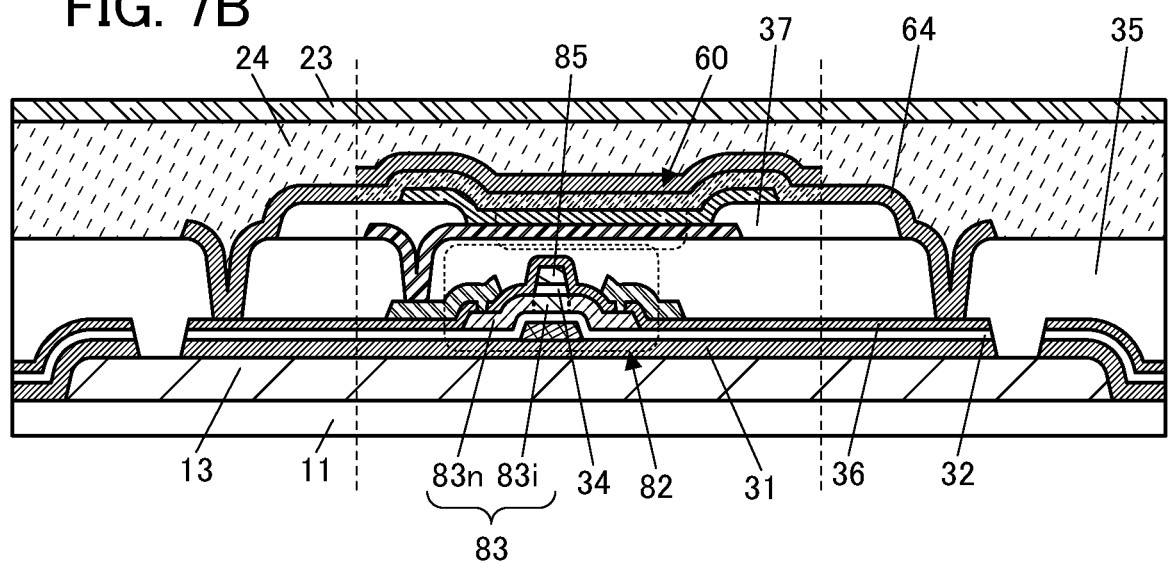

FIG. 7B shows an example in which the insulating layer 34 functioning as a gate insulating layer of the transistor 80 is positioned only between the conductive layer 85 and the metal oxide layer 83. The insulating layer 34 may be processed into an island shape using the conductive layer 85 as a mask.

At this time, the inorganic insulating layer 36 preferably contains hydrogen. Hydrogen contained in the inorganic insulating layer 36 is diffused into regions of the metal oxide layer 83 that are in contact with the inorganic insulating layer 36, whereby the resistance of the regions is reduced and thus the low-resistance regions 83n can be formed. In the case where the low-resistance regions 83n are formed using the insulating layer 36, the addition of the impurity element is unnecessary, which may reduce the number of fabrication steps of the transistor 80.

Manufacturing Method Example 2

Manufacturing method example 2 of the light-emitting device will be explained with reference to FIG. 8 to FIG. 10.

Figure 8A:
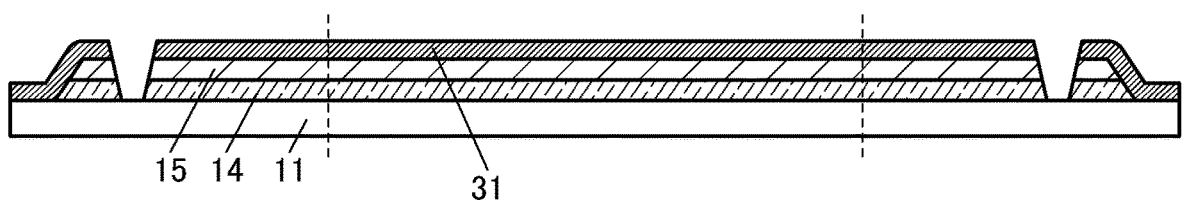
FIG. 8A to FIG. 8D are cross-sectional views showing an example of a method for manufacturing a light-emitting device.

First, an island-shaped metal layer 14 is formed over the support substrate 11 and surface treatment is performed on the metal layer 14, and then an island-shaped oxide insulating layer 15 is formed, and the inorganic insulating layer 31 is formed over the support substrate 11 and over the oxide insulating layer 15 (FIG. 8A).

It is preferable that the metal layer 14 and the oxide insulating layer 15 be provided to have an island shape and the inorganic insulating layer 31 be provided to cover end portions of the island-shaped metal layer 14 and the island-shaped oxide insulating layer 15. When the metal layer 14 and the oxide insulating layer 15 are provided over the entire surface of the support substrate 11, the oxide insulating layer 15 is separated unintentionally from the metal layer 14 in some cases. In view of the above, a region in contact with the inorganic insulating layer 31 is preferably provided over the support substrate 11. This suppresses unintended separation of the oxide insulating layer 15 from the metal layer 14. The formation of a separation starting point enables control of separation timing and enables the metal layer 14 and the oxide insulating layer 15 to be separated from each other at desired timing.

As the material used for the metal layer 14, a metal containing an element selected from tungsten (W), molybdenum (Mo), titanium, tantalum, niobium, nickel, cobalt, zirconium, zinc, ruthenium, rhodium, palladium, osmium, iridium, and silicon, an alloy containing the element, a compound containing the element, and the like are given.

In the case where the metal layer 14 has a single-layer structure, a tungsten layer, a molybdenum layer, or a layer containing a mixture of tungsten and molybdenum is preferably formed. Note that a mixture of tungsten and molybdenum corresponds to an alloy of tungsten and molybdenum, for example. An alloy film of molybdenum and tungsten with Mo:W=3:1, 1:1, 1:3 (each of which is an atomic ratio), or the like may be used, for example. In addition, the alloy film of molybdenum and tungsten can be formed by a sputtering method using a metal target with a composition of Mo:W=49:51, 61:39, or 14.8:85.2 (each of which is wt %), for example.

The metal layer 14 can be formed by, for example, a sputtering method, a CVD method (e.g., a plasma CVD method, a thermal CVD method, or an MOCVD method), an ALD method, a coating method (including a spin coating method, a droplet discharge method, a dispensing method, and the like), a printing method, or an evaporation method.

The thickness of the metal layer 14 is greater than or equal to 1 nm and less than or equal to 1000 nm, preferably greater than or equal to 10 nm and less than or equal to 200 nm, more preferably greater than or equal to 10 nm and less than or equal to 100 nm.

Plasma treatment is preferably performed on a surface of the metal layer 14 as the surface treatment on the metal layer 14. The adhesion between the metal layer 14 and the oxide insulating layer 15 can be controlled by changing the surface condition of the metal layer 14.

The plasma treatment is preferably performed in an atmosphere containing nitrous oxide. Thus, the surface of the metal layer 14 is oxidized, and an oxide layer (not illustrated) of a material contained in the metal layer 14 can be formed over the metal layer 14.

The plasma treatment is preferably performed in an atmosphere containing nitrous oxide and silane. By this method, a very thin oxide layer can be formed. The oxide layer may be a film that is thin enough not to be easily observed in cross-sectional observation with an electron microscope or the like. When the oxide layer is very thin, a change in characteristics of the semiconductor element can be suppressed. Moreover, even when the oxide layer is positioned on the side where light from the light-emitting element is extracted, a decrease in light extraction efficiency of the light-emitting device can be suppressed. Note that disilane or trisilane may be used instead of silane.

When plasma treatment is performed in the atmosphere containing nitrous oxide and silane, a film (for example, a silicon oxynitride film or a silicon nitride oxide film) is formed over the metal layer 14 by silane at the same time as the surface of the metal layer 14 is oxidized by nitrous oxide. For example, during the plasma treatment, an insulating layer with a thickness of greater than or equal to 1 nm and less than or equal to 20 nm may be formed. In the case where the insulating layer is formed over the metal layer 14 during the plasma treatment, progress of oxidization of the metal layer 14 can be controlled. Thus, a thin oxide layer can be formed over the metal layer 14.

The metal layer 14 preferably contains tungsten, titanium, or molybdenum, and the oxide layer formed by plasma treatment preferably contains tungsten oxide, titanium oxide, or molybdenum oxide.

Tungsten oxide is generally represented by $WO_x$ ($2 \leq x < 3$) and also exists as a non-stoichiometric compound which can have a variety of compositions, typically $WO_3$, $W_2O_5$, $W_4O_{11}$, and $WO_2$. Titanium oxide and molybdenum oxide also exist as non-stoichiometric compounds.

The oxide layer at this stage is preferably in a state where a large amount of oxygen is contained. For example, in the case where tungsten is used for the metal layer 14, the oxide layer is preferably tungsten oxide containing $WO_3$ as its main component.

As the oxide insulating layer 15, a silicon oxide film, a silicon nitride film, a silicon oxynitride film, or a silicon nitride oxide film can be used, for example. The oxide insulating layer 15 preferably contains oxygen, nitrogen, and silicon.

The oxide insulating layer 15 preferably further contains hydrogen. The oxide insulating layer 15 preferably has a function of releasing hydrogen in a later heating step. Furthermore, the oxide insulating layer 15 may have a function of releasing hydrogen and nitrogen in a later heating step.

The oxide insulating layer 15 preferably includes a region where a hydrogen concentration, which is detected by SIMS, is greater than or equal to $1.0 \times 10^{20}$ atoms/cm$^3$ and less than or equal to $1.0 \times 10^{22}$ atoms/cm$^3$, more preferably greater than or equal to $5.0 \times 10^{20}$ atoms/cm$^3$ and less than or equal to $5.0 \times 10^{21}$ atoms/cm$^3$.

The oxide insulating layer 15 preferably includes a region where a nitrogen concentration, which is detected by SIMS, is greater than or equal to $5.0 \times 10^{20}$ atoms/cm$^3$ and less than or equal to $1.0 \times 10^{23}$ atoms/cm$^3$, more preferably greater than or equal to $1.0 \times 10^{21}$ atoms/cm$^3$ and less than or equal to $5.0 \times 10^{22}$ atoms/cm$^3$.

The oxide insulating layer 15 can be formed by a film formation method such as a sputtering method or a plasma CVD method. In particular, the silicon oxynitride film included in the oxide insulating layer 15 is preferably formed by a plasma CVD method using a deposition gas containing a silane gas and a nitrous oxide gas, in which case a large amount of hydrogen and nitrogen can be contained in the film. In addition, the proportion of the silane gas in the deposition gas is preferably higher, in which case the amount of released hydrogen in a later heating step is increased.

The thickness of the oxide insulating layer 15 is preferably larger because the amount of released hydrogen and nitrogen is increased; however, the thickness is preferably determined in consideration of productivity. The thickness of the oxide insulating layer 15 is preferably greater than or equal to 1 nm and less than or equal to 1 μm, more preferably greater than or equal to 50 nm and less than or equal to 800 nm, still more preferably greater than or equal to 100 nm and less than or equal to 400 nm, particularly preferably greater than or equal to 100 nm and less than or equal to 200 nm.

The description in Manufacturing method example 1 can be referred to for the material of the inorganic insulating layer 31. For example, a silicon nitride film, a silicon oxynitride film, a silicon nitride oxide film, an aluminum nitride film, an aluminum oxide film, an aluminum oxynitride film, or an aluminum nitride oxide film can be used as the inorganic insulating layer 31.

The inorganic insulating layer 31 preferably contains nitrogen and silicon. As the inorganic insulating layer 31, a silicon nitride film, a silicon oxynitride film, or a silicon nitride oxide film is preferably used, and in particular, a silicon nitride film or a silicon nitride oxide film is preferably used.

The inorganic insulating layer 31 preferably has a function of blocking hydrogen (and nitrogen) released from the oxide insulating layer 15 in a later heating step.

The inorganic insulating layer 31 can be formed by a film formation method such as a sputtering method or a plasma CVD method. A silicon nitride film included in the inorganic insulating layer 31 is formed by a plasma CVD method using a deposition gas containing a silane gas, a nitrogen gas, and an ammonia gas, for example.

There are no particular limitations on the thickness of the inorganic insulating layer 31. The thickness is, for example, greater than or equal to 50 nm and less than or equal to 600 nm, preferably greater than or equal to 100 nm and less than or equal to 300 nm.

After the formation of the inorganic insulating layer 31, heat treatment is performed on the metal layer 14 and the oxide insulating layer 15. By the heat treatment, hydrogen (and nitrogen) is released from the oxide insulating layer 15 to be supplied to the oxide layer. At this time, the inorganic insulating layer 31 blocks released hydrogen (and nitrogen); thus, hydrogen (and nitrogen) can be efficiently supplied to the oxide layer.

The heat treatment is performed at temperatures higher than or equal to the temperature at which hydrogen (and nitrogen) is detached from the oxide insulating layer 15 and lower than or equal to the temperature at which the support substrate 11 is softened. Moreover, heating is preferably performed at temperatures higher than or equal to the temperature at which the reduction reaction of the metal oxide with hydrogen occurs. The higher the temperature of the heat treatment is, the larger the amount of the detached hydrogen (and nitrogen) from the oxide insulating layer 15 is, so that subsequent separability can be improved. Note that depending on heating time and heating temperature, the separability may be so high so that separation may occur at an unintended timing. Thus, in the case where tungsten is used for the metal layer 14, heating is performed at temperatures higher than or equal to 300° C. and lower than 700° C., preferably higher than or equal to 400° C. and lower than 650° C., more preferably higher than or equal to 400° C. and lower than or equal to 500° C.

The atmosphere in which the heat treatment is performed is not particularly limited and may be an air atmosphere, but it is preferably performed in an inert gas atmosphere such as nitrogen or a rare gas.

The heat treatment can be performed before, during, or after the fabrication of the transistor. The heat treatment during the fabrication process of the transistor may double as this heat treatment.

Next, openings reaching the support substrate 11 are formed in the metal layer 14, the oxide insulating layer 15, and the inorganic insulating layer 31 (FIG. 8A). The step of forming the openings is performed before the formation of the organic insulating layer 35, and can be performed before, during, or after the fabrication of the transistor 80.

Figure 8B:
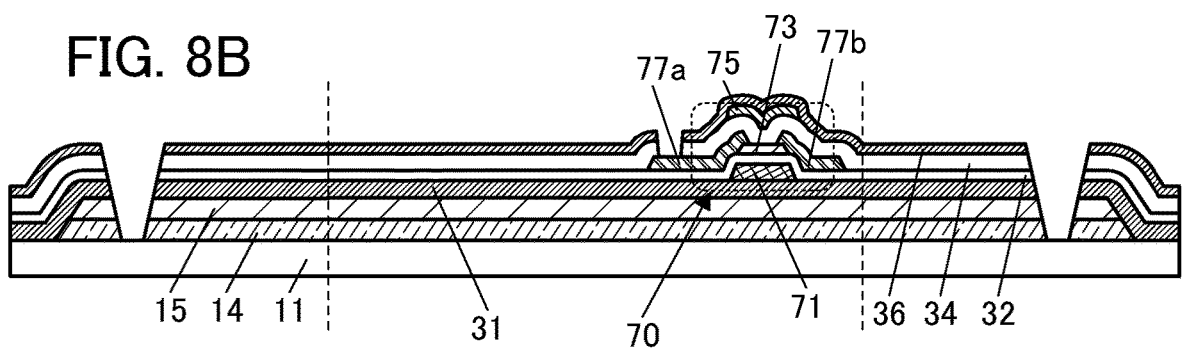

Next, a transistor 70 is formed over the inorganic insulating layer 31 (FIG. 8B).

Here, the case where a transistor including a metal oxide layer 73 and two gates is fabricated as the transistor 70 is shown.

Specifically, first, a conductive layer 71 functioning as a gate electrode is formed over the inorganic insulating layer 31. The conductive layer 71 can be formed in the following manner: a conductive film is formed, a resist mask is formed, the conductive film is etched, and the resist mask is removed.

Then, an insulating layer 32 functioning as a gate insulating layer is formed. For the insulating layer 32, the inorganic insulating film that can be used for the inorganic insulating layer 31 can be used.

Then, the metal oxide layer 73 is formed. The metal oxide layer 73 can be formed in the following manner: a metal oxide film is formed, a resist mask is formed, the metal oxide film is etched, and the resist mask is removed. For the metal oxide layer 73, the material that can be used for the metal oxide layer 83 can be used.

Then, a conductive layer 77a and a conductive layer 77b are formed. The conductive layer 77a and the conductive layer 77b can be formed in the following manner: a conductive film is formed, a resist mask is formed, the conductive film is etched, and the resist mask is removed. The conductive layer 77a and the conductive layer 77b are each electrically connected to the metal oxide layer 73.

Note that during the processing of the conductive layer 77a and the conductive layer 77b, part of the metal oxide layer 73 not covered with the resist mask might be etched to be thin.

Then, the insulating layer 34 functioning as a gate insulating layer is formed. For the insulating layer 34, the inorganic insulating film that can be used for the inorganic insulating layer 31 can be used.

Next, a conductive layer 75 functioning as a gate electrode is formed over the insulating layer 34. The conductive layer 75 can be formed in the following manner: a conductive film is formed, a resist mask is formed, the conductive film is etched, and then the resist mask is removed.

In the above manner, the transistor 70 can be fabricated (FIG. 8B).

Next, the inorganic insulating layer 36 that covers the metal oxide layer 73, the insulating layer 34, and the conductive layer 75 is formed. The inorganic insulating layer 36 can be formed by a method similar to that of the inorganic insulating layer 31.

Note that openings reaching the support substrate 11 are formed in the insulating layer 32, the insulating layer 34, and the insulating layer 36 (FIG. 8B). The openings are formed before the formation of the organic insulating layer 35, and can be formed during or after the fabrication of the transistor 70. Note that the openings may be formed in the plurality of layers at a time, or the openings may be formed layer by layer.

Figure 8C:
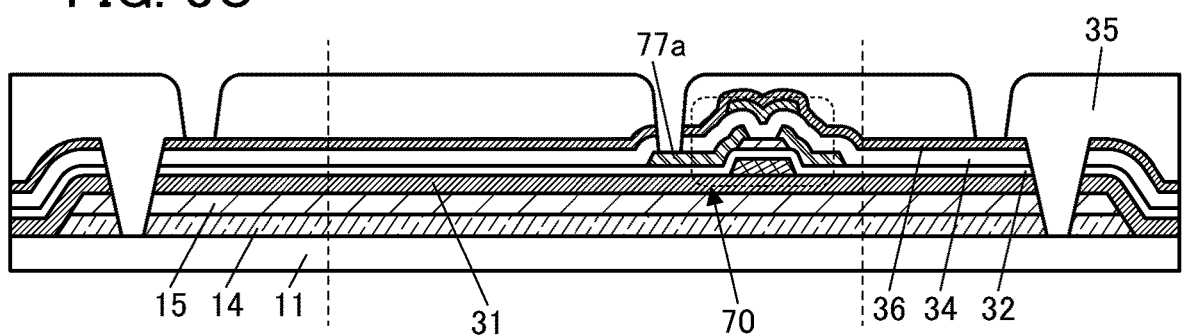

Next, the organic insulating layer 35 is formed over the support substrate 11, over the inorganic insulating layer 36, and over the transistor 70 (FIG. 8C). The description in Manufacturing method example 1 can be referred to for the material of the organic insulating layer 35.

The organic insulating layer 35 is provided to fill the openings provided in the metal layer 14, the oxide insulating layer 15, the inorganic insulating layer 31, the insulating layer 32, the insulating layer 34, and the inorganic insulating layer 36, and is in contact with the support substrate 11 through the openings. The organic insulating layer 35 is formed to have, inward from the openings, openings reaching the inorganic insulating layer 36. Moreover, the organic insulating layer 35 is formed to have an opening reaching the conductive layer 87a.

Figure 8D:
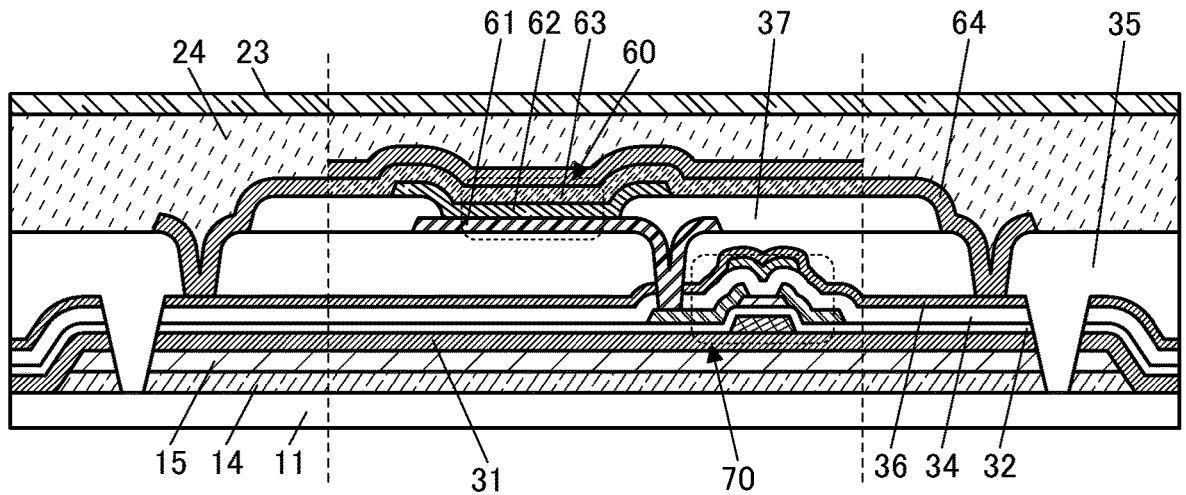

Next, as in Manufacturing method example 1, the stacked-layer structure from the electrode 61 to the substrate 23 is formed (FIG. 8D).

This Manufacturing method example 2 shows an example in which a light-emitting device having a bottom-emission structure is manufactured. A light-emitting region of the light-emitting element 60 is provided in a position not overlapping with the transistor 70. The light-emitting element 60 is an electroluminescent element that emits light to the organic insulating layer 35 side.

Figure 9A:
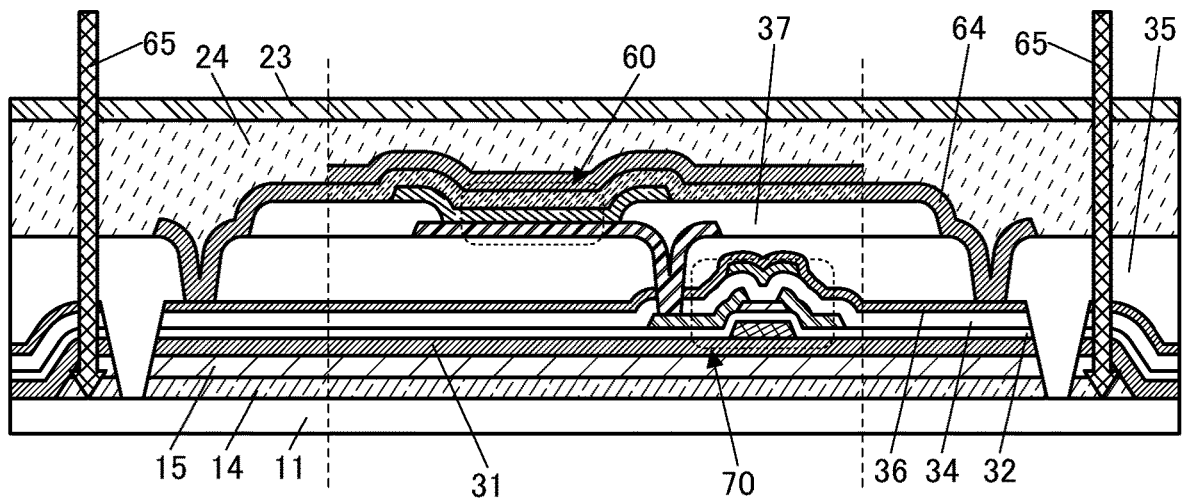
FIG. 9A and FIG. 9B are cross-sectional views showing an example of a method for manufacturing a light-emitting device.
Figure 9B:
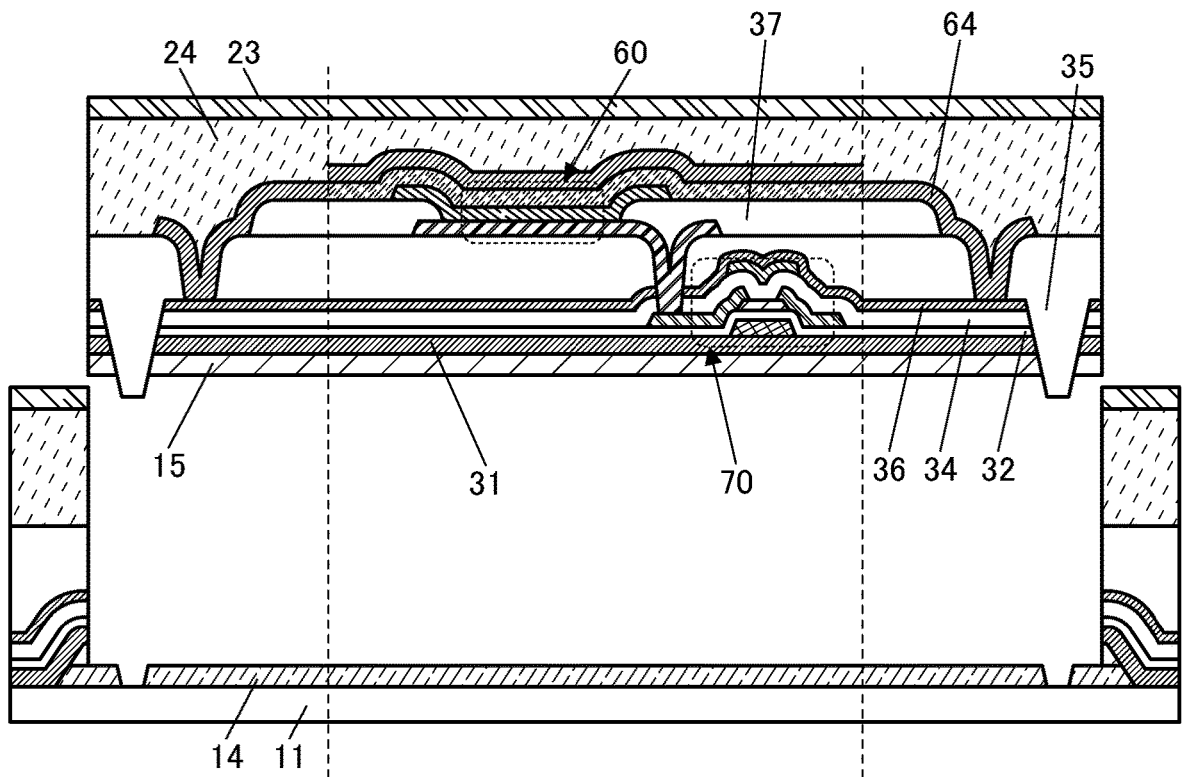

Next, a separation starting point is formed (FIG. 9A), and the metal layer 14 and the oxide insulating layer 15 are separated from each other (FIG. 9B).

In FIG. 9A, an example is shown in which the sharp instrument 65, e.g., a knife, is inserted from the substrate 23 side into a portion located inward from the end portion of the metal layer 14 to make a cut. The cut is preferably formed to have a frame-like shape.

Separation mainly occurs in the oxide layer positioned between the metal layer 14 and the oxide insulating layer 15 and at the interface between the oxide layer and the oxide insulating layer 15.

Here, separation occurs at the interface between the support substrate 11 and the organic insulating layer 35 in a region where the organic insulating layer 35 and the support substrate 11 are in contact with each other. For example, laser light irradiation along the region reduces the adhesion between the support substrate 11 and the organic insulating layer 35, whereby separation can occur at the interface between the support substrate 11 and the organic insulating layer 35.

Figure 10A:
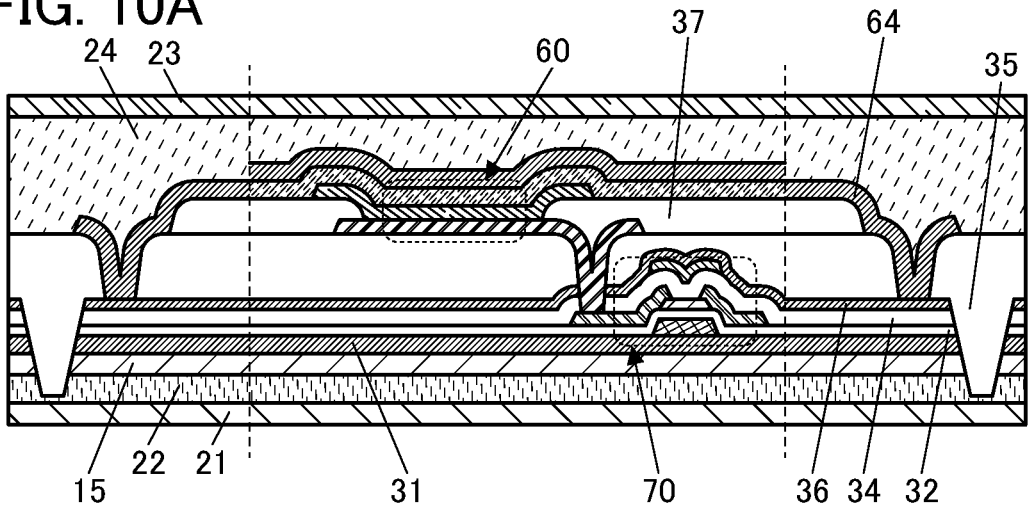
FIG. 10A to FIG. 10C are cross-sectional views showing an example of a method for manufacturing a light-emitting device.

After that, the substrate 21 is bonded to the exposed oxide insulating layer 15 and the exposed organic insulating layer 35 with the adhesive layer 22 (FIG. 10A). Accordingly, the transistor 70, the light-emitting element 60, and the like formed over the support substrate 11 can be transferred from the support substrate 11 to the substrate 23.

Note that due to different separation interfaces, a surface exposed by the separation may be uneven. The adhesive layer 22 is preferably formed using a liquid adhesive, in which case the uneven surface can be flat compared to the case of using a sheet-like adhesive. Thus, the light-emitting device can have a uniform thickness.

For the materials of the adhesive layer 22 and the substrate 21, the description in Manufacturing method example 1 can be referred to.

Figure 10B:
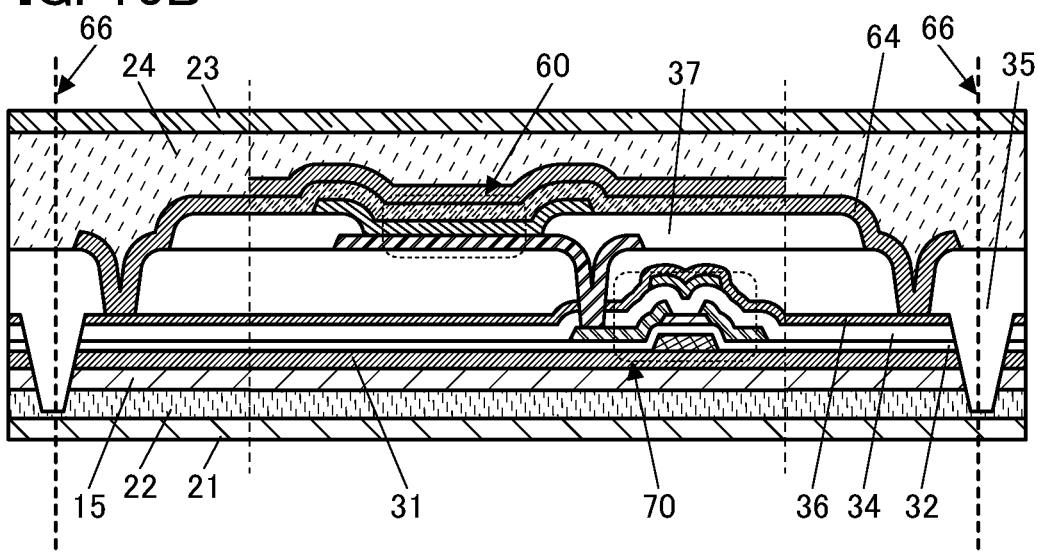
Figure 10C:
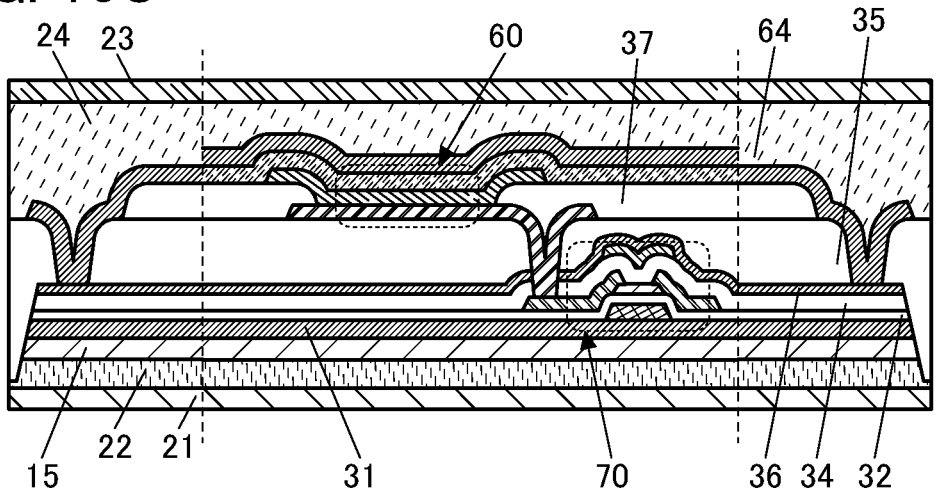

Then, outline processing is performed on the light-emitting device, whereby the light-emitting device can be manufactured (FIG. 10B and FIG. 10C). Dividing is performed so that the dividing lines 66 overlap with the openings provided in the oxide insulating layer 15, the inorganic insulating layer 31, the insulating layer 32, the insulating layer 34, and the inorganic insulating layer 36 as illustrated in FIG. 10B. An inorganic film is not provided at the dividing positions. Thus, generation of a microcrack inside the light-emitting device due to dividing can be suppressed. Furthermore, even when the light-emitting device is held in a bent state for a long time or repeatedly bent, generation and development of a crack can be suppressed.

Although an organic film is mainly exposed on a side surface of the light-emitting device illustrated in FIG. 10C, the top surfaces, side surfaces, and bottom surfaces of the transistor 70 and the light-emitting element 60 are surrounded by a plurality of inorganic insulating layers (e.g., the inorganic insulating layer 31, the inorganic insulating layer 36, and the inorganic insulating layer 64). Accordingly, entry of impurities into the transistor 70 and the light-emitting element 60 can be suppressed, and thus the reliability of the transistor 70 and the light-emitting element 60 can be increased.

Modification Example 2

Modification example 2 is described with reference to FIG. 11. Although the organic insulating layer 35 is formed to fill the openings provided in the stacked-layer structure from the metal layer 14 to the inorganic insulating layer 36 in Manufacturing method example 2, the organic insulating layer 39 which fills the openings may be provided over the inorganic insulating layer 36 before the organic insulating layer 35 is provided. Thus, separation occurs not at the interface between the support substrate 11 and the organic insulating layer 35 but at the interface between the support substrate 11 and the organic insulating layer 39. It is preferable that the organic insulating layer 39 be provided only at a dividing portion and the vicinity thereof and not provided in a light-emitting portion, a circuit, an external connection terminal, a wiring portion, and the like.

In order to cause separation at the interface between the substrate 11 and the organic insulating layer 35, at least one of the heat treatment in an oxygen-containing atmosphere at the time of forming the organic insulating layer 35 and the laser light irradiation on the organic insulating layer 35 is preferably performed. However, the organic insulating layer 35 might be damaged when a high temperature is applied thereto, which might decrease the reliability of the light-emitting device. Provision of another organic insulating layer 39 can inhibit the organic insulating layer 35 from being damaged. Moreover, when a material is changed between the organic insulating layer 35 and the organic insulating layer 39, layers suitable for the respective functions can be formed. For example, it is preferable that an acrylic resin be used for the organic insulating layer 35 and a polyimide resin be used for the organic insulating layer 39. Accordingly, the organic insulating layer 35 having a high planarization function and the organic insulating layer 35 having high separability can be formed.

Figure 11A:
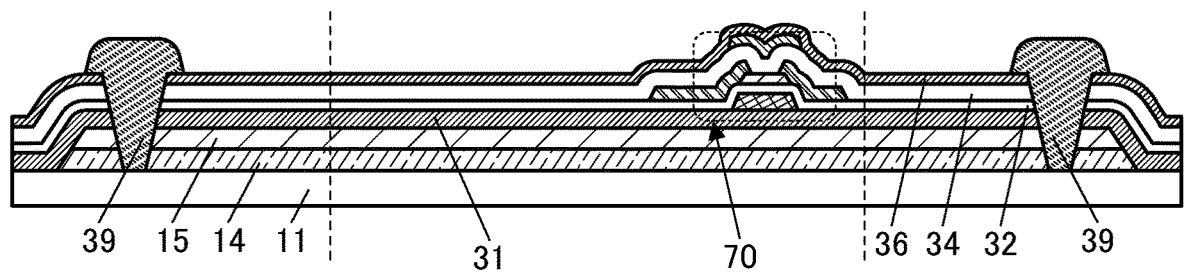
FIG. 11A and FIG. 11B are cross-sectional views showing an example of a method for manufacturing a light-emitting device.
Figure 11B:
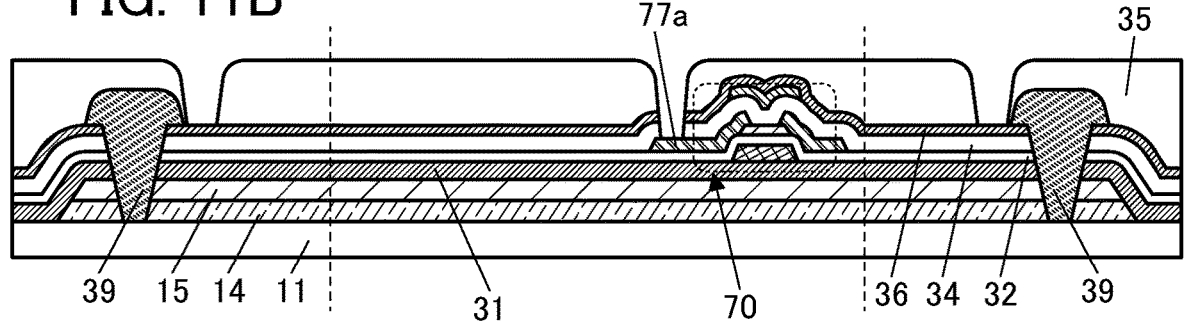

Specifically, the stacked-layer structure illustrated in FIG. 8B is formed as in Manufacturing method example 2, and the organic insulating layers 39 are formed to fill the openings provided in the stacked-layer structure from the metal layer 14 to the inorganic insulating layer 36 (FIG. 11A). After that, the organic insulating layer 35 is formed over the inorganic insulating layer 36 and over the organic insulating layers 39 (FIG. 11B).

The organic insulating layer 39 is provided in a position to be divided in a later dividing step. The organic insulating layer 39 is preferably provided not to extend to the light-emitting portion, the circuit, the wiring portion, and the like.

For the material of the organic insulating layer 39, the material that can be used for the resin layer 13 in Manufacturing method example 1 can be used. At least one of the heat treatment in an oxygen-containing atmosphere at the time of forming the organic insulating layer 39 and the laser light irradiation on the organic insulating layer 39 is performed, whereby the support substrate 11 and the organic insulating layer 39 can be separated from each other.

The organic insulating layer 35 is formed to have, inward from the openings provided in the stacked-layer structure from the metal layer 14 to the inorganic insulating layer 36, openings reaching the inorganic insulating layer 36. Moreover, the organic insulating layer 35 is formed to have an opening reaching the conductive layer 87a.

Manufacturing Method Example 3

Manufacturing method example 3 of the light-emitting device will be explained with reference to FIG. 12 to FIG. 14.

Figure 12A:
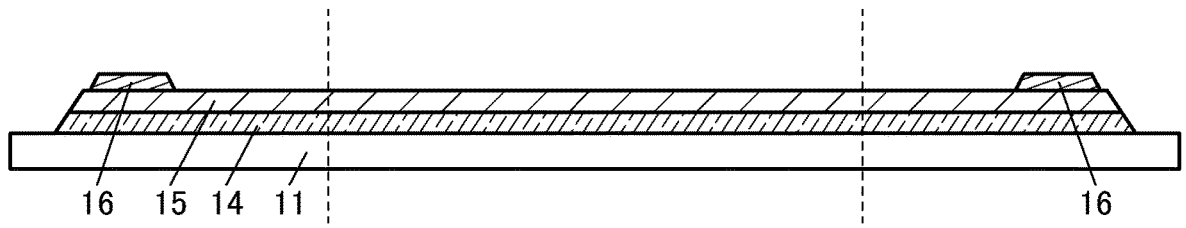
FIG. 12A to FIG. 12D are cross-sectional views showing an example of a method for manufacturing a light-emitting device.

First, an island-shaped metal layer 14 is formed over the support substrate 11 and surface treatment is performed on the metal layer 14, an island-shaped oxide insulating layer 15 is formed, and then an island-shaped metal layer 16 is formed over the island-shaped oxide insulating layer 15 (FIG. 12A).

The description in Manufacturing method example 2 can be referred to for the material of the metal layer 14. As in Manufacturing method example 2, plasma treatment is preferably performed on the surface of the metal layer 14 as the surface treatment on the metal layer 14 so that oxygen is supplied to the metal layer 14.

The oxide insulating layer 15 preferably has a function of releasing hydrogen and fluorine in a later heating step. Furthermore, the oxide insulating layer 15 may have a function of releasing nitrogen in a later heating step.

Fluorine may be supplied to the oxide insulating layer 15 in such a manner, for example, that the oxide insulating layer 15 is formed using the material described in Manufacturing method example 2 and then surface treatment using a fluorine-containing gas is performed. For example, fluorine can be supplied to the oxide insulating layer 15 by plasma treatment using a sulfur hexafluoride ($SF_6$) gas.

Alternatively, the oxide insulating layer 15 may be formed using a fluorine-containing gas. For example, a silicon oxide film containing fluorine (SiOF) can be formed by a plasma CVD method using a deposition gas containing a silane gas, a nitrous oxide gas, and a silicon tetrafluoride ($SiF_4$) gas.

The oxide insulating layer 15 may have a stacked-layer structure of a layer having a function of releasing hydrogen and a layer having a function of releasing fluorine. In this case, it is preferable that the layer having a function of releasing hydrogen be provided on the metal layer 14 side and the layer having a function of releasing fluorine be provided on the metal layer 16 side.

For the metal layer 16, the material that can be used for the metal layer 14 can be used. The metal layer 16 is preferably formed using nickel, titanium, or silver, or an alloy containing any of these.

The metal layer 14 and the metal layer 16 preferably contain different metals. For example, it is preferable that tungsten be used for the metal layer 14 and titanium be used for the metal layer 16. This facilitates control of the separation interface and thus the yield of the separating step can be increased.

The metal layer 16 is provided in a position to be divided in a later dividing step. The metal layer 16 is preferably provided not to extend to a light-emitting portion, a circuit, a wiring portion, and the like.

Figure 12B:
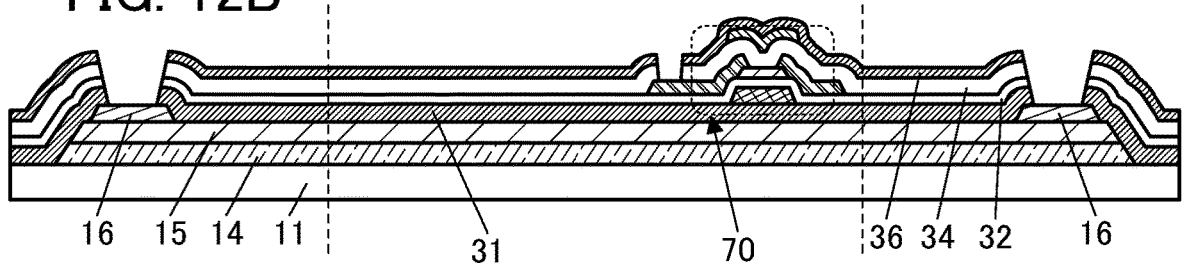

Next, the inorganic insulating layer 31 is formed as in Manufacturing method example 2, and the transistor 70 and the inorganic insulating layer 36 are further formed (FIG. 12B).

After the formation of the inorganic insulating layer 31, heat treatment is performed on the metal layer 14, the oxide insulating layer 15, and the metal layer 16. By the heat treatment, hydrogen and fluorine (and nitrogen) are released from the oxide insulating layer 15 to be supplied to the metal layer 16. At this time, the inorganic insulating layer 31 blocks released hydrogen and fluorine (and nitrogen); thus, hydrogen and fluorine (and nitrogen) can be efficiently supplied to the metal layer 16.

The heat treatment is performed at temperatures higher than or equal to the temperature at which hydrogen and fluorine (and nitrogen) are detached from the oxide insulating layer 15 and lower than or equal to the temperature at which the support substrate 11 is softened. The higher the temperature of the heat treatment is, the larger the amount of the detached hydrogen and fluorine (and nitrogen) from the oxide insulating layer 15 is, so that subsequent separability can be improved.

The atmosphere in which the heat treatment is performed is not particularly limited and may be an air atmosphere, but it is preferably performed in an inert gas atmosphere such as nitrogen or a rare gas.

The heat treatment can be performed before, during, or after the fabrication of the transistor. The heat treatment during the fabrication process of the transistor may double as this heat treatment.

Note that openings reaching the metal layer 16 are formed in the inorganic insulating layer 31, the insulating layer 32, the insulating layer 34, and the insulating layer 36. The openings are formed before the formation of the organic insulating layer 35. Note that the openings may be formed in the plurality of layers at a time, or the openings may be formed layer by layer.

Figure 12C:
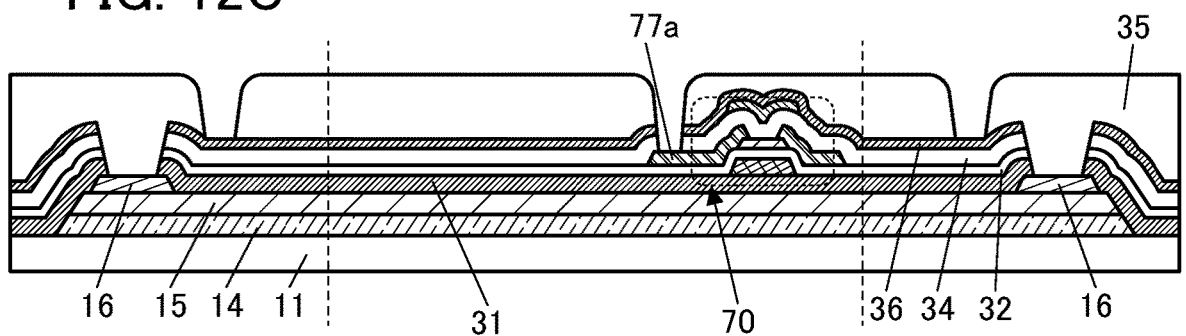

Next, as in Manufacturing method example 2, the organic insulating layer 35 is formed over the metal layer 16, over the inorganic insulating layer 36, and over the transistor 70 (FIG. 12C).

The organic insulating layer 35 is provided to fill the openings provided in the inorganic insulating layer 31, the insulating layer 32, the insulating layer 34, and the inorganic insulating layer 36, and is in contact with the metal layer 16 through the openings. The organic insulating layer 35 is formed to have, inward from the openings, openings reaching the inorganic insulating layer 36. Moreover, the organic insulating layer 35 is formed to have an opening reaching the conductive layer 77a.

Figure 12D:
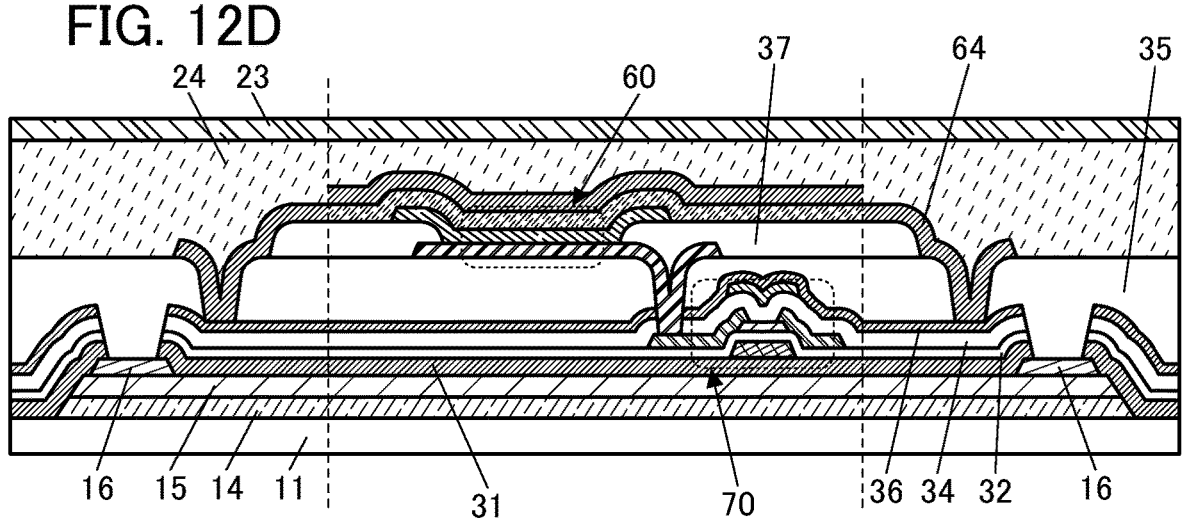

Next, as in Manufacturing method example 1 and Manufacturing method example 2, the stacked-layer structure from the electrode 61 to the substrate 23 is formed (FIG. 12D).

Figure 13A:
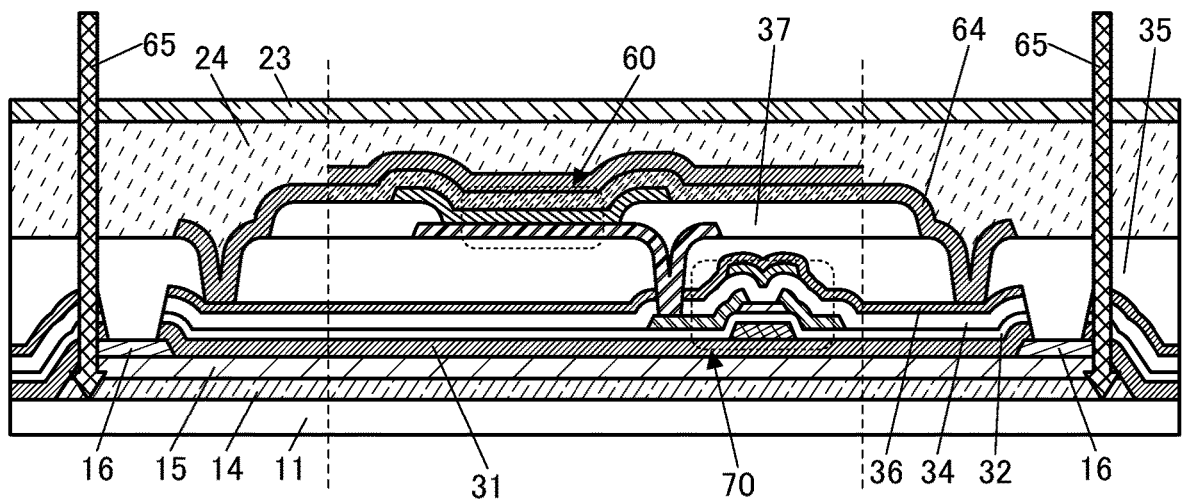
FIG. 13A and FIG. 13B are cross-sectional views showing an example of a method for manufacturing a light-emitting device.
Figure 13B:
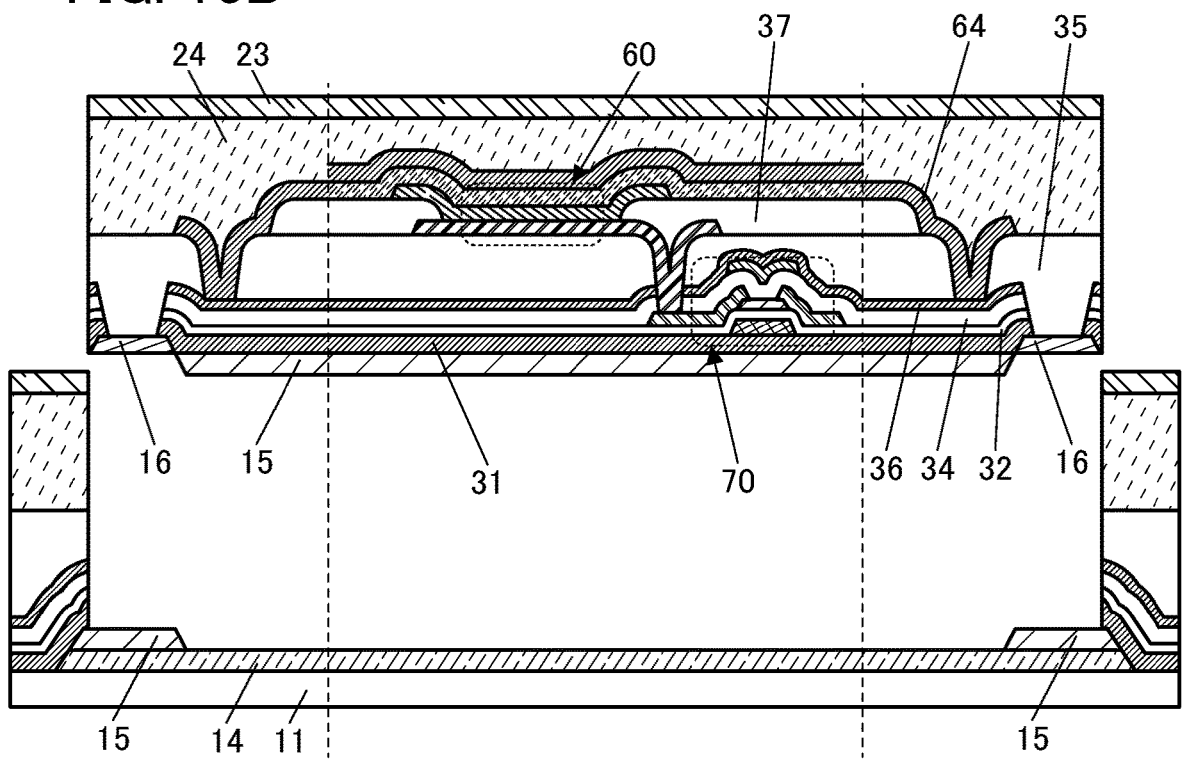

Next, a separation starting point is formed (FIG. 13A), and the metal layer 14 and the oxide insulating layer 15 are separated from each other (FIG. 13B).

In FIG. 13A, an example is shown in which the sharp instrument 65, e.g., a knife, is inserted from the substrate 23 side into a portion located inward from the end portion of the metal layer 14 to make a cut. The cut is preferably formed to have a frame-like shape.

Separation mainly occurs in the oxide layer positioned between the metal layer 14 and the oxide insulating layer 15 and at the interface between the oxide layer and the oxide insulating layer 15.

Here, in the region where the metal layer 16 is provided, separation occurs at the interface between the oxide insulating layer 15 and the metal layer 16.

Figure 14A:
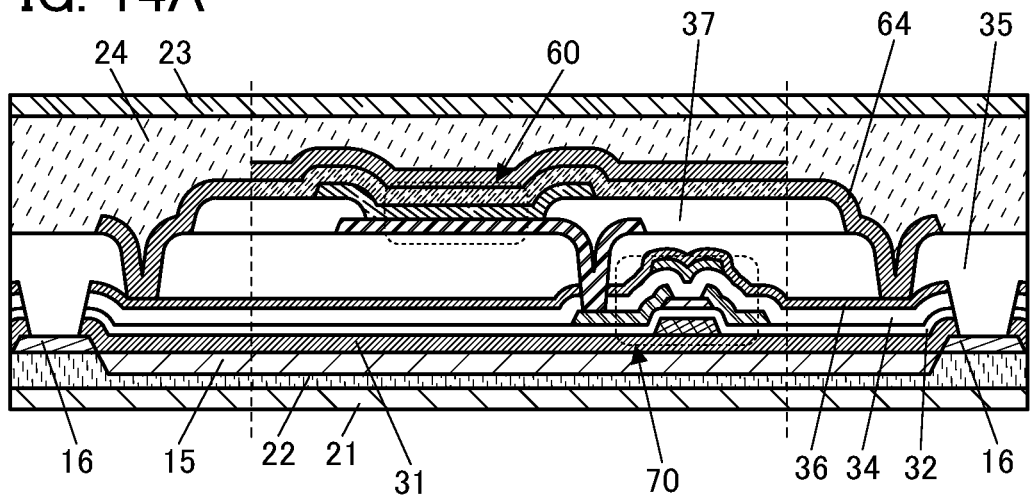
FIG. 14A to FIG. 14C are cross-sectional views showing an example of a method for manufacturing a light-emitting device.

After that, the substrate 21 is bonded to the exposed oxide insulating layer 15 and the exposed metal layer 16 with the adhesive layer 22 (FIG. 14A). Accordingly, the transistor 70, the light-emitting element 60, and the like formed over the support substrate 11 can be transferred from the support substrate 11 to the substrate 23.

For the materials of the adhesive layer 22 and the substrate 21, the description in Manufacturing method example 1 can be referred to.

Figure 14B:
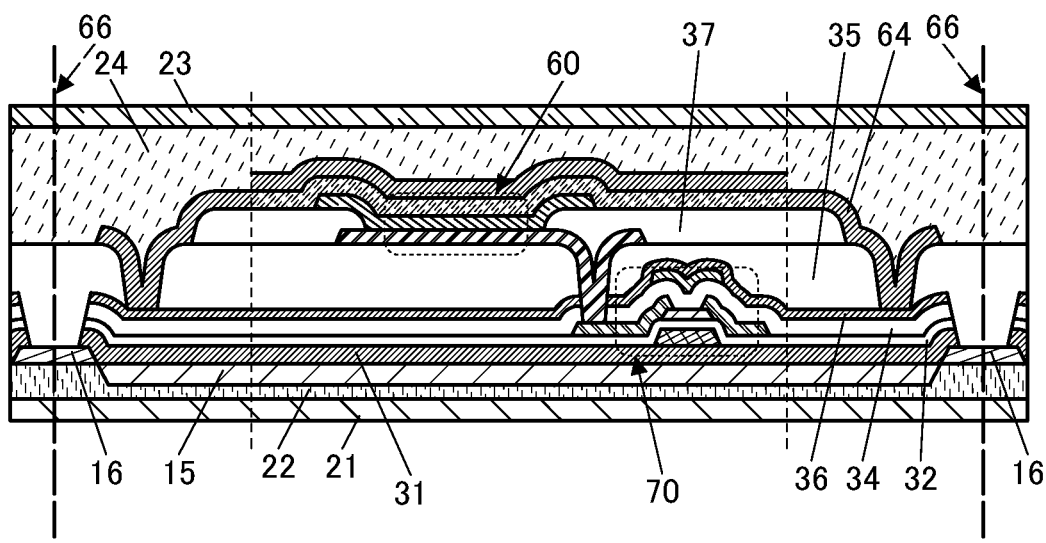
Figure 14C:
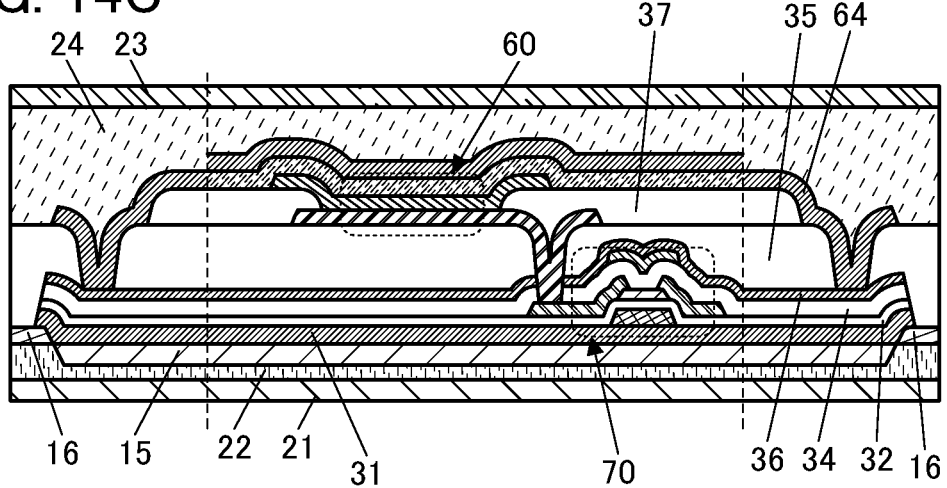

Then, outline processing is performed on the light-emitting device, whereby the light-emitting device can be manufactured (FIG. 14B and FIG. 14C). Dividing is performed so that the dividing lines 66 overlap with the openings provided in the inorganic insulating layer 31, the insulating layer 32, the insulating layer 34, and the inorganic insulating layer 36 as illustrated in FIG. 14B. The metal layer 16 is provided at the dividing positions, but the metal layer 16 does not extend to the light-emitting portion. In other words, an inorganic film extending to the light-emitting portion, the circuit, the wiring portion, and the like is not provided at the dividing positions. Thus, even when a microcrack is generated in the metal layer 16 by dividing, the microcrack can be inhibited from spreading to the light-emitting portion, the circuit, the wiring portion, and the like. Furthermore, even when the light-emitting device is held in a bent state for a long time or repeatedly bent, generation and development of a crack can be suppressed.

Although an organic film is mainly exposed on a side surface of the light-emitting device illustrated in FIG. 14C, the top surfaces, side surfaces, and bottom surfaces of the transistor 70 and the light-emitting element 60 are surrounded by a plurality of inorganic insulating layers (e.g., the inorganic insulating layer 31, the inorganic insulating layer 36, and the inorganic insulating layer 64). Accordingly, entry of impurities into the transistor 70 and the light-emitting element 60 can be suppressed, and thus the reliability of the transistor 70 and the light-emitting element 60 can be increased.

Manufacturing Method Example 4

Manufacturing method example 4 of the light-emitting device will be explained with reference to FIG. 15 to FIG. 18.

In Manufacturing method example 4, a separation layer is provided between the support substrate 11 and the inorganic insulating layer 31, a separation layer is provided between a support substrate 91 and an inorganic insulating layer 97, and components provided over the support substrate 11 and components provided over the support substrate 91 are transferred to another substrate. There is no particular limitation on the separation layer, and the separation layer provided over the support substrate 11 and the separation layer provided over the support substrate 91 may have the same structure or different structures.

Figure 15A:
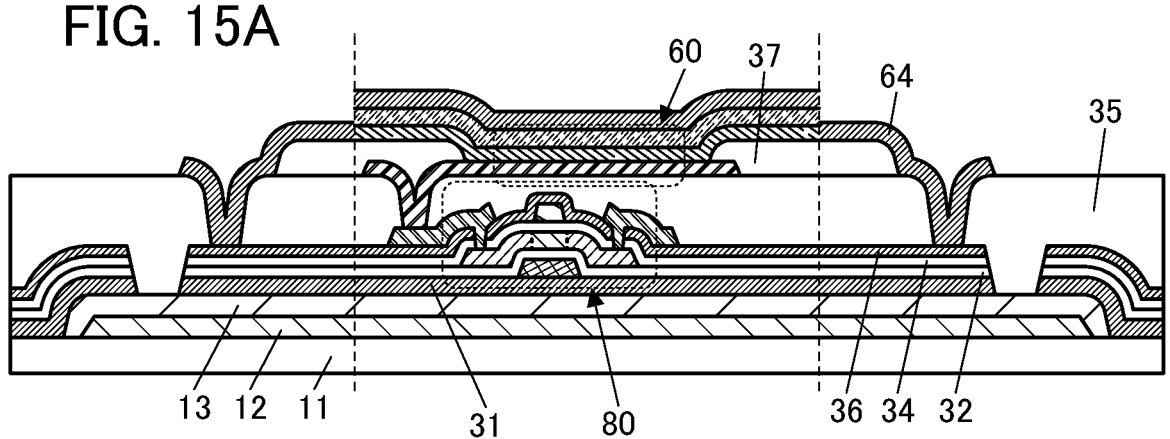
FIG. 15A to FIG. 15D are cross-sectional views showing an example of a method for manufacturing a light-emitting device.

First, as in Manufacturing method example 1, ab island-shaped metal oxide layer 12 is formed over the support substrate 11, an island-shaped resin layer 13 is formed over the metal oxide layer 12, the inorganic insulating layer 31 is formed over the support substrate 11 and over the resin layer 13, and the transistor 80, the organic insulating layer 35, the light-emitting element 60, the partition walls 37, the inorganic insulating layer 64, and the like are formed over the inorganic insulating layer 31 (FIG. 15A).

Furthermore, an island-shaped separation layer is formed over the support substrate 91, the inorganic insulating layer 97 is formed over the separation layer, and a coloring layer CF and light-blocking layers BM are formed over the inorganic insulating layer 97 independently of the steps in FIG. 15A.

A color filter or the like can be used as the coloring layer CF. The coloring layer CF is placed to overlap with the light-emitting region of the light-emitting element 60 when overlapping with the support substrate 11.

A black matrix or the like can be used as the light-blocking layer BM. The light-blocking layer BM is placed to overlap with the partition wall 37 when overlapping with the support substrate 11.

Figure 15B:
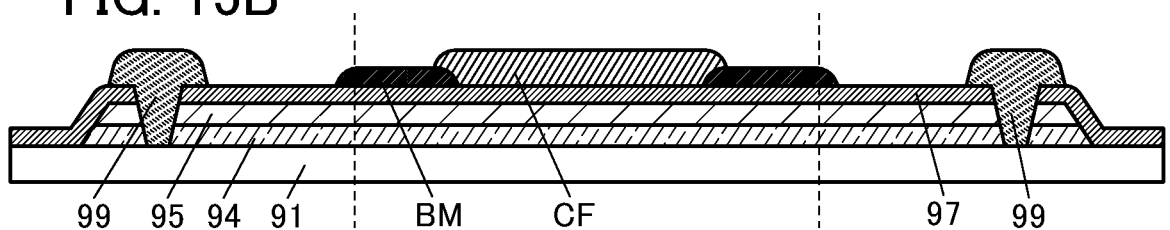

FIG. 15B shows an example in which a stacked-layer structure of a metal layer 94 and an oxide insulating layer 95 is employed. The metal layer 94 and the oxide insulating layer 95 correspond to the metal layer 14 and the oxide insulating layer 15 in Manufacturing method example 2, respectively.

Figure 15C:
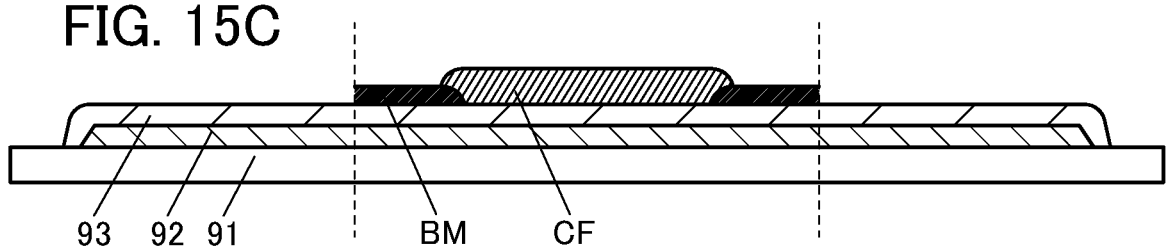

FIG. 15C shows an example in which a stacked-layer structure of a metal oxide layer 92 and a resin layer 93 is employed. The metal oxide layer 92 and the resin layer 93 correspond to the metal oxide layer 12 and the resin layer 13 in Manufacturing method example 1, respectively.

Hereinafter, an example is shown in which the stacked-layer structure of the metal layer 94 and the oxide insulating layer 95 is employed for the separation layer over the support substrate 91 as illustrated in FIG. 15B.

Furthermore, organic insulating layers 99 are formed to fill openings provided in a stacked-layer structure from the metal layer 94 to the inorganic insulating layer 97 (FIG. 15B).

Figure 15D:
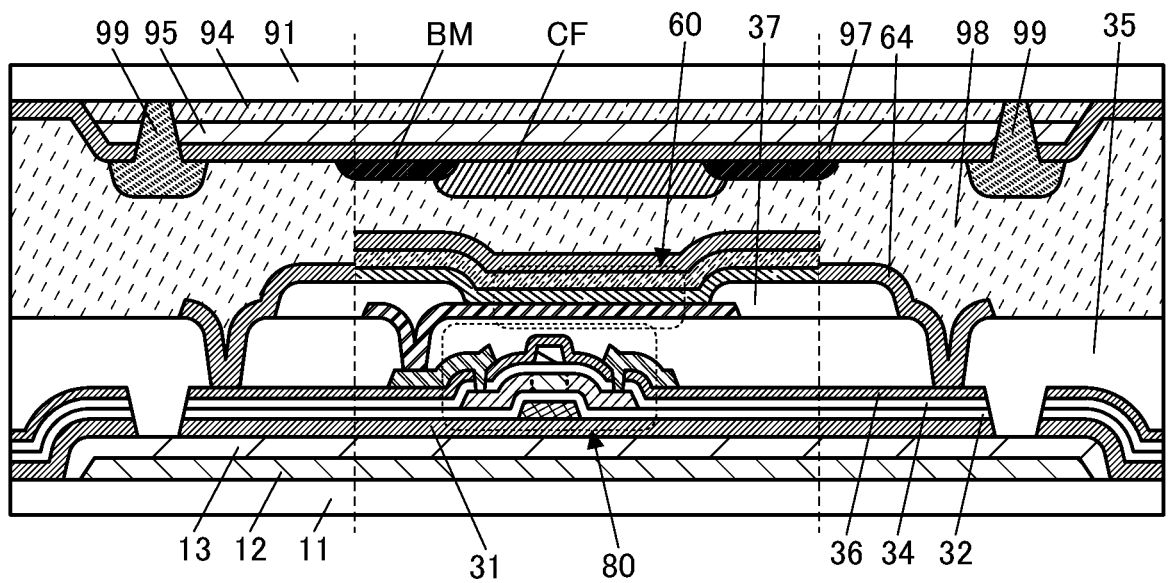

Then, with the use of an adhesive layer 98, the surface of the support substrate 11 where the transistor 80 and the like are formed and the surface of the support substrate 91 where the coloring layer CF and the like are formed are bonded to each other (FIG. 15D).

The material that can be used for the adhesive layer 24 can be used for the adhesive layer 98.

Figure 16A:
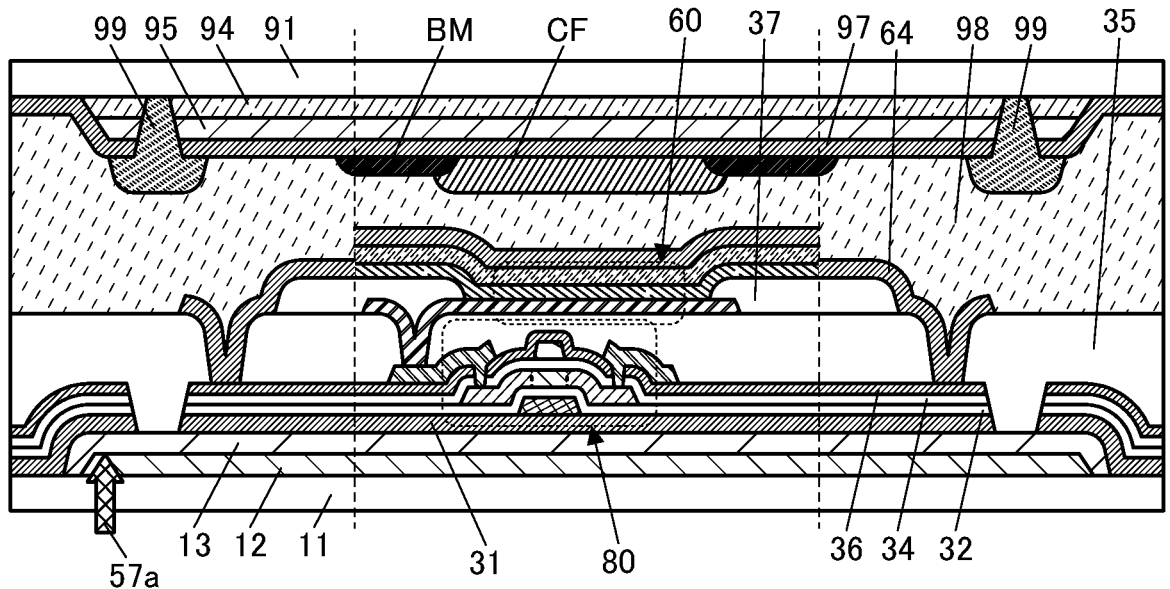
FIG. 16A and FIG. 16B are cross-sectional views showing an example of a method for manufacturing a light-emitting device.

Next, a separation starting point is formed. Separation may be performed from either the support substrate 11 or the support substrate 91. In FIG. 16A, the interface between the metal oxide layer 12 and the resin layer 13 or the vicinity thereof are partly irradiated with laser light 57a from the support substrate 11 side, so that the metal oxide layer 12 and the resin layer 13 are partly separated from each other.

Figure 16B:
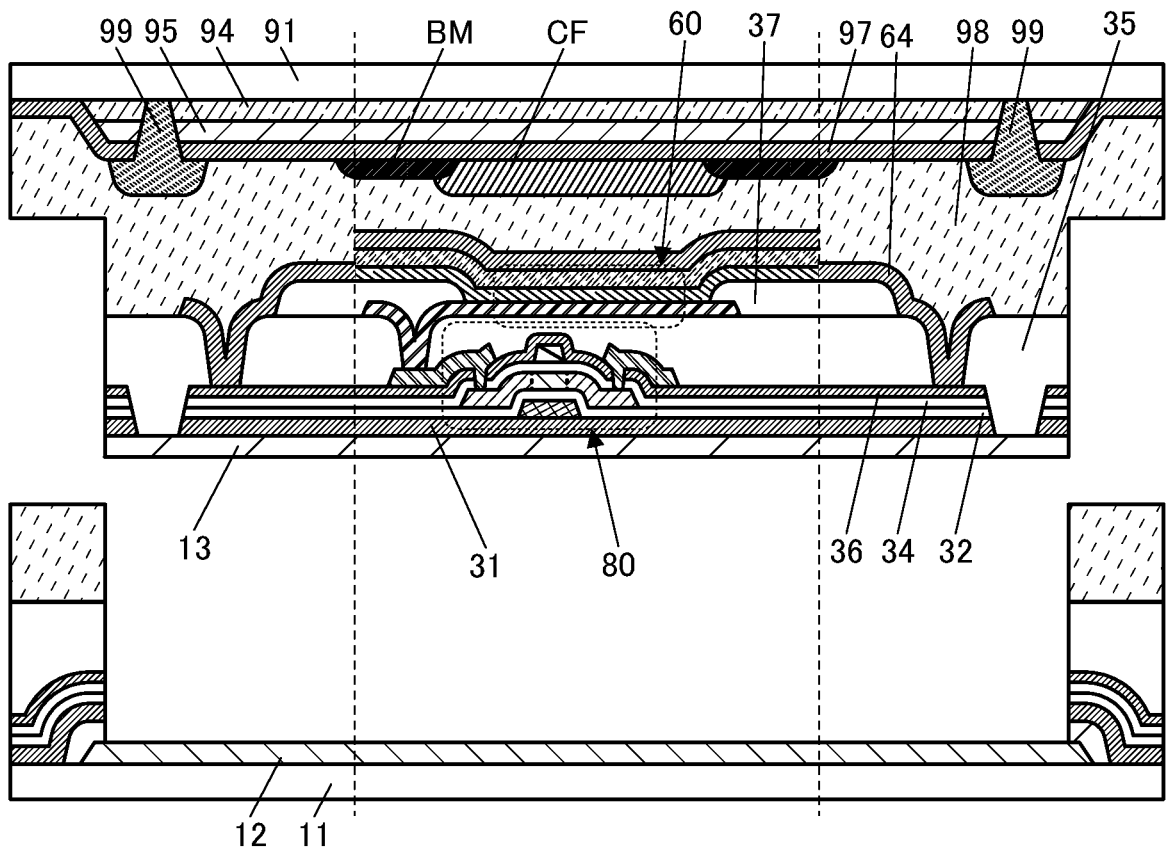

Next, from the separation starting point, the metal oxide layer 12 and the resin layer 13 are separated from each other (FIG. 16B). Note that although an example in which separation occurs in the adhesive layer 98 in a region where the metal oxide layer 12 is not formed is shown in FIG. 16B, one embodiment of the present invention is not limited thereto. In addition, although the separation interface of the adhesive layer 98 is smooth in FIG. 16B for simplicity, the separation interface may be uneven.

Figure 17A:
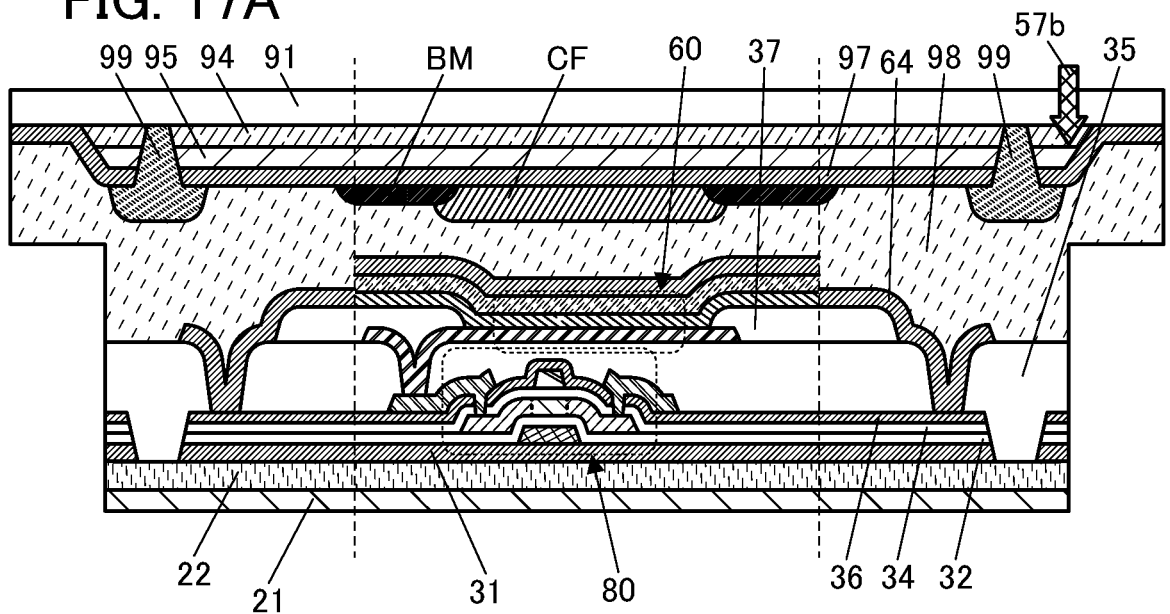
FIG. 17A and FIG. 17B are cross-sectional views showing an example of a method for manufacturing a light-emitting device.

Then, the resin layer 13 exposed by the separation is removed and the inorganic insulating layer 31 is exposed. After that, the substrate 21 is bonded to the inorganic insulating layer 31 with the adhesive layer 22 (FIG. 17A).

Next, a separation starting point is formed. In FIG. 17A, the interface between the metal layer 94 and the oxide insulating layer 95 or the vicinity thereof are partly irradiated with laser light 57b from the support substrate 91 side, so that the metal layer 94 and the oxide insulating layer 95 are partly separated from each other.

Figure 17B:
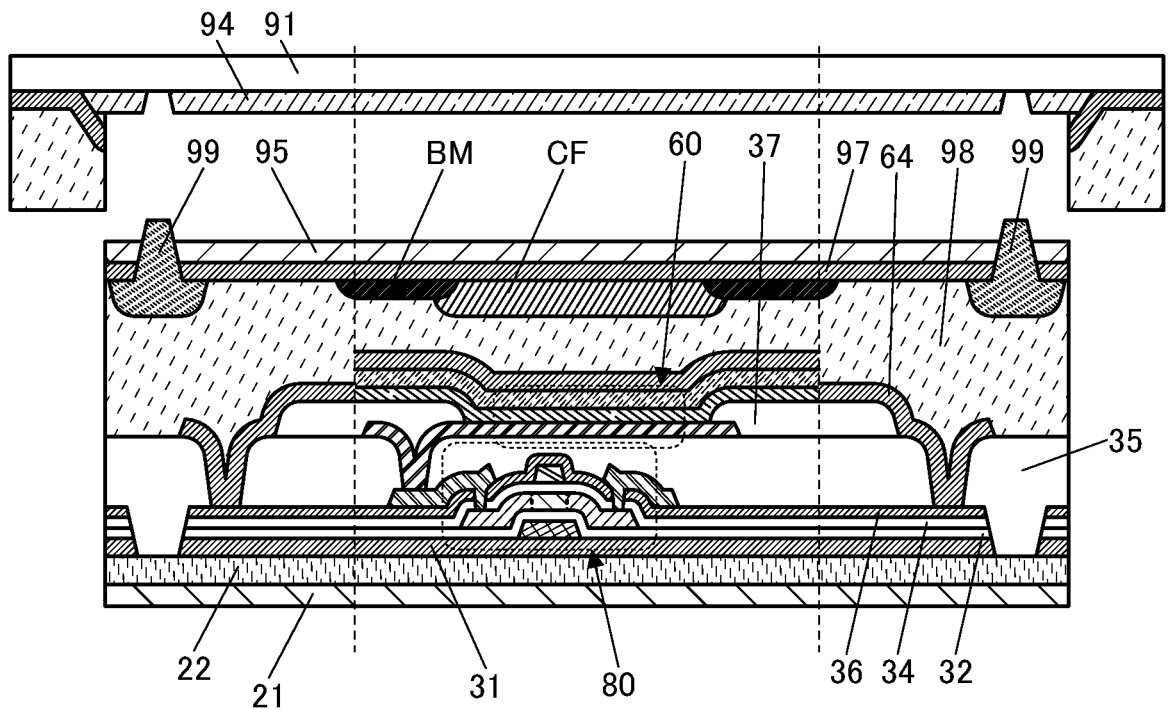

Next, from the separation starting point, the metal layer 94 and the oxide insulating layer 95 are separated from each other (FIG. 17B).

Figure 18A:
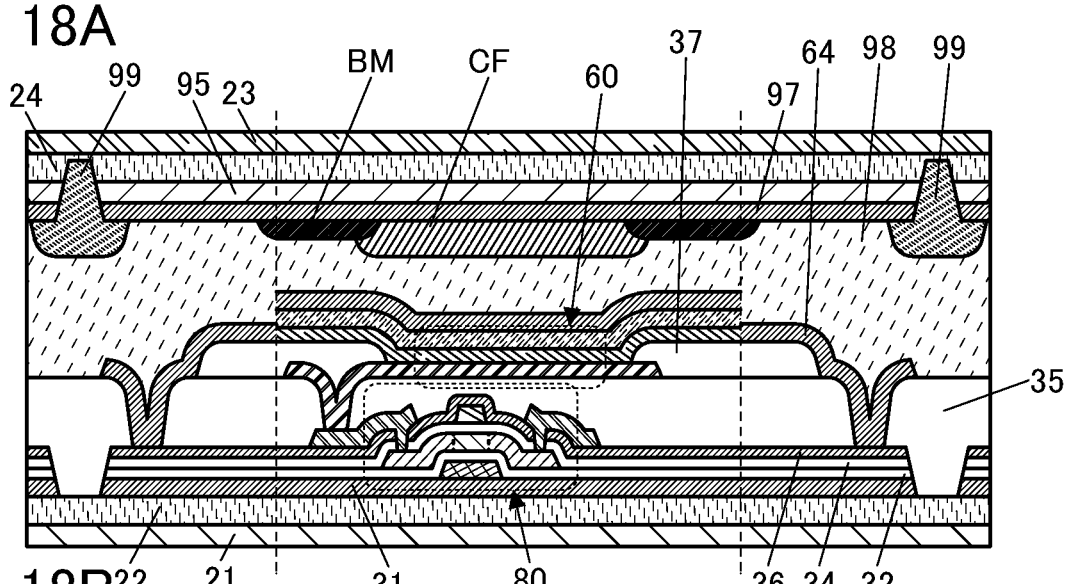
FIG. 18A to FIG. 18C are cross-sectional views showing an example of a method for manufacturing a light-emitting device.

After that, the substrate 23 is bonded to the exposed oxide insulating layer 95 with the adhesive layer 24 (FIG. 18A).

Figure 18B:
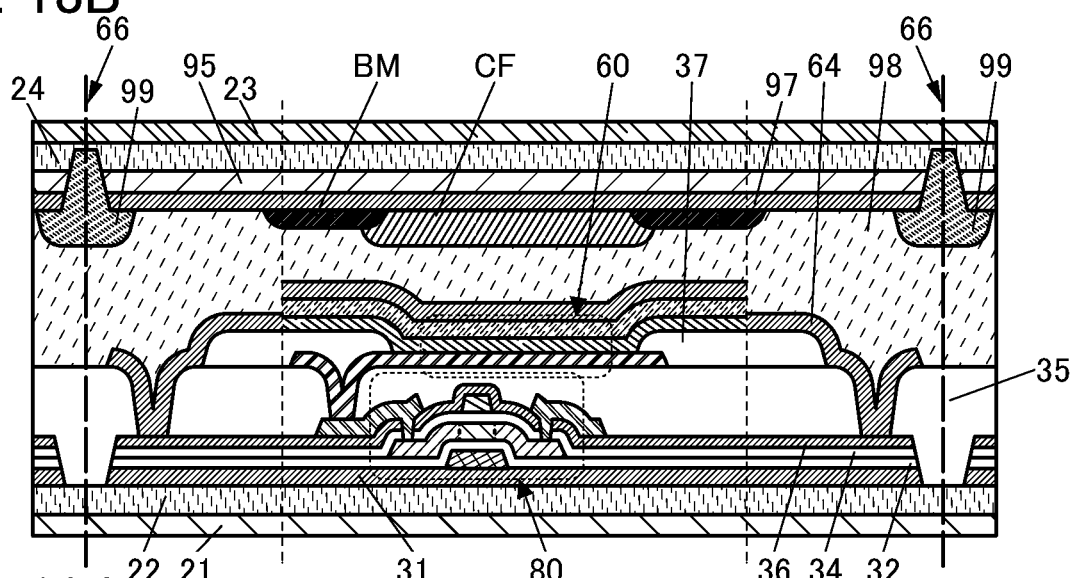
Figure 18C:
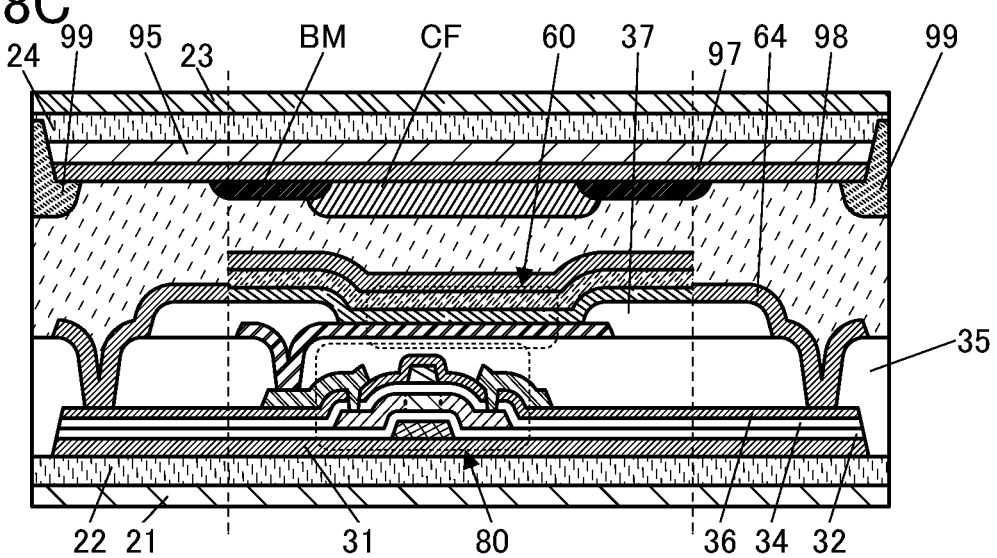

Then, outline processing is performed on the light-emitting device, whereby the light-emitting device can be manufactured (FIG. 18B and FIG. 18C). Dividing is performed so that the dividing lines 66 overlap with the openings provided in the inorganic insulating layer 31, the insulating layer 32, the insulating layer 34, and the inorganic insulating layer 36, and the organic insulating layers 99 as illustrated in FIG. 18B. In other words, an inorganic film is not provided at the dividing positions. Thus, generation of a microcrack inside the light-emitting device due to dividing can be suppressed. Furthermore, even when the light-emitting device is held in a bent state for a long time or repeatedly bent, generation and development of a crack can be suppressed.

Although an organic film is mainly exposed on a side surface of the light-emitting device illustrated in FIG. 18C, the top surfaces, side surfaces, and bottom surfaces of the transistor 80 (a semiconductor layer) and the light-emitting element 60 are surrounded by a plurality of inorganic insulating layers (e.g., the inorganic insulating layer 31, the inorganic insulating layer 36, and the inorganic insulating layer 64). Accordingly, entry of impurities into the transistor 80 and the light-emitting element 60 can be suppressed, and thus the reliability of the transistor 80 and the light-emitting element 60 can be increased.

[Specific Example of Light-Emitting Device]

Specific structures of light-emitting devices are described with reference to FIG. 19 to FIG. 22.

Structure Example 1

Figure 19A:
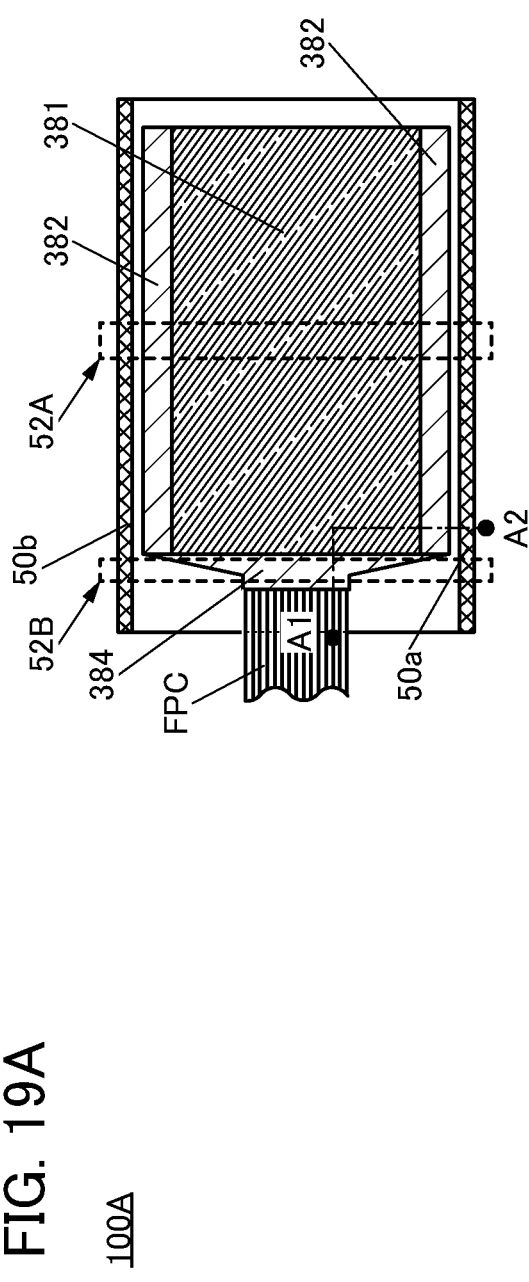
FIG. 19A is a top view showing an example of a light-emitting device.

FIG. 19A shows a top view of a light-emitting device 100A. The light-emitting device 100A includes the light-emitting portion 381, the circuit 382, and the wiring portion 384.

The region 50a and the region 50b are provided along the long sides of the light-emitting device 100A. The region 50a and the region 50b are provided so that the light-emitting portion 381 and the wiring portion 384 are sandwiched therebetween.

The light-emitting device 100A can be bent in the region 52A and the region 52B, for example. The light-emitting device 100A can be bent along a line through three portions in total in the region 52A: the region 50a, the region 50b, and the light-emitting portion 381. Furthermore, the light-emitting device 100A can be bent along a line through three portions in total in the region 52B: the region 50a, the region 50b, and the wiring portion 384.

The region 50a and the region 50b are each a region where an inorganic film is not provided. Thus, when the light-emitting device 100A is bent so that those regions are included, generation and development of a crack can be suppressed. As a result, the resistance to bending of the light-emitting device 100A can be increased.

Figure 19B:
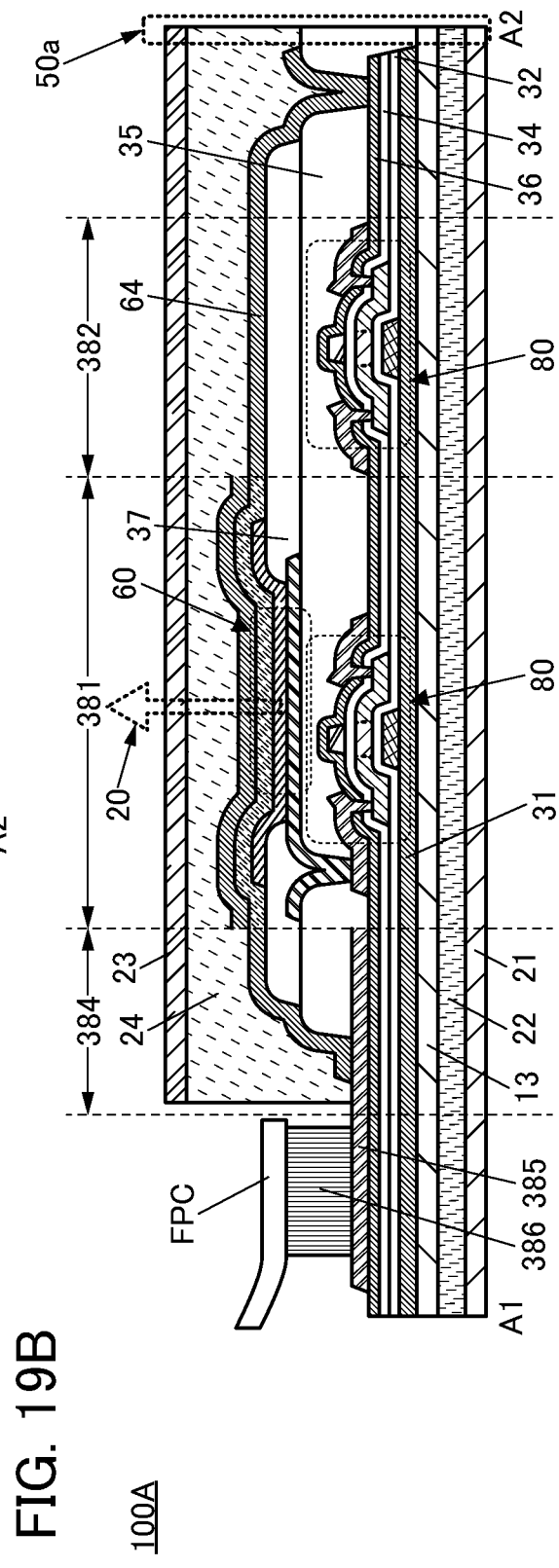
FIG. 19B is a cross-sectional view showing an example of a light-emitting device.

FIG. 19B shows a cross-sectional view taken along a dashed-dotted line A1-A2 in FIG. 19A.

As illustrated in FIG. 19B, the light-emitting device 100A includes the substrate 21, the adhesive layer 22, the resin layer 13, the inorganic insulating layer 31, the transistor 80, the organic insulating layer 35, the light-emitting element 60, the inorganic insulating layer 64, the adhesive layer 24, the substrate 23, and the like.

The light-emitting device 100A can be manufactured with the use of Manufacturing method example 1 described above, for example.

The substrate 21 and the resin layer 13 are bonded to each other with the adhesive layer 22. The resin layer 13 may be removed and the inorganic insulating layer 31 and the substrate 21 may be bonded to each other.

The light-emitting portion 381 includes the transistor 80 electrically connected to the light-emitting element 60. The transistor 80 has a function of controlling the driving of the light-emitting element 60.

The circuit 382 includes the transistor 80 having a structure similar to that of the transistor 80 included in the light-emitting portion 381.

The transistor included in the circuit 382 and the transistor included in the light-emitting portion 381 may have the same structure or different structures. A plurality of transistors included in the circuit 382 may have the same structure or two or more kinds of structures. Similarly, a plurality of transistors included in the light-emitting portion 381 may have the same structure or two or more kinds of structures.

A conductive layer 385 is electrically connected to an FPC through a connector 386. The conductive layer 385 can be formed using the same material and the same step as those of a source and a drain of the transistor 80.

As the connector 386, any of a variety of anisotropic conductive films (ACF), anisotropic conductive pastes (ACP), and the like can be used.

The light-emitting element 60 emits light to the substrate 23 side (see the light emission 20). A visible-light-transmitting material is used for the substrate 23.

Any of a variety of optical members can be placed on the outer side of the substrate 23. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film suppressing generation of a scratch caused by the use, a shock absorption layer, or the like may be placed on the outer side of the substrate 23.

A side surface of the light-emitting device 100A is a surface exposed by dividing for outline processing in the manufacturing process of the light-emitting device 100A. Since the inorganic insulating layer 31, the insulating layer 32, the insulating layer 34, the inorganic insulating layer 36, and the inorganic insulating layer 64 are not provided in the region 50a including the side surface of the light-emitting device 100A, generation of a crack in these layers due to dividing can be suppressed. Accordingly, even when the light-emitting device 100A is held in a state where a portion including the region 50A is bent for a long time or the light-emitting device 100A is repeatedly bent, a crack is less likely to be generated in the light-emitting device 100A, and even if a crack is generated, it is less likely to be developed. As a result, the resistance to bending of the light-emitting device 100A can be increased.

The region 50 including the side surface of the light-emitting device 100A includes the substrate 21, the adhesive layer 22, the resin layer 13, the organic insulating layer 35, the adhesive layer 24, and the substrate 23. These layers each preferably contain an organic material. Meanwhile, since an organic material has lower water resistance than an inorganic material, impurities such as water might enter the light-emitting device 100A from the side surface of the light-emitting device 100A through the region 50. Thus, the inorganic insulating layers are preferably in contact with each other outside an end portion of the transistor 80 (at least an end portion of the semiconductor layer in which a channel is formed) and inward from the region 50, and the inorganic insulating layers are preferably in contact with each other outside an end portion of the light-emitting element 60 and inward from the region 50. Accordingly, even when impurities enter from the side surface of the light-emitting device 100A through the region 50, the impurities can be less likely to reach the light-emitting element 60 and the transistor 40. As a result, the reliability of the light-emitting device 10A can be increased.

In the light-emitting device 100A, a top surface, a bottom surface, and side surfaces of the semiconductor layer are covered with a stacked-layer structure of the inorganic insulating layer 31, the insulating layer 32, the insulating layer 34, and the inorganic insulating layer 36. The inorganic insulating layer 36 and the inorganic insulating layer 64 are in contact with each other through an opening provided in the organic insulating layer 35. Such a structure can suppress entry of impurities into the light-emitting element 60 and the transistor 80.

Structure Example 2

FIG. 20A shows a cross-sectional view of a light-emitting device 100B.

As illustrated in FIG. 20A, the light-emitting device 100B includes the substrate 21, the adhesive layer 22, the oxide insulating layer 15, the inorganic insulating layer 31, the transistor 70, the organic insulating layer 35, the light-emitting element 60, the inorganic insulating layer 64, the adhesive layer 24, the substrate 23, and the like.

The light-emitting device 100B can be manufactured with the use of Manufacturing method example 2 described above, for example.

The substrate 21 and the oxide insulating layer 15 are bonded to each other with the adhesive layer 22.

The light-emitting portion 381 includes the transistor 70 electrically connected to the light-emitting element 60. The transistor 70 has a function of controlling the driving of the light-emitting element 60.

The circuit 382 includes the transistor 70 having a structure similar to that of the transistor 70 included in the light-emitting portion 381.

The conductive layer 385 is electrically connected to an FPC through a conductive layer 387 and the connector 386. The conductive layer 385 can be formed using the same material and the same step as those of a source and a drain of the transistor 70. The conductive layer 387 can be formed using the same material and the same step as those of the pixel electrode of the light-emitting element 60.

The light-emitting element 60 emits light to the substrate 21 side (see the light emission 20). A visible-light-transmitting material is used for the substrate 21.

FIG. 20B shows an example in which not the inorganic insulating layer 64 but a protective layer 69 is included as the protective layer of the light-emitting element 60. The protective layer 69 includes an inorganic insulating layer 69a over the electrode 63, an organic insulating layer 69b over the inorganic insulating layer 69a, and an inorganic insulating layer 69c over the organic insulating layer 69b.

An end portion of the inorganic insulating layer 69a and an end portion of the inorganic insulating layer 69c extend beyond an end portion of the organic insulating layer 69b and are in contact with each other. The inorganic insulating layer 69a is in contact with the inorganic insulating layer 36 through an opening in the organic insulating layer 35. Thus, the light-emitting element 60 can be surrounded by the inorganic insulating layer 36 and the protective layer 69, so that the reliability of the light-emitting element 60 can be increased.

As described above, the protective layer of the light-emitting element 60 may have a stacked-layer structure of an organic insulating film and an inorganic insulating film. In that case, an end portion of the inorganic insulating film preferably extends beyond an end portion of the organic insulating film.

Structure Example 3

FIG. 21A shows a top view of a light-emitting device 100C. The light-emitting device 100C includes the light-emitting portion 381, the circuit 382, and the wiring portion 384.

The region 50a and the region 50b are provided along the long sides of the light-emitting device 100C. The region 50a and the region 50b are provided so that the light-emitting portion 381 is sandwiched therebetween. The region 50a and the region 50b may be provided so that the wiring portion 384 is further sandwiched therebetween.

The light-emitting device 100C can be bent in the region 52A, for example. The light-emitting device 100C can be bent along a line through three portions in total in the region 52A: the region 50a, the region 50b, and the light-emitting portion 381.

The region 50a and the region 50b are each a region where an inorganic film extending to the light-emitting portion 381 is not provided. Thus, when the light-emitting device 100C is bent so that those regions are included, generation and development of a crack can be suppressed. As a result, the resistance to bending of the light-emitting device 100C can be increased.

FIG. 21B shows a cross-sectional view taken along a dashed-dotted line B1-B2 in FIG. 21A.

As illustrated in FIG. 21B, the light-emitting device 100C includes the substrate 21, the adhesive layer 22, the oxide insulating layer 15, the metal layer 16, the inorganic insulating layer 31, the transistor 70, the organic insulating layer 35, the light-emitting element 60, the inorganic insulating layer 64, the adhesive layer 24, the substrate 23, and the like.

The light-emitting device 100C can be manufactured with the use of Manufacturing method example 3 described above, for example.

The substrate 21 and the oxide insulating layer 15 are bonded to each other with the adhesive layer 22. Moreover, in the region 50a, the substrate 21 and the metal layer 16 are bonded to each other with the adhesive layer 22.

The light-emitting portion 381 includes the transistor 70 electrically connected to the light-emitting element 60. The transistor 70 has a function of controlling the driving of the light-emitting element 60.

The circuit 382 includes the transistor 70 having a structure similar to that of the transistor 70 included in the light-emitting portion 381.

The conductive layer 385 is electrically connected to an FPC through the metal layer 16 and the connector 386. The conductive layer 385 can be formed using the same material and the same step as those of the source and the drain of the transistor 70.

In the light-emitting device 100C manufactured employing Manufacturing method example 3, the metal layer 16 is partly exposed after separation of the support substrate. The metal layer 16 can be used as a rear electrode, a through electrode, an external connection terminal, or the like. For example, electrical connection with a circuit board such as an FPC can be made through the metal layer 16.

That is, the light-emitting device 100C includes the metal layer 16 functioning as an external connection terminal and the metal layer 16 provided in a region where an inorganic film extending to the light-emitting portion 381 is not provided (e.g., the region 50a).

The light-emitting element 60 emits light to the substrate 23 side (see the light emission 20). A visible-light-transmitting material is used for the substrate 23.

With the use of the metal layer 16, an FPC can be placed on a side opposite to the side where light from the light-emitting element 60 is extracted. Thus, a space for bending the FPC in incorporating the light-emitting device in an electronic device can be eliminated, which enables the electronic device to be smaller.

Structure Example 4

Figure 22:
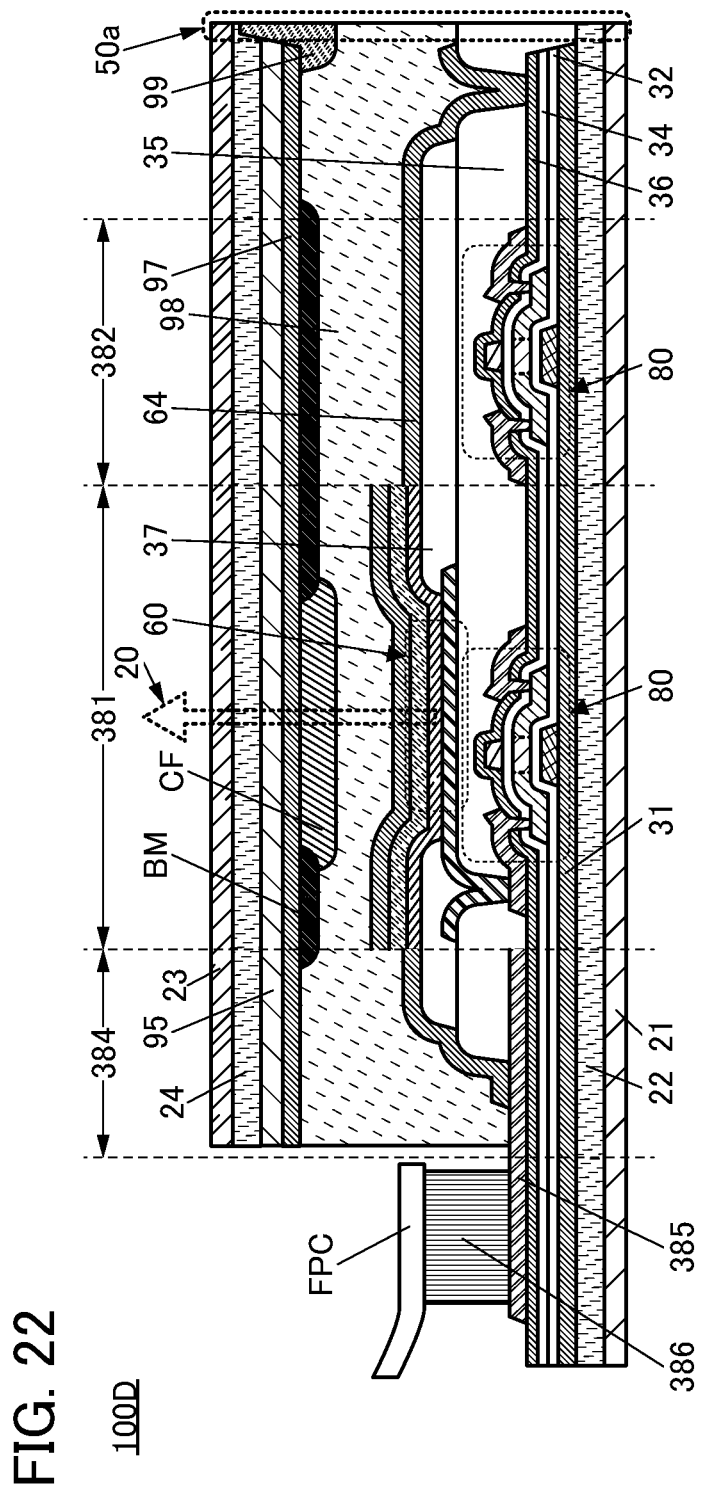
FIG. 22 is a cross-sectional view showing an example of a light-emitting device.

FIG. 22 shows a cross-sectional view of a light-emitting device 100D.

As illustrated in FIG. 22, the light-emitting device 100D includes the substrate 21, the adhesive layer 22, the inorganic insulating layer 31, the transistor 80, the organic insulating layer 35, the light-emitting element 60, the inorganic insulating layer 64, the adhesive layer 98, the coloring layer CF, the light-blocking layer BM, the inorganic insulating layer 97, the oxide insulating layer 95, the adhesive layer 24, the substrate 23, and the like.

The light-emitting device 100D can be manufactured with the use of Manufacturing method example 4 described above, for example.

The substrate 21 and the inorganic insulating layer 31 are bonded to each other with the adhesive layer 22. The substrate 23 and the organic insulating layer 95 are bonded to each other with the adhesive layer 24.

The light-emitting portion 381 includes the transistor 80 electrically connected to the light-emitting element 60. The transistor 80 has a function of controlling the driving of the light-emitting element 60.

The circuit 382 includes the transistor 70 having a structure similar to that of the transistor 80 included in the light-emitting portion 381.

The conductive layer 385 is electrically connected to an FPC through the connector 386. The conductive layer 385 can be formed using the same material and the same step as those of the source and the drain of the transistor 80.

The light-emitting device 100D is a top-emission light-emitting device employing a color filter method. The light-emitting element 60 emits light to the substrate 23 side through the coloring layer CF (see the light emission 20). A visible-light-transmitting material is used for the substrate 23.

[Metal Oxide]

A metal oxide that can be used for the semiconductor layer of the transistor will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

As described above, outline processing is performed by dividing a region where an inorganic film extending to a light-emitting portion is not provided, whereby the light-emitting device of this embodiment is manufactured. Therefore, even when the light-emitting device is held in a bent state for a long time or repeatedly bent, generation and development of a crack can be suppressed. As a result, the resistance to bending of the light-emitting device can be increased.

This embodiment can be combined with the other embodiments as appropriate. In this specification, in the case where a plurality of structure examples are shown in one embodiment, the structure examples can be combined as appropriate.

Embodiment 2

In this embodiment, electronic devices of one embodiment of the present invention will be described with reference to drawings.

Examples of electronic devices include a television set, a monitor of a computer or the like, a digital camera, a digital video camera, a digital photo frame, a mobile phone (also referred to as a cellular phone or a mobile phone device), a portable game machine, a portable information terminal, an audio reproducing device, and a large game machine such as a pinball machine.

The electronic devices of one embodiment of the present invention include the light-emitting device of one embodiment of the present invention in its display portion and thus has high resistance to repeated bending and high reliability.

By using the light-emitting device of one embodiment of the present invention, a highly reliable electronic device can be achieved with high mass productivity at a low cost.

The display portion of the electronic device in this embodiment can display a video with a resolution of, for example, full high definition, 4K2K, 8K4K, 16K8K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

The electronic device of one embodiment of the present invention has flexibility and therefore can be incorporated along a curved surface of an inside or outside wall of a house or a building or a curved surface of an interior or an exterior of an automobile.

Furthermore, the electronic device of one embodiment of the present invention may include a secondary battery. It is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
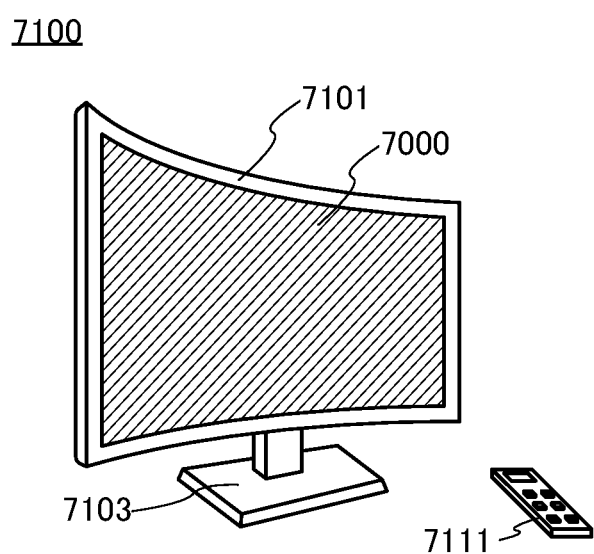
FIG. 23A to FIG. 23D are drawings showing examples of an electronic device.

FIG. 23A shows an example of a television device. In a television device 7100, a display portion 7000 is incorporated in a housing 7101. Here, a structure in which the housing 7101 is supported by a stand 7103 is illustrated.

The light-emitting device of one embodiment of the present invention can be used for the display portion 7000.

Operation of the television device 7100 illustrated in FIG. 23A can be performed with an operation switch provided in the housing 7101 or a separate remote controller 7111. Alternatively, the display portion 7000 may include a touch sensor, and the television device 7100 can be operated by touching the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 23B:
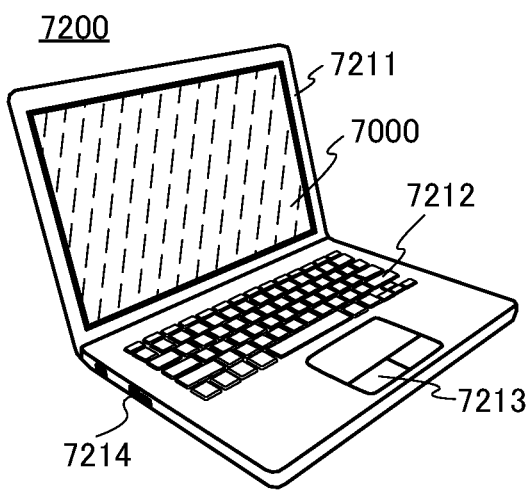

FIG. 23B shows an example of a laptop personal computer. A laptop personal computer 7200 includes a housing 7211, a keyboard 7212, a pointing device 7213, an external connection port 7214, and the like. In the housing 7211, the display portion 7000 is incorporated.

The light-emitting device of one embodiment of the present invention can be used for the display portion 7000.

Figure 23C:
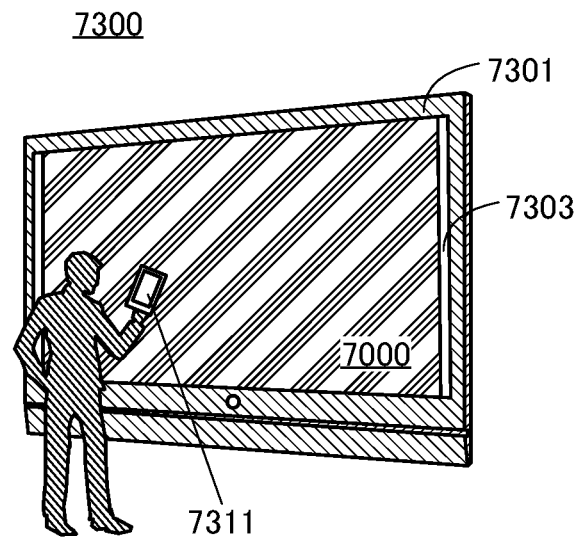
Figure 23D:
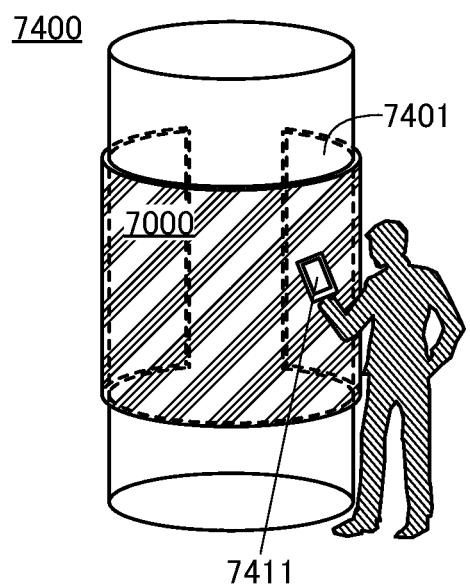

FIG. 23C and FIG. 23D show examples of digital signage.

Digital signage 7300 illustrated in FIG. 23C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 23D is digital signage 7400 attached to a cylindrical pillar 7401. The digital signage 7400 includes the display portion 7000 provided along a curved surface of the pillar 7401.

The light-emitting device of one embodiment of the present invention can be used for the display portion 7000 in FIG. 23C and FIG. 23D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

Furthermore, as illustrated in FIG. 23C and FIG. 23D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 24A to FIG. 24F show examples of a portable information terminal including a flexible display portion 7001.

The display portion 7001 is manufactured using the light-emitting device of one embodiment of the present invention. For example, a light-emitting device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

Figure 24A:
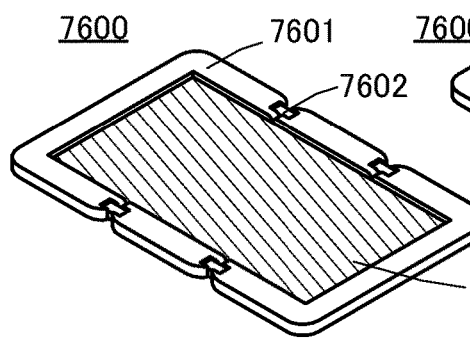
FIG. 24A to FIG. 24F are drawings showing examples of an electronic device.
Figure 24B:
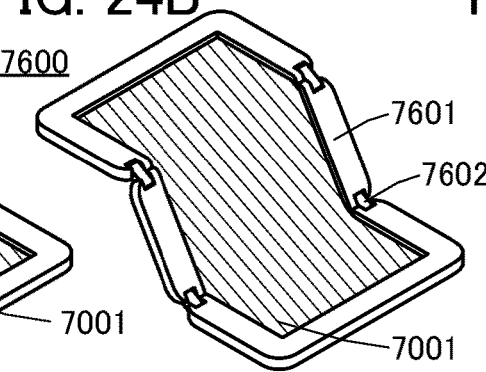
Figure 24C:
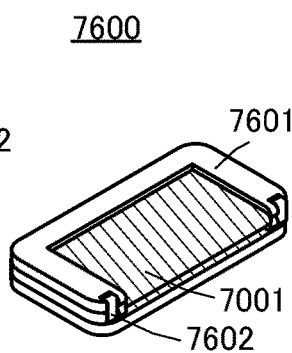

FIG. 24A to FIG. 24C illustrate an example of a foldable portable information terminal. FIG. 24A illustrates an opened state, FIG. 24B illustrates a state in the middle of change from one of an opened state and a folded state to the other, and FIG. 24C illustrates a folded state of the portable information terminal 7600. The portable information terminal 7600 is highly portable when folded, and is highly browsable when opened because of a seamless large display area.

The display portion 7001 is supported by three housings 7601 joined together by hinges 7602. By folding a space between two housings 7601 with the hinges 7602, the portable information terminal 7600 can be reversibly changed in shape from an opened state to a folded state.

Figure 24D:
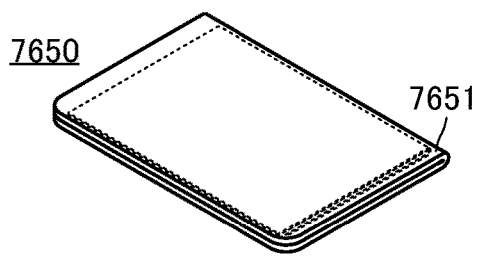
Figure 24E:
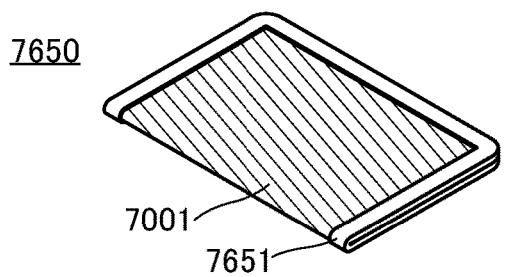

FIG. 24D and FIG. 24E illustrate an example of a foldable portable information terminal. FIG. 24D illustrates a portable information terminal 7650 that is folded so that the display portion 7001 is on the inside; FIG. 24E illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby contamination of or damage to the display portion 7001 can be suppressed.

Figure 24F:
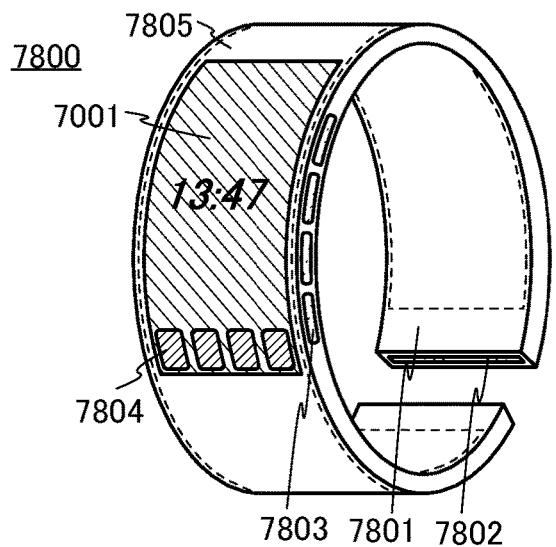

FIG. 24F shows an example of a wrist-watch-type portable information terminal. A portable information terminal 7800 includes a band 7801, the display portion 7001, an input-output terminal 7802, operation buttons 7803, and the like. The band 7801 has a function of a housing. A flexible battery 7805 can be mounted on the portable information terminal 7800. The battery 7805 may be placed to overlap with the display portion 7001 or the band 7801, for example.

The band 7801, the display portion 7001, and the battery 7805 have flexibility. Thus, the portable information terminal 7800 can be easily curved to have a desired shape.

The operation button 7803 can give a variety of functions such as time setting, on/off of the power, on/off of wireless communication, setting and cancellation of silent mode, and setting and cancellation of power saving mode. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can execute near field communication conformable to a communication standard. For example, mutual communication with a headset capable of wireless communication enables hands-free calling.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 25A:
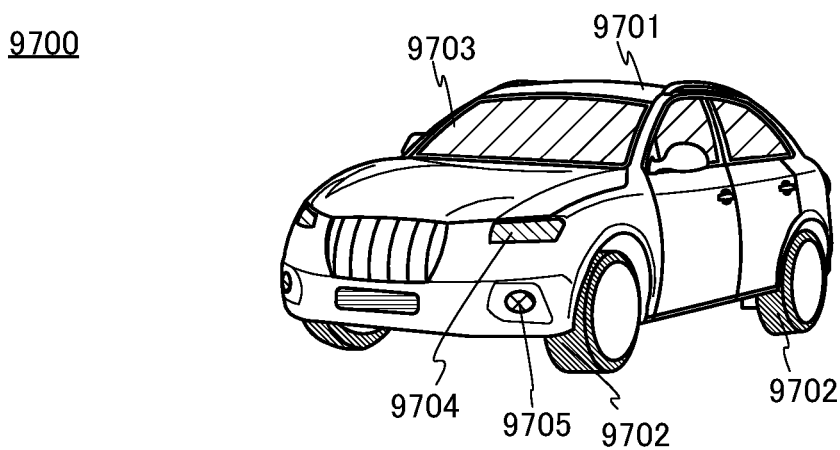
FIG. 25A to FIG. 25C are drawings showing examples of an electronic device.
Figure 25B:
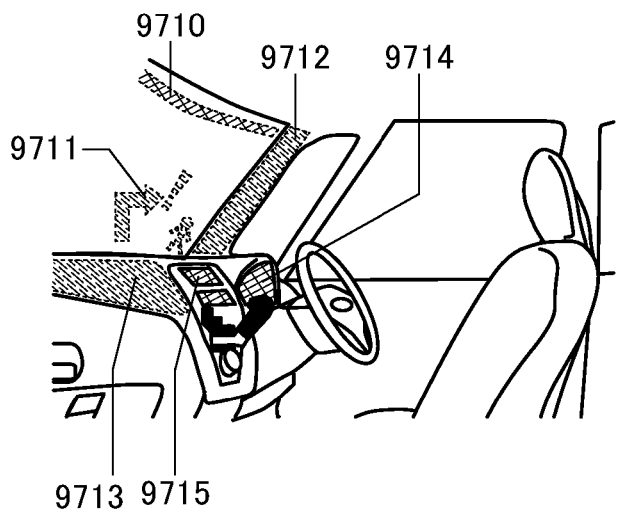

FIG. 25A is an external view of an automobile 9700. FIG. 25B illustrates a driver's seat of the automobile 9700. The automobile 9700 includes a car body 9701, wheels 9702, a windshield 9703, lights 9704, fog lamps 9705, and the like. The light-emitting device of one embodiment of the present invention can be used in a display portion of the automobile 9700, for example. For example, the light-emitting device of one embodiment of the present invention can be provided for a display portion 9710 to a display portion 9715 illustrated in FIG. 25B. Alternatively, the light-emitting device of one embodiment of the present invention may be used in the lights 9704 or the fog lamps 9705.

The display portion 9710 and the display portion 9711 are display devices provided in an automobile windshield. The light-emitting device of one embodiment of the present invention can be a see-through device, through which the opposite side can be seen, by using a light-transmitting conductive material for forming its electrodes and wirings. Such a display portion 9710 or 9711 in a see-through state does not hinder driver's vision during driving of the automobile 9700. Therefore, the light-emitting device of one embodiment of the present invention can be provided in the windshield of the automobile 9700. In the case where a transistor for driving the light-emitting device is provided, a transistor having a light-transmitting property, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar by displaying an image taken by an imaging means provided on the car body. The display portion 9713 is a display device provided on a dashboard. For example, the display portion 9713 can compensate for the view hindered by the dashboard by displaying an image taken by an imaging means provided on the car body. That is, by displaying an image taken by an imaging means provided on the outside of the automobile, blind areas can be eliminated and safety can be increased. In addition, displaying an image for compensating for the area that cannot be seen makes it possible to confirm the safety more naturally and comfortably.

Figure 25C:
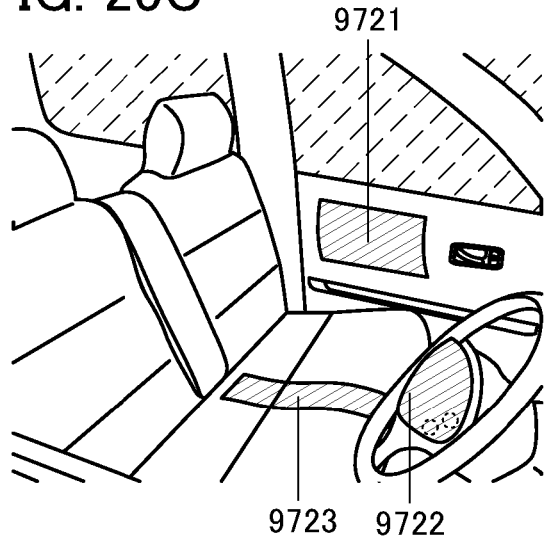

FIG. 25C illustrates the inside of a car in which a bench seat is used as a driver seat and a front passenger seat. A display portion 9721 is a display device provided in a door portion. For example, the display portion 9721 can compensate for the view hindered by the door by displaying an image taken by an imaging means provided in the car body. A display portion 9722 is a display device provided in a steering wheel. A display portion 9723 is a display device provided in the middle of a seating face of the bench seat. Provided on the seating surface, backrest, or the like, the display device can be used as a seat heater with heat generation of the display device as a heat source.

The display portion 9714, the display portion 9715, and the display portion 9722 can display a variety of kinds of information such as navigation information, a speedometer, a tachometer, a mileage, a fuel meter, a gearshift indicator, and air-condition setting. The content, layout, or the like of the display on the display portions can be changed freely by a user as appropriate. The above information can also be displayed on the display portion 9710 to the display portion 9713, the display portion 9721, and the display portion 9723. The display portion 9710 to the display portion 9715 and the display portion 9721 to the display portion 9723 can also be used as lighting devices. The display portion 9710 to the display portion 9715 and the display portion 9721 to the display portion 9723 can also be used as heating devices.

This embodiment can be combined with the other embodiments as appropriate.

REFERENCE NUMERALS

EP: light-emitting device, EP1: light-emitting device, EP2: light-emitting device, EP3: light-emitting device, EP4: light-emitting device, 10A: light-emitting device, 10B: light-emitting device, 11: support substrate, 12: metal oxide layer, 13: resin layer, 14: metal layer, 15: oxide insulating layer, 16: metal layer, 20: light emission, 21: substrate, 22: adhesive layer, 23: substrate, 24: adhesive layer, 31: inorganic insulating layer, 32: insulating layer, 33: inorganic insulating layer, 34: insulating layer, 35: organic insulating layer, 36: inorganic insulating layer, 37: partition wall, 39: organic insulating layer, 40: transistor, 50: region, 50a: region, 50A: region, 50b: region, 50B: region, 50c: region, 50d: region, 51: region, 52: region, 52A: region, 52B: region, 55: large-sized panel, 57a: laser light, 57b: laser light, 60: light-emitting element, 61: electrode, 62: EL layer, 63: electrode, 64: inorganic insulating layer, 65: instrument, 66: dividing line, 69: protective layer, 69a: inorganic insulating layer, 69b: organic insulating layer, 69c: inorganic insulating layer, 70: transistor, 71: conductive layer, 73: metal oxide layer, 75: conductive layer, 77a: conductive layer, 77b: conductive layer, 80: transistor, 81: conductive layer, 83: metal oxide layer, 83i: channel formation region, 83n: low-resistance region, 85: conductive layer, 87a: conductive layer, 87b: conductive layer, 91: support substrate, 92: metal oxide layer, 93: resin layer, 94: metal layer, 95: oxide insulating layer, 97: inorganic insulating layer, 98: adhesive layer, 99: organic insulating layer, 100A: light-emitting device, 100B: light-emitting device, 100C: light-emitting device, 100D: light-emitting device, 381: light-emitting portion, 382: circuit, 383: external connection terminal, 384: wiring portion, 385: conductive layer, 386: connector, 387: conductive layer, 7000: display portion, 7001: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 7600: portable information terminal, 7601: housing, 7602: hinge, 7650: portable information terminal, 7651: non-display portion, 7800: portable information terminal, 7801: band, 7802: input-output terminal, 7803: operation button, 7804: icon, 7805: battery, 9700: automobile, 9701: car body, 9702: wheel, 9703: windshield, 9704: light, 9705: fog lamp, 9710: display portion, 9711: display portion, 9712: display portion, 9713: display portion, 9714: display portion, 9715: display portion, 9721: display portion, 9722: display portion, 9723: display portion

The invention claimed is:

1. A flexible light-emitting device comprising a first substrate, a light-emitting element, a first inorganic insulating layer, a second inorganic insulating layer, a first organic insulating layer, a second organic insulating layer, and a second substrate,
   wherein the first inorganic insulating layer is over the first substrate,
   wherein the first organic insulating layer is over the first inorganic insulating layer,
   wherein the light-emitting element comprises a first electrode over the first organic insulating layer, a light-emitting layer over the first electrode, and a second electrode over the light-emitting layer,
   wherein the second inorganic insulating layer is over the second electrode,
   wherein the second organic insulating layer is over the second inorganic insulating layer,
   wherein the second substrate is over the second organic insulating layer,
   wherein an end portion of the first inorganic insulating layer and an end portion of the second inorganic insulating layer are each inward from an end portion of the first organic insulating layer,
   wherein the end portion of the first organic insulating layer and an end portion of the second organic insulating layer are in contact with each other and exposed on a side surface of the flexible light-emitting device, and
   wherein the side surface of the flexible light-emitting device includes an end portion of the first substrate and an end portion of the second substrate.

2. The flexible light-emitting device according to claim 1, wherein the first inorganic insulating layer and the second inorganic insulating layer are in contact with each other outside an end portion of the light-emitting element.

3. The flexible light-emitting device according to claim 1, wherein the first organic insulating layer comprises an opening outside an end portion of the light-emitting element, and
   wherein the first inorganic insulating layer and the second inorganic insulating layer are in contact with each other in the opening.

4. The flexible light-emitting device according to claim 1, further comprising a third organic insulating layer,
   wherein the first organic insulating layer comprises a material different from a material of the third organic insulating layer,
   wherein the first organic insulating layer is over the third organic insulating layer, and wherein an end portion of the third organic insulating layer is exposed on the side surface of the flexible light-emitting device.

5. A method for manufacturing a light-emitting device by manufacturing a plurality of light-emitting devices and dividing the plurality of light-emitting devices into individual light-emitting devices, comprising:
   forming a separation layer over a first substrate;
   forming a first inorganic insulating layer over the separation layer;
   forming a first opening in the first inorganic insulating layer;
   forming a first organic insulating layer over the first inorganic insulating layer;
   forming a light-emitting element over the first organic insulating layer;
   forming a second inorganic insulating layer over the light-emitting element;
   bonding a second substrate onto the second inorganic insulating layer;
   separating the first substrate and the first inorganic insulating layer from each other;
   bonding a third substrate so that the third substrate overlaps with the second substrate with the first inorganic insulating layer therebetween; and
   dividing the plurality of light-emitting devices into the individual light-emitting devices so that a dividing portion comprises the first opening, and
   wherein an end portion of the first organic insulating layer is exposed on a side surface of the individual light-emitting devices.

6. The method for manufacturing a light-emitting device, according to claim 5,
   wherein in the first organic insulating layer, a second opening is formed inward from the first opening, and
   wherein the second inorganic insulating layer is inside the second opening.

7. The method for manufacturing a light-emitting device, according to claim 5,
   wherein the separation layer comprises a metal oxide layer and a resin layer over the metal oxide layer.

8. The method for manufacturing a light-emitting device, according to claim 5,
   wherein the separation layer comprises a resin layer.

9. The method for manufacturing a light-emitting device, according to claim 6,
   wherein the separation layer comprises a metal layer and an oxide insulating layer over the metal layer,
   wherein the metal layer comprises a third opening overlapping with the first opening,
   wherein the oxide insulating layer comprises a fourth opening overlapping with both the first opening and the third opening, and
   wherein the first substrate and the first organic insulating layer are in contact with each other in a portion where the first opening, the third opening, and the fourth opening overlap with each other.

10. The method for manufacturing a light-emitting device, according to claim 6,
    wherein before the first organic insulating layer is formed, a second organic insulating layer is formed using a material different from a material of the first organic insulating layer,
    wherein the separation layer comprises a metal layer and an oxide insulating layer over the metal layer,
    wherein the metal layer comprises a third opening overlapping with the first opening,
    wherein the oxide insulating layer comprises a fourth opening overlapping with both the first opening and the third opening, and
    wherein the second organic insulating layer is in contact with the first substrate through the first opening, the third opening, and the fourth opening.

11. The method for manufacturing a light-emitting device, according to claim 5,
    wherein the separation layer comprises a first metal layer, an oxide insulating layer over the first metal layer, and a second metal layer over the oxide insulating layer, and
    wherein the first opening overlaps with the second metal layer.

12. The flexible light-emitting device according to claim 1, further comprising a transistor and a third inorganic insulating layer,
    wherein the transistor is over the third inorganic insulating layer,
    wherein the first inorganic insulating layer is between the transistor and the first organic insulating layer, and
    wherein an end portion of the third inorganic insulating layer is inward from the end portion of the first organic insulating layer.

13. The flexible light-emitting device according to claim 1, wherein the second substrate includes a resin film.

14. The flexible light-emitting device according to claim 1, wherein the first substrate and the second substrate are bonded to each other with the second organic insulating layer.

* * * * *